(12) United States Patent
Yamazaki et al.

(10) Patent No.: US 10,096,721 B2
(45) Date of Patent: Oct. 9, 2018

(54) SEMICONDUCTOR DEVICE, MODULE, AND ELECTRONIC DEVICE

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Kenichi Okazaki, Tochigi (JP); Masataka Nakada, Tochigi (JP); Masahiro Katayama, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/609,405

(22) Filed: May 31, 2017

(65) Prior Publication Data

US 2017/0271520 A1 Sep. 21, 2017

Related U.S. Application Data

(63) Continuation of application No. 14/610,383, filed on Jan. 30, 2015, now Pat. No. 9,705,002.

(30) Foreign Application Priority Data

Feb. 5, 2014 (JP) .................................. 2014-020542
Mar. 13, 2014 (JP) .................................. 2014-050588

(51) Int. Cl.
*H01L 29/786* (2006.01)
*H01L 27/12* (2006.01)

(52) U.S. Cl.
CPC ...... *H01L 29/7869* (2013.01); *H01L 27/1225* (2013.01); *H01L 27/1255* (2013.01); *H01L 29/78648* (2013.01)

(58) Field of Classification Search
CPC ............. H01L 27/1225; H01L 27/3262; H01L 27/3265; H01L 29/78648
See application file for complete search history.

(56) References Cited

U.S. PATENT DOCUMENTS 5,528,032 A 6/1996 Uchiyama
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Michael Carter
(74) *Attorney, Agent, or Firm* — Nixon Peabody LLP; Jeffrey L. Costellia

(57) ABSTRACT

To provide a semiconductor device with small parasitic capacitance. Alternatively, to provide a semiconductor device with low power consumption. The semiconductor device includes a transistor and a capacitor. The transistor includes a first conductor, a first insulator over the first conductor, a semiconductor including a region overlapping with the first conductor with the first insulator interposed therebetween, a second insulator over the semiconductor, a second conductor including a region overlapping with the semiconductor with the second insulator interposed therebetween, and a third conductor and a fourth conductor including a region in contact with a top surface of the semiconductor. The capacitor includes a layer formed from the same
(Continued)

layer as the first conductor and a layer formed from the same layer as the third conductor and the fourth conductor.

24 Claims, 50 Drawing Sheets

(56) References Cited

U.S. PATENT DOCUMENTS

| | | | |
|---|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,994,500 B2 * | 8/2011 | Kim .................. H01L 29/7869 257/258 |
| 8,384,076 B2 | 2/2013 | Park et al. |
| 8,547,771 B2 | 10/2013 | Koyama |
| 8,563,976 B2 | 10/2013 | Yamazaki et al. |
| 8,796,681 B2 | 8/2014 | Yamade et al. |
| 8,835,918 B2 | 9/2014 | Yamazaki et al. |
| 8,889,499 B2 | 11/2014 | Yamazaki et al. |
| 9,142,683 B2 | 9/2015 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0149057 A1 * | 10/2002 | Kawasaki .......... G02F 1/133345 257/350 |
| 2003/0116768 A1 * | 6/2003 | Ishikawa ........... H01L 29/78633 257/79 |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0075094 A1 * | 4/2004 | Yamazaki ............ H01L 27/1244 257/72 |
| 2004/0127038 A1 | 7/2004 | Carcia et al. |
| 2005/0017302 A1 | 1/2005 | Hoffman |
| 2005/0023530 A1 | 2/2005 | Koyama |
| 2005/0199959 A1 | 9/2005 | Chiang et al. |
| 2005/0250308 A1 * | 11/2005 | Yamaguchi ......... H01L 27/1214 438/618 |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0007084 A1 * | 1/2012 | Park .................... H01L 27/1225 257/59 |
| 2013/0193433 A1 | 8/2013 | Yamazaki |
| 2014/0097867 A1 | 4/2014 | Koyama |
| 2014/0299876 A1 | 10/2014 | Yamade et al. |
| 2015/0221678 A1 | 8/2015 | Yamazaki et al. |
| 2015/0221679 A1 | 8/2015 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2009-278115 A | 11/2009 |
| JP | 2011-022507 A | 2/2011 |

(56) References Cited

FOREIGN PATENT DOCUMENTS

| JP | 2012-059860 A | 3/2012 |
|---|---|---|
| JP | 2012-257187 A | 12/2012 |
| TW | 201138110 | 11/2011 |
| WO | WO-2004/114391 | 12/2004 |
| WO | WO-2011/070901 | 6/2011 |
| WO | WO-2012/017843 | 2/2012 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1. 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007. vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009. pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

(56) References Cited

OTHER PUBLICATIONS

Miyasaka.M, "Suftla Flexible Microelectronics on Their Way to Business". SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) . Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Taiwanese Office Action (Application No. 104102694) dated Aug. 8, 2018.

* cited by examiner

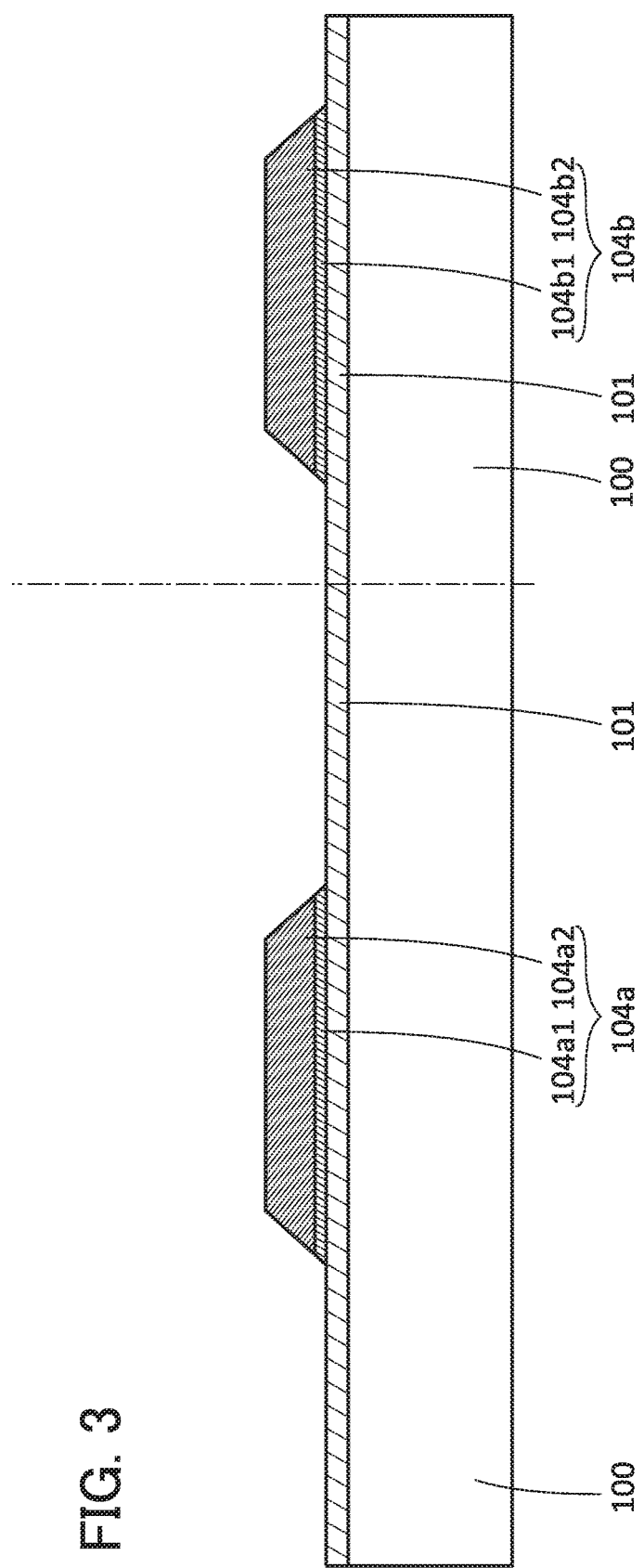

W →
TaN →
SiON →
OS →

W →
TaN →
SiON →
OS →

W →
TaN →
SiON →
OS →

SiON →
SiN →
W →
TaN →
SiON →
OS → start

S101
forming resist mask over OS\SiON\TaN\W

S102
partly etching W and TaN with use of resist mask

S103
forming taper angle at W and TaN by etching W and TaN

S104
forming SiON having circular arc shape at end portion and TaN having projection with use of further etching finish InGaZnO₄

100 psec passed after entry of argon 100 psec passed after entry of oxygen

In : ○   Ga : ○   Zn : ●   O : ●

Zn in third layer (Zn-O layer) reaching
vicinity of sixth layer (Zn-O layer)

Zn in third layer (Zn-O layer)
not reaching fifth layer (In-O layer)

CAAC-OS film    1 nm target    1 nm

FIG. 49A
FIG. 49B
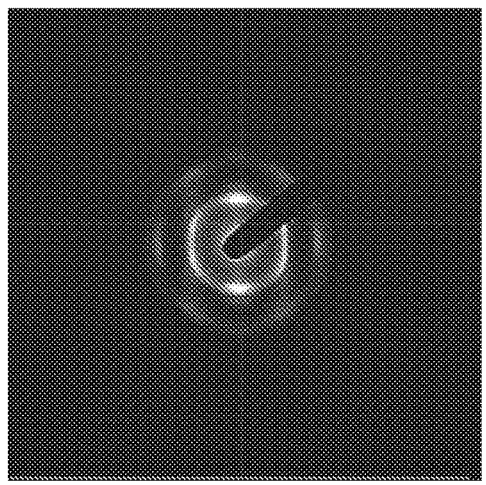
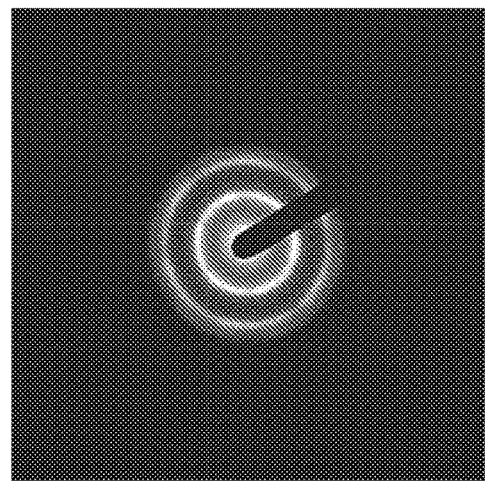

SEMICONDUCTOR DEVICE, MODULE, AND ELECTRONIC DEVICE

BACKGROUND OF THE INVENTION

1. Field of the Invention

The present invention relates to an object, a method, or a manufacturing method. Further, the present invention relates to a process, a machine, manufacture, or a composition of matter. In particular, the present invention relates to, for example, a semiconductor, a semiconductor device, a display device, a light-emitting device, a lighting device, a power storage device, a memory device, or a processor. The present invention relates to a method for manufacturing a semiconductor, a semiconductor device, a display device, a light-emitting device, a lighting device, a power storage device, a memory device, or a processor. The present invention relates to a method for driving a semiconductor device, a display device, a light-emitting device, a lighting device, a power storage device, a memory device, or a processor.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

A technique for forming a transistor by using a semiconductor over a substrate having an insulating surface has attracted attention. The transistor is applied to a wide range of semiconductor devices such as an integrated circuit and a display device. Silicon is known as a semiconductor applicable to a transistor.

As silicon which is used as a semiconductor of a transistor, either amorphous silicon, polycrystalline silicon, or single crystal silicon is used depending on the purpose. For example, in the case of a transistor included in a large-sized display device, it is preferred to use an amorphous silicon film, which can be formed using the established technique for forming a film on a large-sized substrate. On the other hand, in the case of a transistor included in a high-performance display device where driver circuits and a pixel circuit are formed over one substrate, it is preferred to use polycrystalline silicon, which can be used for forming a transistor having high field-effect mobility. In the case of a transistor included in an integrated circuit and the like, it is preferred to use single crystal silicon, which can be used for forming a transistor having further high field-effect mobility. As a method for forming polycrystalline silicon, high-temperature heat treatment or laser light treatment which is performed on amorphous silicon has been known.

In recent years, an oxide semiconductor has attracted attention. An oxide semiconductor can be formed by a sputtering method or the like, and thus can be used for a semiconductor of a transistor in a large display device. A transistor including an oxide semiconductor has high field-effect mobility; therefore, a high-performance display device where driver circuits and a pixel circuit are formed over the same substrate can be obtained. In addition, there is an advantage that capital investment can be reduced because part of production equipment for a transistor including amorphous silicon can be retrofitted and utilized.

A transistor including an oxide semiconductor is known to have extremely low leakage current in an off state. For example, a CPU or the like with low-power consumption utilizing the low leakage current of the transistor including an oxide semiconductor is disclosed (see Patent Document 1). In the case where a transistor including an oxide semiconductor is used for an integrated circuit such as a CPU, it is preferable to downsize transistors to be integrated.

In a highly integrated semiconductor device, influence of parasitic capacitance generated owing to overlap of a wiring and an electrode cannot be ignored in some cases. A self-aligned top-gate structure transistor using an oxide semiconductor is described (see Patent Document 2). Patent Document 3 discloses that even when an offset region is provided in a transistor, the transistor can have excellent electric characteristics by making electrons enter a semiconductor from a conductor electrode. With use of a technique disclosed in Patent Document 2 or 3, parasitic capacitance generated due to overlap of a wiring and an electrode can be reduced.

It is also disclosed that a transistor having a high field-effect mobility can be obtained by a well potential formed using an active layer including a semiconductor (see Patent Document 4).

REFERENCE

Patent Document

[Patent Document 1] Japanese Published Patent Application. No. 2012-257187
[Patent Document 2] Japanese Published Patent Application No. 2009-278115
[Patent Document 3] Japanese Published Patent Application No. 2011-022507
[Patent Document 4] Japanese Published Patent Application No. 2012-059860

SUMMARY OF THE INVENTION

An object is to provide a semiconductor device with small parasitic capacitance. Another object is to provide a semiconductor device with low power consumption. Another object is to provide a semiconductor device having excellent frequency characteristics. Another object is to provide a highly integrated semiconductor device. Another object is to provide a durable semiconductor device. Another object is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

(1)

One embodiment of the present invention is a semiconductor device includes a first conductor, a second conductor, a third conductor, a fourth conductor, a fifth conductor, a sixth conductor, a first insulator, a second insulator, a third insulator, a fourth insulator, a fifth insulator, and an oxide semiconductor. The first insulator includes a region in contact with a top surface of the first conductor and a region in contact with a top surface of the second conductor. The second insulator includes a region in contact with a top surface of the first insulator. The oxide semiconductor includes a region in contact with a top surface of the second insulator. The third insulator includes a region in contact with a top surface of the oxide semiconductor. The third conductor includes a region in contact with a top surface of the third insulator. The fourth insulator includes a region in contact with a top surface of the third conductor, a region in contact with a side surface of the third insulator, a region in contact with the top surface of the oxide semiconductor, and a region in contact with the top surface of the second insulator. The fifth insulator includes a region in contact with a top surface of the fourth insulator. The fourth conductor includes a region in contact with the top surface of the oxide semiconductor. The fifth conductor includes a region in contact with the top surface of the oxide semiconductor. The sixth conductor includes a region in contact with the top surface of the fourth insulator. The first conductor includes a region overlapping with the oxide semiconductor with the first insulator and the second insulator interposed therebetween. The third conductor includes a region overlapping with the oxide semiconductor with the third insulator interposed therebetween. The second conductor includes a region overlapping with the sixth conductor with the first insulator and the fourth insulator interposed therebetween.

(2)

Another embodiment of the present invention includes the semiconductor device according to (1). The oxide semiconductor includes a first region in contact with the third insulator and a second region and a third region that are in contact with the fourth insulator. Each of the second region and the third region includes a region with lower resistance than the first region. The fourth conductor includes a region in contact with the second region. The fifth conductor includes a region in contact with the third region.

(3)

Another embodiment of the present invention includes the semiconductor device according to (1) or (2). In the semiconductor device, the oxide semiconductor includes a first oxide semiconductor and a second oxide semiconductor. The second oxide semiconductor includes a region in contact with a top surface of the first oxide semiconductor. In a region where the fourth conductor and the oxide semiconductor overlap with each other, the first oxide semiconductor has higher conductivity than the second oxide semiconductor.

(4)

Another embodiment of the present invention includes the semiconductor device according to (1) or (2). In the semiconductor device, the oxide semiconductor includes a first oxide semiconductor and a second oxide semiconductor. The second oxide semiconductor includes a region in contact with a top surface of the first oxide semiconductor. In a region where the fourth conductor and the oxide semiconductor overlap with each other, the second oxide semiconductor has higher conductivity than the first oxide semiconductor.

(5)

Another embodiment of the present invention includes the semiconductor device according to (1) or (2). In the semiconductor device, the oxide semiconductor includes a first oxide semiconductor, a second oxide semiconductor, and a third oxide semiconductor. The second oxide semiconductor includes a region in contact with a top surface of the first oxide semiconductor. The third oxide semiconductor includes a region in contact with a top surface of the second oxide semiconductor. In a region where the fourth conductor and the oxide semiconductor overlap with each other, the second oxide semiconductor has higher conductivity than the first oxide semiconductor and the third oxide semiconductor.

(6)

Another embodiment of the present invention includes the semiconductor device according to any one of (1) to (5), where the third insulator has a shape such that an end portion of the third insulator extends beyond an end portion of the third conductor.

(7)

Another embodiment of the present invention includes the semiconductor device according to (6), where the third insulator has a region whose cross-sectional shape at the end portion is a circular arc.

(8)

Another embodiment of the present invention includes the semiconductor device according to any one of (1) to (7). The third conductor includes a first conductive layer and a second conductive layer. The second conductive layer includes a region in contact with a top surface of the first conductive layer. The first conductive layer has a shape such that an end portion extends beyond an end portion of the second conductive layer.

(9)

Another embodiment of the present invention includes the semiconductor device according to any one of (1) to (8), where the oxide semiconductor includes indium and zinc.

(10)

Another embodiment of the present invention is a module including the semiconductor device according to any one of (1) to (9), and a printed board.

(11)

Another embodiment of the present invention is an electronic device including either the semiconductor device according to any one of (1) to (9) or the module according to (10), and at least one of a speaker, an operation key, and a battery.

Note that in the semiconductor device of one embodiment of the present invention, the oxide semiconductor may be replaced with another semiconductor.

A transistor with small parasitic capacitance can be provided. A transistor which possesses excellent switching characteristics can be provided. A transistor with low off-state current in an off state can be provided. A transistor having a high current in an on state can be provided. A semiconductor device including the transistor can be provided. A semiconductor device with small parasitic capacitance can be provided. A semiconductor device with low power consumption can be provided. A semiconductor device with excellent frequency characteristics can be provided. A highly integrated semiconductor device can be provided. A durable semiconductor device can be provided. A novel semiconductor device can be provided.

Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF THE DRAWINGS

FIG. 3 is a cross-sectional view illustrating a method for manufacturing a semiconductor device according to one embodiment of the present invention.

FIGS. 33A-1, 33A-2, 33A-3, 33B-1, 33B-2, 33C-1, and 33C-2 are views illustrating an electronic device according to an embodiment of the present invention.

FIGS. 49A and 49B show electron diffraction patterns of a CAAC-OS.

DETAILED DESCRIPTION OF THE INVENTION

Figure 1:
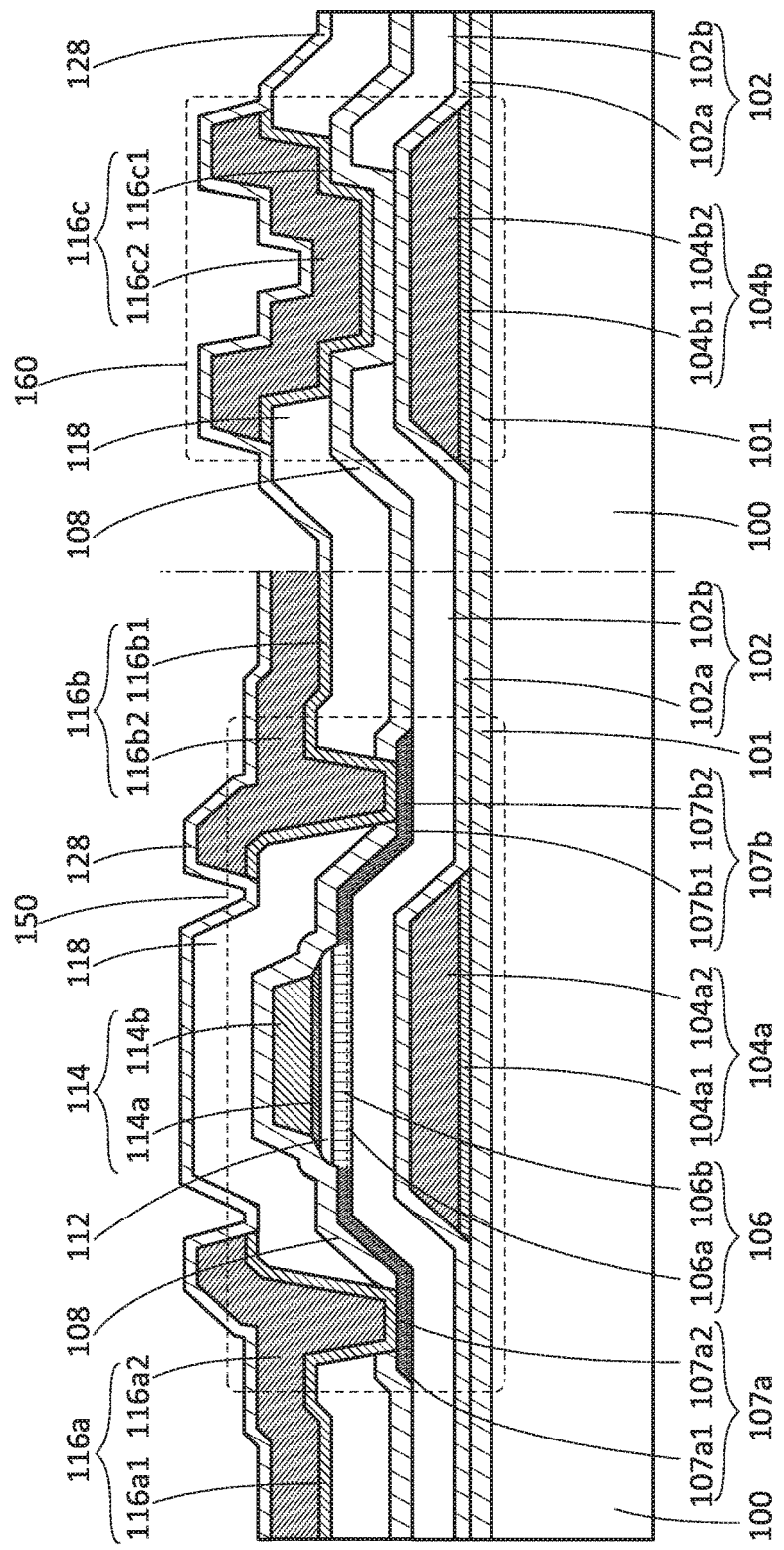
FIG. 1 is a cross-sectional view illustrating a semiconductor device according to one embodiment of the present invention.

Hereinafter, embodiments of the present invention will be described in detail with the reference to the drawings. However, the present invention is not limited to the description below, and it is easily understood by those skilled in the art that modes and details disclosed herein can be modified in various ways. Further, the present invention is not construed as being limited to description of the embodiments and the examples. Further, when the present invention is described with reference to the accompanying drawings, a reference number indicating the same object is commonly used among different drawings. Note that the same hatched pattern is applied to similar parts, and the similar parts are not especially denoted by reference numerals in some cases.

Note that the size, the thickness of films (layers), or regions in drawings is sometimes exaggerated for simplicity.

A voltage usually refers to a potential difference between a given potential and a reference potential (e.g., a source potential or a ground potential (GND)). A voltage can be referred to as a potential and vice versa.

Note that the ordinal numbers such as "first" and "second" in this specification are used for convenience and do not denote the order of steps or the stacking order of layers. Therefore, for example, the term "first" can be replaced with the term "second", "third", or the like as appropriate. In addition, the ordinal numbers in this specification and the like are not necessarily the same as those which specify one embodiment of the present invention.

Note that a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Further, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "insulator" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased, for example. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancy may be formed by entry of impurities such as hydrogen. Further, in the case where the semiconductor is silicon, examples of an impurity which changes characteristics of the semiconductor include oxygen, Group 1 elements except hydrogen, Group 2 elements, Group 13 elements, and Group 15 elements.

In embodiments described below, the case where the semiconductor is an oxide semiconductor is described; however, one embodiment of the present invention is not limited thereto. For example, as the semiconductor, silicon, germanium, or the like which has a polycrystalline structure, a single crystal structure, or the like may be used. Alternatively, a semiconductor having distortion such as distorted silicon may be used. Alternatively, as the semiconductor, gallium arsenide, aluminum gallium arsenide, indium gallium arsenide, gallium nitride, indium phosphide, silicon germanium, or the like which can be used for a high electron mobility transistor (HEMT) may be used. By using any of these semiconductors, a transistor capable of high speed operation can be obtained.

In this specification, the phrase "A has a region with a concentration B" includes, for example, "the concentration of the entire region of A in the depth direction is B", "the average concentration in a region of A in the depth direction is B", "the median value of a concentration in a region of A in the depth direction is B", "the maximum value of a concentration in a region of A in the depth direction is B", "the minimum value of a concentration in a region of A in the depth direction is B", "a convergence value of a concentration in a region of A in the depth direction is B", and "a concentration in a region in which a probable value is obtained in measurement is B".

In this specification, the phrase "A has a region with a size B, a length B, a thickness B, a width B, or a distance B" includes, for example, "the size, the length, the thickness, the width, or the distance of the entire region of A is B", "the average value of the size, the length, the thickness, the width, or the distance of a region of A is B", "the median value of the size, the length, the thickness, the width, or the distance of a region of A is B", "the maximum value of the size, the length, the thickness, the width, or the distance of a region of A is B", "the minimum value of the size, the length, the thickness, the width, or the distance of a region of A is B", "a convergence value of the size, the length, the thickness, the width, or the distance of a region of A is B", and "the size, the length, the thickness, the width, or the distance of a region in which a probable value is obtained in measurement is B".

In this specification, deposition of an insulator, a semiconductor, a conductor, and the like can be conducted with a sputtering method, a chemical vapor deposition (CVD) method, a molecular beam epitaxy (MBE) method, a pulsed laser deposition (PLD) method, an atomic layer deposition (ALD) method, or the like unless otherwise specified.

The CVD method can include a plasma enhanced CVD (PECVD) method using plasma, a thermal CVD (TCVD) method using heat, and the like. Moreover, the CVD method can include a metal CVD (MCVD) method and a metal organic CVD (MOCVD) method depending on a source gas.

By using the PECVD method, a high-quality film can be formed at a relatively low temperature. By using the TCVD method, in which plasma is not used, a film can be formed with few defects because damage caused by plasma does not occur.

When the CVD method is used, composition of a film to be formed can be controlled with a flow rate ratio of the source gases. For example, by an MCVD method or an MOCVD method, a film with a desired composition can be formed by adjusting the flow rate of a source gas. Furthermore, for example, by an MCVD method or an MOCVD method, a film whose composition is gradually changed can be formed by changing the flow rate of a source gas during deposition. In the case where a film is deposited while the flow rate of a source gas is changed, the time for film formation can be shorter than in the case where a film is deposited using a plurality of deposition chambers because time for transferring the substrate and time for adjusting the pressure are not needed. Thus, transistors can be manufactured with improved productivity.

Note that in this specification, the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

A channel width refers to, for example, the length of a portion where a source and a drain face each other in a region where a semiconductor (or a portion where a current flows in a semiconductor when a transistor is on) and a gate electrode overlap with each other, or a region where a channel is formed in a top view. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width, which is the length of a portion where a source and a drain face each other in a region where a semiconductor and a gate electrode overlap with each other, is referred to as a surrounded channel width (SCW) in some cases. Further, in this specification, in the case where the term "channel width" is simply used, it may denote a surrounded channel width and an apparent channel width. Alternatively, in this specification, in the case where the tem). "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where the electric field mobility, a current value per channel width, and the like of a transistor are obtained by calculation, a surrounded channel width may be used for the calculation. In that case, a value different from one in the case where an effective channel width is used for the calculation is obtained in some cases.

Note that in this specification, the description "A has a shape such that an end portion extends beyond an end portion of B" may indicate, for example, the case where at least one of end portions of A is positioned on an outer side than at least one of end portions of B in a top view or a cross-sectional view. Thus, the description "A has a shape such that an end portion extends beyond an end portion of B" can be alternately referred to as the description "one of end portions of A is positioned on an outer side than one of end portions of B".

<Semiconductor Device>

Hereinafter, a semiconductor device according to one embodiment of the present invention will be described with reference to drawings.

FIG. 1 is a cross-sectional view of a semiconductor device including a transistor 150 and a capacitor 160.

The semiconductor device illustrated in FIG. 1 includes the following components: an insulator 101 over a substrate 100; a conductor 104a1 over the insulator 101; a conductor 104a2 over the conductor 104a1; a conductor 104b1 over the insulator 101; a conductor 104b2 over the conductor 104b1; an insulator 102a over the insulator 101, the conductor 104a1, the conductor 104a2, the conductor 104b1, and the conductor 104b2; an insulator 102b over the insulator 102a; a semiconductor 106a over the insulator 102b; a semiconductor 106b over the semiconductor 106a; an insulator 112 over the semiconductor 106b; a conductor 114a over the insulator 112; a conductor 114b over the conductor 114a; an insulator 108 over the insulator 102a, the insulator 102b, the semiconductor 106a, the semiconductor 106b, the insulator 112, the conductor 114a, and the conductor 114b; an insulator 118 over the insulator 108; a conductor 116a1 over the semiconductor 106b, the insulator 108, and the insulator 118; a conductor 116b1 over the semiconductor 106b, the insulator 108, and the insulator 118; a conductor 116a2 over the conductor 116a1; a conductor 116b2 over the conductor 116b1; and an insulator 128 over the insulator 118, the conductor 116a1, the conductor 116a2, the conductor 116b1, and the conductor 116b2.

The insulator 101 has a function of suppressing entry of impurities to a channel formation region of the transistor 150 in some cases. For example, when the conductor 104a2 and the conductor 104b2 include copper or the like, which serves as an impurity of the semiconductor 106a or the semiconductor 106b, the insulator 101 has a function of blocking copper or the like in some cases.

A stack of the conductor 104a1 and the conductor 104a2 is called a conductor 104a. The conductor 104a may have a region functioning as a gate electrode of the transistor 150. Furthermore, the conductor 104a may have a function of blocking light incident on the channel formation region of the transistor 150.

A stack of the conductor 104b1 and the conductor 104b2 is called a conductor 104b. The conductor 104b may have a region functioning as one of electrodes of the capacitor 160. Furthermore, the conductor 104b may have a function of blocking light incident on the semiconductor device.

The conductor 104a1 and the conductor 104b1 may be formed from one layer. In that case, a process can be shortened as compared with the case where the conductor 104a1 and the conductor 104b1 are not formed from one layer. The conductor 104a2 and the conductor 104b2 may be formed from one layer. In that case, a process can be shortened as compared with the case where the conductor 104a2 and the conductor 104b2 are not formed from one layer.

The conductor 104a1 may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used. For the conductor 104a1, it is particularly preferable to use a conductor containing titanium.

The conductor 104b1 may be formed using any of material selected from the conductors that can be used for the conductor 104a1. For the conductor 104b1, it is particularly preferable to use a conductor that is the same kind as the conductor 104a1.

The conductor 104a2 may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used. For the conductor 104a2, it is particularly preferable to use a conductor containing copper.

The conductor 104b2 can be formed using any of material selected from the conductors that can be used for the conductor 104a2, for example. For the conductor 104b2, it is particularly preferable to use a conductor that is the same kind as the conductor 104a2.

The insulator 102a and the insulator 102b are collectively called an insulator 102. The insulator 102 may has a region functioning as a gate insulator of the transistor 150. In addition, the insulator 102a may have a function of suppressing entry of impurities into the channel formation region or the like of the transistor 150. For example, when the conductor 104a2 or the like contains copper or the like, which serves as an impurity of the semiconductor 106a or the semiconductor 106b, the insulator 102a may have a function of blocking copper or the like. Furthermore, the insulator 102a may have a region which functions as a dielectric of the capacitor 160.

The insulator 102b may have an opening in a region overlapping with the conductor 104b. When the insulator 102b has an opening, the capacitance of the capacitor 160 can be increased.

The insulator 102a may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For the insulator 102a, it is particularly preferable to use silicon nitride or silicon nitride oxide.

The insulator 102b may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For the insulator 102b, it is particularly preferable to use silicon oxide or silicon oxynitride.

The semiconductor 106a and the semiconductor 106b are collectively called a semiconductor 106. The semiconductor 106 may have a region which functions as a channel formation region of the transistor 150.

As the semiconductor 106a, silicon, germanium, or the like which has a polycrystalline structure, a single crystal structure, or the like may be used. Alternatively, a semiconductor having distortion such as distorted silicon may be used. Alternatively, gallium arsenide, aluminum gallium arsenide, indium gallium arsenide, gallium nitride, indium phosphide, silicon germanium, or the like which can be used for an HEMT may be used for the semiconductor 106a. In addition, an oxide semiconductor may be used for the semiconductor 106a. For the semiconductor 106a, it is preferable to use an oxide semiconductor.

As the semiconductor 106b, silicon, germanium, or the like which has a polycrystalline structure, a single crystal structure, or the like may be used. Alternatively, a semiconductor having distortion such as distorted silicon may be used. Alternatively, as the semiconductor 106b, gallium arsenide, aluminum gallium arsenide, indium gallium arsenide, gallium nitride, indium phosphide, silicon germanium, or the like which can be used for a HEMT may be used. In addition, an oxide semiconductor may be used as the semiconductor 106b. For the semiconductor 106b, it is particularly preferable to use an oxide semiconductor.

Note that an oxide semiconductor that can be used for the semiconductor 106a and the semiconductor 106b is described in detail below.

The semiconductor 106a includes a region 107a1 and a region 107b1 which do not overlap with the insulator 112, the conductor 114a, the conductor 114b, and the like. In addition, the semiconductor 106b includes a region 107a2 and a region 107b2 which do not overlap with the insulator 112, the conductor 114a, the conductor 114b, and the like. The region 107a1 and the region 107b1 have lower resistance than the region of the semiconductor 106a overlapping with the insulator 112, the conductor 114a, the conductor 114b, or the like. The region 107a2 and the region 107b2 have lower resistance than the region of the semiconductor 106b overlapping with the insulator 112, the conductor 114a, the conductor 114b, or the like. Note that a region with low resistance can be referred to as a high carrier density region.

In the case where the semiconductor 106a and the semiconductor 106b are each an oxide semiconductor, a carrier generation source may be caused by hydrogen and oxygen vacancy. The carrier generation source of the oxide semiconductor is described in detail below.

The region 107a1 and the region 107a2 are collectively called a region 107a. The region 107b1 and the region 107b2 are collectively called a region 107b. The region 107a and the region 107b may have regions which function as a source region and a drain region of the transistor 150.

The insulator 112 may have a region which functions as a gate insulator of the transistor 150. Note that the insulator 112 may have a shape such that the end portion extends beyond the end portion of the conductor 114a. The insulator 112 may have a region whose cross-sectional shape at the end portion is a circular arc. With use of the insulator 112 having the above shape, a shape defect of the insulator, a conductor, or the like provided over the insulator 112 is suppressed in some cases.

The insulator 112 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For the insulator 112, it is particularly preferable to use silicon oxide or silicon oxynitride.

When the semiconductor 106 is an oxide semiconductor, it is preferable for the insulator 102b and/or the insulator 112 having a region in contact with the semiconductor 106 to use an insulator having low density of states between the energy at the top of the valence band (Evos) and the energy at the bottom of the conduction band (Ecos) of the oxide semiconductor. For example, trapping an electron in the state leads to a shift of the threshold voltage of the transistor in the positive direction.

For example, nitrogen monoxide (NO) and nitrogen dioxide ($NO_2$) which are included in nitrogen oxide ($NO_x$) in silicon oxide generate states between Evos and Ecos in some cases. Thus, in order to form a transistor with stable electric characteristics, silicon oxide that includes less nitrogen oxide is preferably used for the insulator 102b and/or the insulator 112 in some cases. Note that although description below is about silicon oxide, the same is applied to silicon oxynitride. In the case of silicon oxide that includes less nitrogen oxide, the amount of released ammonia is larger than that of nitrogen oxide in thermal desorption spectroscopy (TDS). For example, there is a case where the amount of released ammonia is larger than or equal to $1 \times 10^{18}/cm^3$ and smaller than or equal to $5 \times 10^{19}/cm^3$. Note that the amount of released ammonia corresponds to the released amount caused by heat treatment at a film surface temperature higher than or equal to 50° C. and lower than or equal to 650° C. or higher than or equal to 50° C. and lower than or equal to 550° C.

For the insulator 102b and/or the insulator 112, it is preferable to use an insulator from which oxygen is released by heating.

Here, an insulator from which oxygen is released by heat treatment may release oxygen, the amount of which is higher than or equal to $1 \times 10^{18}$ atoms/$cm^3$, higher than or equal to $1 \times 10^{19}$ atoms/$cm^3$, or higher than or equal to $1 \times 10^{20}$ atoms/$cm^3$ in TDS analysis (converted into the amount of oxygen atoms) in the range of a surface temperature of 100° C. to 700° C. or 100° C. to 500° C.

Here, the method of measuring the amount of released oxygen using TDS analysis is described below.

The total amount of released gas from a measurement sample in TDS analysis is proportional to the integral value of the ion intensity of the released gas. Then, comparison with a reference sample is made, whereby the total amount of released gas can be calculated.

For example, the number of released oxygen molecules ($N_{O2}$) from a measurement sample can be calculated according to the following formula using the TDS results of a silicon substrate containing hydrogen at a predetermined density, which is a reference sample, and the TDS results of the measurement sample. Here, all gases having a mass-to-charge ratio of 32 which are obtained in the TDS analysis are assumed to originate from an oxygen molecule. Note that $CH_3OH$, which is a gas having the mass-to-charge ratio of 32, is not taken into consideration because it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2} = N_{H2}/S_{H2} \times S_{O2} \times \alpha$$

The value $N_{H2}$ is obtained by conversion of the amount of hydrogen molecules desorbed from the standard sample into densities. The value $S_{H2}$ is the integral value of ion intensity in the case where the standard sample is subjected to the TDS analysis. Here, the reference value of the standard sample is set to $N_{H2}/S_{H2}$. $S_{O2}$ is the integral value of ion intensity when the measurement sample is analyzed by TDS. The value α is a coefficient affecting the ion intensity in the TDS analysis. Refer to Japanese Published Patent Application No. H6-275697 for details of the above formula. The amount of released oxygen was measured with a thermal desorption spectroscopy apparatus produced by ESCO Ltd., EMD-WA1.000S/W using a silicon substrate containing hydrogen atoms at $1 \times 10^{16}$ atoms/$cm^2$, for example, as the reference sample.

Further, in the TDS analysis, oxygen is partly detected as an oxygen atom. The ratio between oxygen molecules and oxygen atoms can be calculated from the ionization rate of the oxygen molecules. Note that, since the above α includes the ionization rate of the oxygen molecules, the amount of the released oxygen atoms can also be estimated through the evaluation of the amount of the released oxygen molecules.

Note that $N_{O2}$ is the amount of the released oxygen molecules. The amount of released oxygen in the case of being converted into oxygen atoms is twice the amount of the released oxygen molecules.

Furthermore, the insulator from which oxygen is released by heat treatment may contain a peroxide radical. Specifically, the spin density attributed to the peroxide radical is greater than or equal to $5 \times 10^{17}$ spins/$cm^3$. Note that the insulator containing a peroxide radical may have an asymmetric signal with a g factor of approximately 2.01 in electron spin resonance (ESR).

The insulator containing excess oxygen may be formed using oxygen-excess silicon oxide ($SiO_X$ (X>2)). In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry (RBS).

When silicon oxide include $NO_2$, in an ESR spectrum at 100 K or lower, a first absorption line that appears at a g-factor of greater than or equal to 2.037 and less than or equal to 2.039, a second absorption line that appears at a g-factor of greater than or equal to 2.001 and less than or equal to 2.003, and a signal including a third absorption line that appears at a g-factor of greater than or equal to 1.964 and less than or equal to 1.966 are observed in some cases. The distance between the first and second absorption lines and the distance between the second and third absorption lines that are obtained by ESR measurement using an X-band are each approximately 5 mT. Thus, in the silicon oxide containing less nitrogen oxide, the spin density attributed to $NO_2$ is less than $1 \times 10^{18}$ spins/$cm^3$, or greater than or equal to $1 \times 10^{17}$ spins/$cm^3$ and less than or equal to $1 \times 10^{18}$ spins/$cm^3$.

In the silicon oxide containing less nitrogen oxide, the nitrogen concentration measured by secondary ion mass spectrometry (SIMS) is lower than or equal to $6 \times 10^{20}$ atoms/$cm^3$.

The conductor 114a and the conductor 114b are collectively called a conductor 114. The conductor 114 includes a region functioning as a gate electrode of the transistor 150 in some cases. Furthermore, the conductor 114 may have a function of blocking light incident on the channel formation region of the transistor 150.

The conductor 114a may have a shape such that the end portion extends beyond the end portion of the conductor 114b. Alternatively, the conductor 114b may have a shape such that the end portion is steeper than the end portion of the conductor 114a. The conductor 114b may have a region whose cross-sectional shape at the end portion is a circular arc. With use of the conductor 114a and the conductor 114b having the above shape, a shape defect of the insulator, the conductor, or the like provided over the conductor 114a and the conductor 114b can be suppressed in some cases.

The conductor 114a may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used. For the conductor 114a, it is particularly preferable to use a conductor containing tantalum nitride.

The conductor 114b may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used. For the conductor 114b, it is particularly preferable to use a conductor containing tungsten.

The insulator 108 may have a function of suppressing entry of impurities into the channel formation region of the transistor 150. For example, when the conductor 116a2 and the conductor 116b2, and the like contain copper or the like, which serves as an impurity of the semiconductor 106a or the semiconductor 106b, the insulator 108 may have a function of blocking copper or the like. The insulator 108 may have a region which functions as a dielectric of the capacitor 160.

The insulator 108 has an opening reaching the semiconductor 106. The opening is positioned to overlap with the region 107a in the semiconductor 106. Another opening that is different from the above may be positioned to overlap with the region 107b in the semiconductor 106.

The insulator 108 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For the insulator 108, it is particularly preferable to use silicon nitride or silicon nitride oxide.

As the insulator 108, an insulator having low density of states between Evos and Ecos may be used.

The insulator 118 may have a region that functions as an interlayer insulator of the transistor 150. For example, with the insulator 118, parasitic capacitance between wirings (conductors) of the transistor 150 can be reduced.

The insulator 118 has an opening in a portion overlapping with the opening of the insulator 108. The opening is positioned to overlap with the region 107a in the semiconductor 106. Another opening different from the above opening may be positioned to overlap with the region 107b in the semiconductor 106. Alternatively, the insulator 118 may have an opening in a region overlapping with the conductor 104b. When the insulator 118 has an opening in a region overlapping with the conductor 104b, the capacitance of the capacitor 160 can be increased.

The insulator 118 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For the insulator 118, it is particularly preferable to use silicon oxide or silicon oxynitride.

The conductor 116a1 and the conductor 116a2 are collectively called a conductor 116a. The conductor 116b1 and the conductor 116b2 are collectively called a conductor 116b. Furthermore, a conductor 116c1 and a conductor 116c2 are collectively called a conductor 116c. The conductor 116a and the conductor 116b have regions that function as a source electrode and a drain electrode of the transistor 150 in some cases. Furthermore, the conductor 116a and the conductor 116b may have a function of blocking light incident on the channel formation region or the like of the transistor 150. The conductor 116c may have a region that functions as the other electrode of the capacitor 160. Furthermore, the conductor 116c may have a function of blocking light on the semiconductor device.

Note that the conductor 116a1, the conductor 116b1, and the conductor 116c1 may be formed from one layer. In that case, a process can be shortened as compared with the case where the conductor 116a1, the conductor 116b1, and the conductor 116c1 are not formed from one layer. Furthermore, the conductor 116a2, the conductor 116b2, and the conductor 116c2 may be formed from one layer. In that case, a process can be shortened as compared with the case where the conductor 116a2, the conductor 116b2, and the conductor 116c2 are not formed from one layer.

The conductor 116a1 may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used. For the conductor 116a1, it is preferable to use a conductor containing titanium nitride, tantalum nitride, or tungsten.

The conductor 116b1 can be formed using any of material selected from the conductors that can be used for the conductor 116a1, for example. For the conductor 116b1, it is preferable to use a conductor that is the same kind as the conductor 116*a*1. The conductor 116*c*1 can be formed using any of material selected from the conductors that can be used for the conductor 116*a*1, for example. For the conductor 116*c*1, it is particularly preferable to use a conductor that is the same kind as the conductor 116*a*1 or the conductor 116*b*1.

The conductor 116*a*2 may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used. For the conductor 116*a*2, it is particularly preferable to use a conductor containing copper.

The conductor 116*b*2 can be formed using any of material selected from the conductors that can be used for the conductor 116*a*2. For the conductor 116*b*2, it is particularly preferable to use a conductor that is the same kind as the conductor 116*a*2. The conductor 116*c*2 can be formed using any of material selected from the conductors that can be used for the conductor 116*a*2. For the conductor 116*c*2, it is particularly preferable to use a conductor that is the same kind as the conductor 116*a*2 or the conductor 116*b*2. In the case where a conductor containing copper is used for the conductor 116*a*2, the conductor 116*b*2, and the conductor 116*c*2, it is not particularly necessary to provide the conductor 116*a*1, the conductor 116*b*1, and the conductor 116*c*1 in some cases. In that case, the semiconductor 106 may be in directly contact with the conductor 116*a*2 and the conductor 116*b*2 which are conductors containing copper.

The insulator 128 has a function of suppressing entry of impurities into the channel formation region of the transistor 150.

The insulator 128 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For the insulator 128, it is particularly referable to use silicon nitride or silicon nitride oxide.

As the substrate 100, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a semiconductor substrate of silicon, germanium, or the like or a compound semiconductor substrate of silicon carbide, silicon germanium, gallium arsenide, indium phosphide, zinc oxide, gallium oxide, or the like is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Still alternatively, a flexible substrate may be used as the substrate 100. As the substrate 100, a sheet, a film, or a foil containing a fiber may be used. The substrate 100 may have elasticity. The substrate 100 may have a property of returning to its original shape when bending or pulling is stopped. Alternatively, the substrate 100 may have a property of not returning to its original shape. The thickness of the substrate 100 is, for example, greater than or equal to 5 µm and less than or equal to 700 µm, preferably greater than or equal to 10 µm and less than or equal to 500 µm, further preferably greater than or equal to 15 µm and less than or equal to 300 µm. When the substrate 100 has a small thickness, the weight of the semiconductor device can be reduced. When the substrate 100 has a small thickness, even in the case of using glass or the like, the substrate 100 may have elasticity or a property of returning to its original shape when bending or pulling is stopped. Therefore, an impact applied to the semiconductor device over the substrate 100, which is caused by dropping or the like, can be reduced. That is, a durable semiconductor device can be provided.

For the substrate 100 which is a flexible substrate, metal, an alloy, resin, glass, or fiber thereof can be used, for example. The flexible substrate 100 preferably has a lower coefficient of linear expansion because deformation due to an environment is suppressed. The flexible substrate 100 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 100 because of its low coefficient of linear expansion.

Note that as a method for forming a transistor over a flexible substrate, there is also a method in which, after a transistor is formed over a non-flexible substrate, the transistor is separated from the non-flexible substrate and transferred to a flexible substrate. In that case, a separation layer is preferably provided over the substrate 100 which is a non-flexible substrate.

Figure 2C:
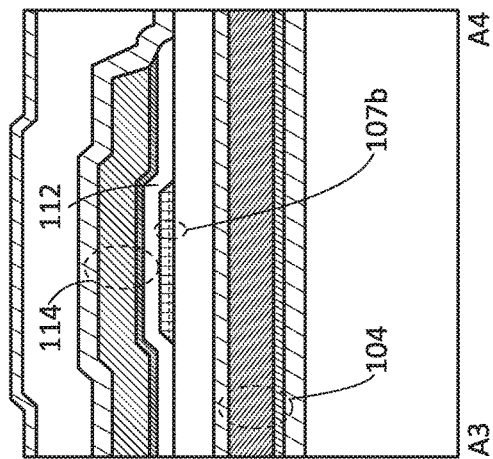
FIGS. 2A to 2C are a top view and cross-sectional views illustrating a semiconductor device according to one embodiment of the present invention.
Figure 2A:
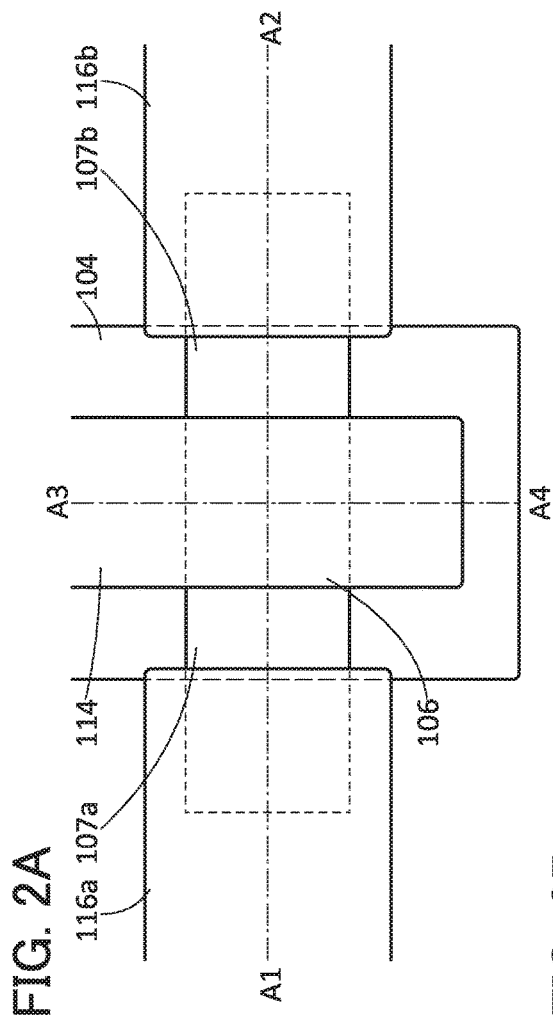
Figure 2B:
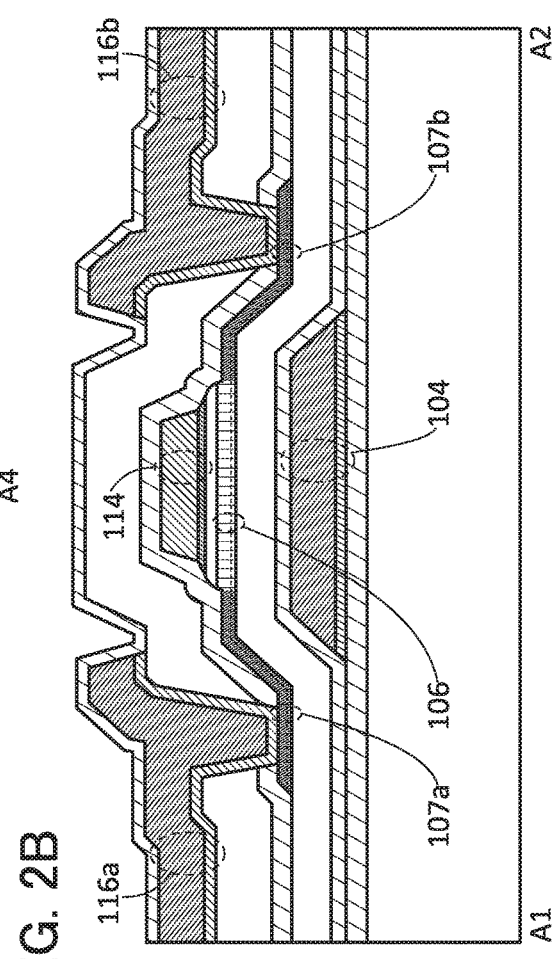

FIGS. 2A to 2C are a top view and cross-sectional views of the transistor 150. FIG. 2A is the top view of the transistor 150. FIG. 2B is a cross-sectional view of the transistor 150 along dashed-dotted line A1-A2 shown in FIG. 2A. FIG. 2C is a cross-sectional view of the transistor 150 along dashed-dotted line A3-A4 shown in FIG. 2A.

Note that the cross-sectional view in FIG. 1 or the like includes the cross section along A1-A2 (see FIG. 2B) corresponding to the cross-sectional view in the channel length direction of the transistor 150. Thus, for FIG. 2B, FIG. 1 is referred to.

As illustrated in a top view in FIG. 2A, the transistor 150 does not include a region where the conductors 116*a* and 116*b* overlap with the conductor 114, and accordingly the parasitic capacitance is small. However, it is possible to employ a structure where the transistor 150 has a region where the conductors 116*a* and 116*b* overlap with the conductor 114. In FIG. 2A, although the transistor 150 includes a region where the conductors 116*a* and 116*b* overlap with the conductor 104, the parasitic capacitance can be made small when a plurality of insulators and the like are provided therebetween. Note that the region where the conductors 116a and 116b overlap with the conductor 104 is not necessarily provided.

As illustrated in FIG. 2C corresponding to the cross-sectional view in the channel width direction, the conductor 114 including a region that functions as a gate electrode of the transistor 150 extends over the semiconductor 106 with the insulator 112 interposed therebetween. Thus, the electric field of the conductor 114 affects a top surface and a side surface of the semiconductor 106. In addition, the conductor 104 having a region that functions as a gate electrode of the transistor 150 has a shape facing to a bottom surface of the semiconductor 106 with the insulator 102 interposed therebetween. Thus, the electric field of the conductor 104 affects the bottom surface of the semiconductor 106.

As described above, the transistor 150 has a structure in which a top surface, a side surface, and a bottom surface of the semiconductor 106 are electrically surrounded by electric field attributed to the conductor 114 and the conductor 104 which function as gate electrodes. Such a structure is referred to as a surrounded channel (s-channel) structure in this specification.

In the transistor with an s-channel structure, a channel is formed in the whole (bulk) of a semiconductor in some cases. Thus, in the transistor with an s-channel structure, a large amount of current can flow between a source and a drain, so that a high on-state current value can be obtained. Furthermore, the transistor with an s-channel structure can be switched on and off quickly because the electric field of the gate electrode significantly influences the transistor. Thus, the subthreshold swing (S value) of the transistor with an s-channel structure can be made small. In addition, with a small S value, the amount of off-state current can be made small.

<Method for Manufacturing Semiconductor Device>

Next, a manufacturing method of the semiconductor device shown in FIG. 1 will be described.

First, the substrate 100 is prepared.

Next, the insulator 101 is formed.

Next, a conductor that is to be the conductor 104a1 and the conductor 104b1 is formed.

Next, a conductor that is to be the conductor 104a2 and the conductor 104b2 is formed.

Figures 1, 33A:
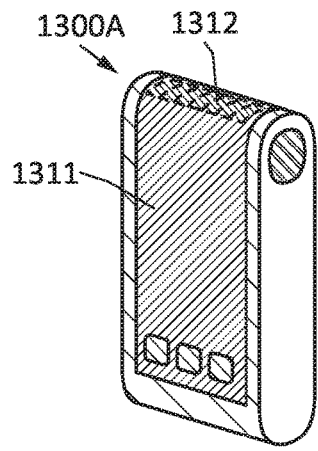
Figures 2, 33A:
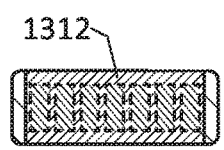
Figures 3, 33A:
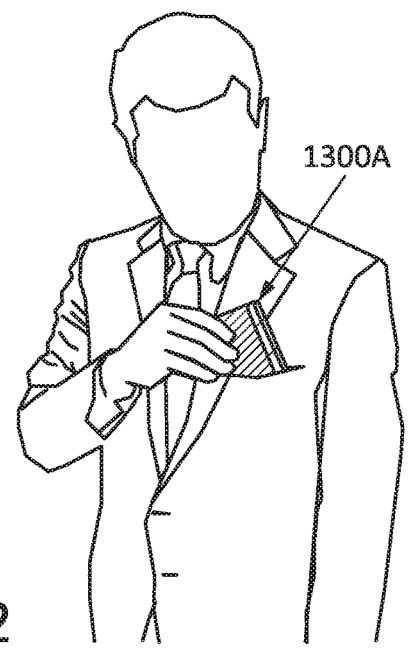

Next, a stack of the conductors is processed with a photolithography step, whereby the conductor 104a including the conductor 104a1 and the conductor 104a2 and the conductor 104b including the conductor 104b1 and the conductor 104b2 are formed (see FIG. 3). When the conductor 104a and the conductor 104b are formed in one step, a process can be shortened. Thus, semiconductor devices can be manufactured with high productivity.

Next, the insulator 102a is deposited.

Figure 4:
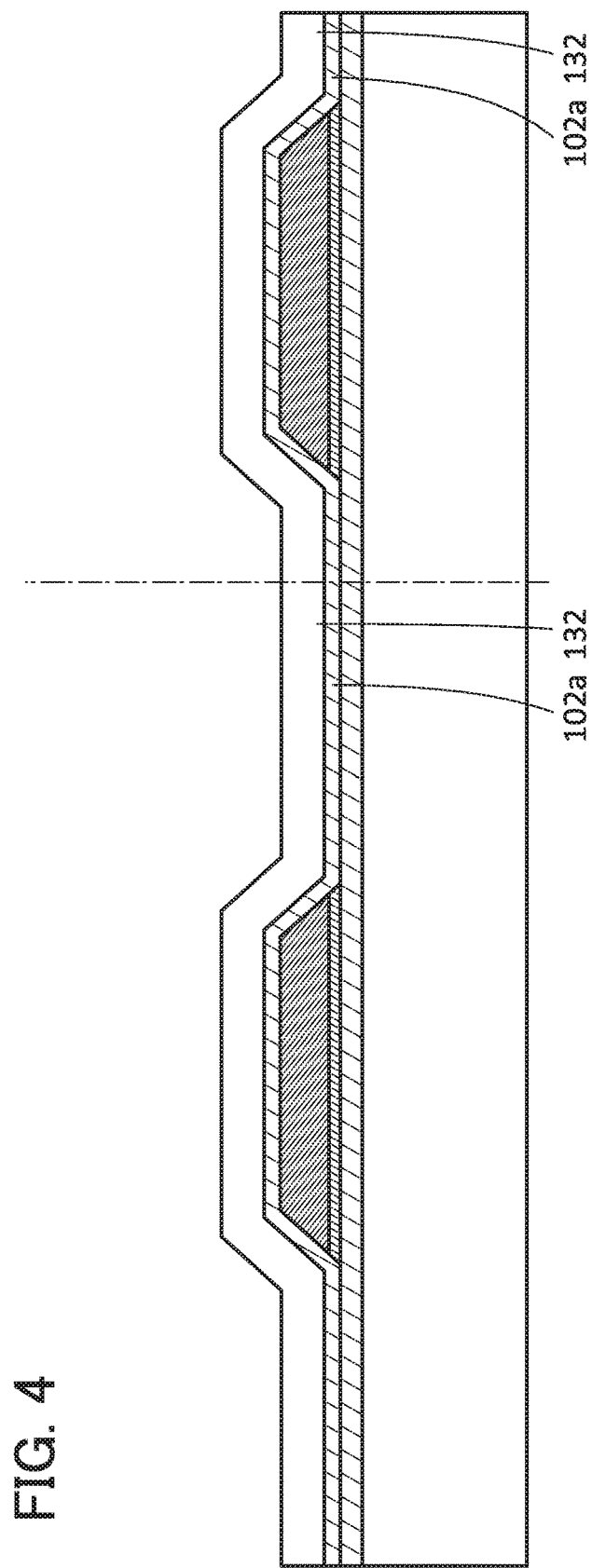
FIG. 4 is a cross-sectional view illustrating a method for manufacturing a semiconductor device according to one embodiment of the present invention.

Next, an insulator 132 is formed (see FIG. 4). The insulator 132 is to be the insulator 102b through a step performed later; thus, description of the insulator 102b is referred to.

Silicon oxide containing less nitrogen oxide can be deposited by, for example, a PECVD method using silane and dinitrogen monoxide as a source gas at a substrate temperature higher than or equal to 220° C., higher than or equal to 280° C., or higher than or equal to 350° C.

Next, a protective film 113 is formed. The protective film 113 can be formed using the above-described conductor, the above-described insulator, the above-described semiconductor, or the like, for example. For the protective film 113, a film through which oxygen is less transmitted is preferably used. For example, a film with less oxygen transmission properties than silicon oxide or silicon oxynitride is used for the protective film 113. It is preferable for the protective film 113 to use a film with less oxygen transmission properties than tungsten having a columnar crystal structure. It is particularly preferable to use tantalum nitride for the protective film 113.

Figure 5:
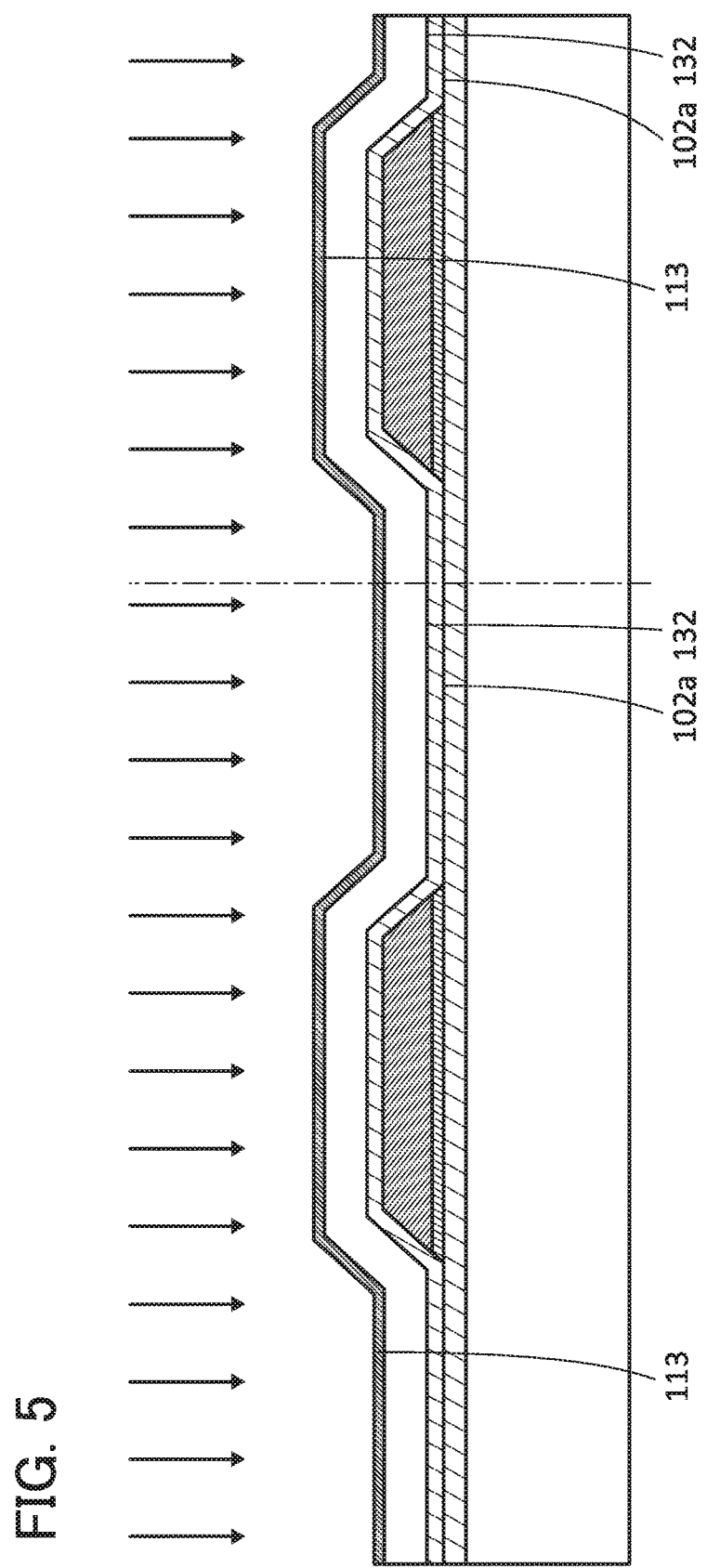
FIG. 5 is a cross-sectional view illustrating a method for manufacturing a semiconductor device according to one embodiment of the present invention.

Next, oxygen is added from an upper surface side of the protective film 113 (see FIG. 5). As a treatment for adding oxygen, a plasma treatment in an atmosphere containing an oxidizing gas can be given, for example. Examples of oxidizing gas include a gas containing an oxygen atom, specifically an oxygen gas, a nitrous oxide gas, and a carbon dioxide gas. Alternatively, an oxygen atom or molecular containing an oxygen atom may be ionized and then added (doping). There are a case where an ion subjected to mass separation is added and a case where an ion not subjected to mass separation is added, and either case can be employed.

When the protective film 113 has a function of blocking oxygen, a release of added oxygen can be suppressed and the oxygen can be added to the insulator 132 or/and the insulator 102a. Thus, by addition of oxygen in a state where the protective film 113 is provided, an amount of oxygen included in the insulator 132 and/or the insulator 102a can be larger than the case where oxygen is added in a state where the protective film 113 is not provided. Note that it is not problematic if the protective film 113 is oxidized by addition of oxygen.

Note that the protective film 113 preferably has such a thickness as to block oxygen and allow oxygen to reach a lower layer. For example, the thickness of the protective film may be greater than or equal to 1 nm and less than or equal to 150 nm, or greater than or equal to 5 nm and less than or equal to 100 nm.

Due to addition of oxygen, the insulator 132 and/or the insulator 102a becomes an insulator containing excess oxygen.

Next, the protective film 113 is removed. However, when the protective film 113 is an insulator or a semiconductor, the protective film 113 is not necessarily removed.

Figure 6:
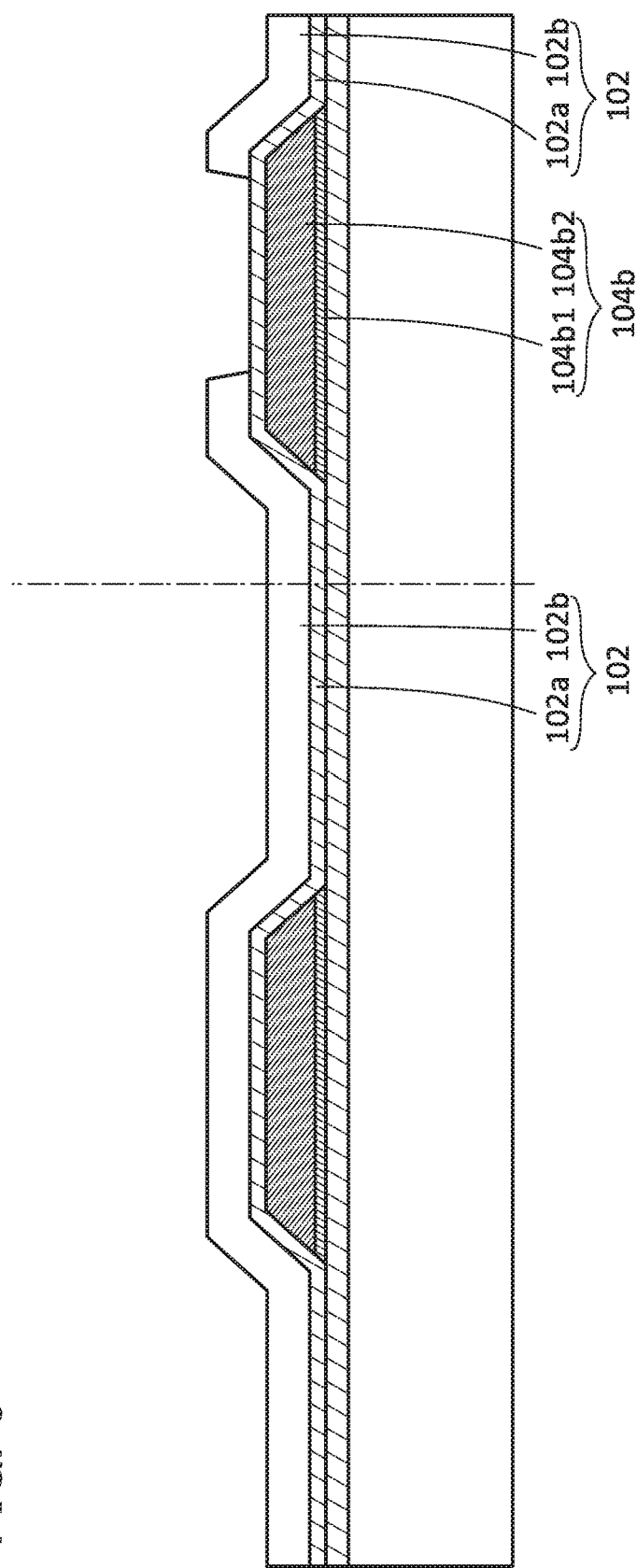
FIG. 6 is a cross-sectional view illustrating a method for manufacturing a semiconductor device according to one embodiment of the present invention.

Next, the insulator 132 is processed with a photolithography step, whereby the insulator 102b is formed (see FIG. 6). Formation of the insulator 102b is performed so that a region in the insulator 102a which overlaps with the conductor 104b is exposed.

Next, a semiconductor to be the semiconductor 106a is formed.

Next, a semiconductor to be the semiconductor 106b is formed.

Next, first heat treatment is preferably performed. The first heat treatment is performed at a temperature higher than or equal to 250° C. and lower than or equal to 650° C., preferably higher than or equal to 300° C. and lower than or equal to 500° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. With the first heat treatment, crystallinity of the semiconductor to be the semiconductor 106a and crystallinity of the semiconductor to be the semiconductor 106b can be increased and impurities such as hydrogen and water can be removed.

Figure 7:
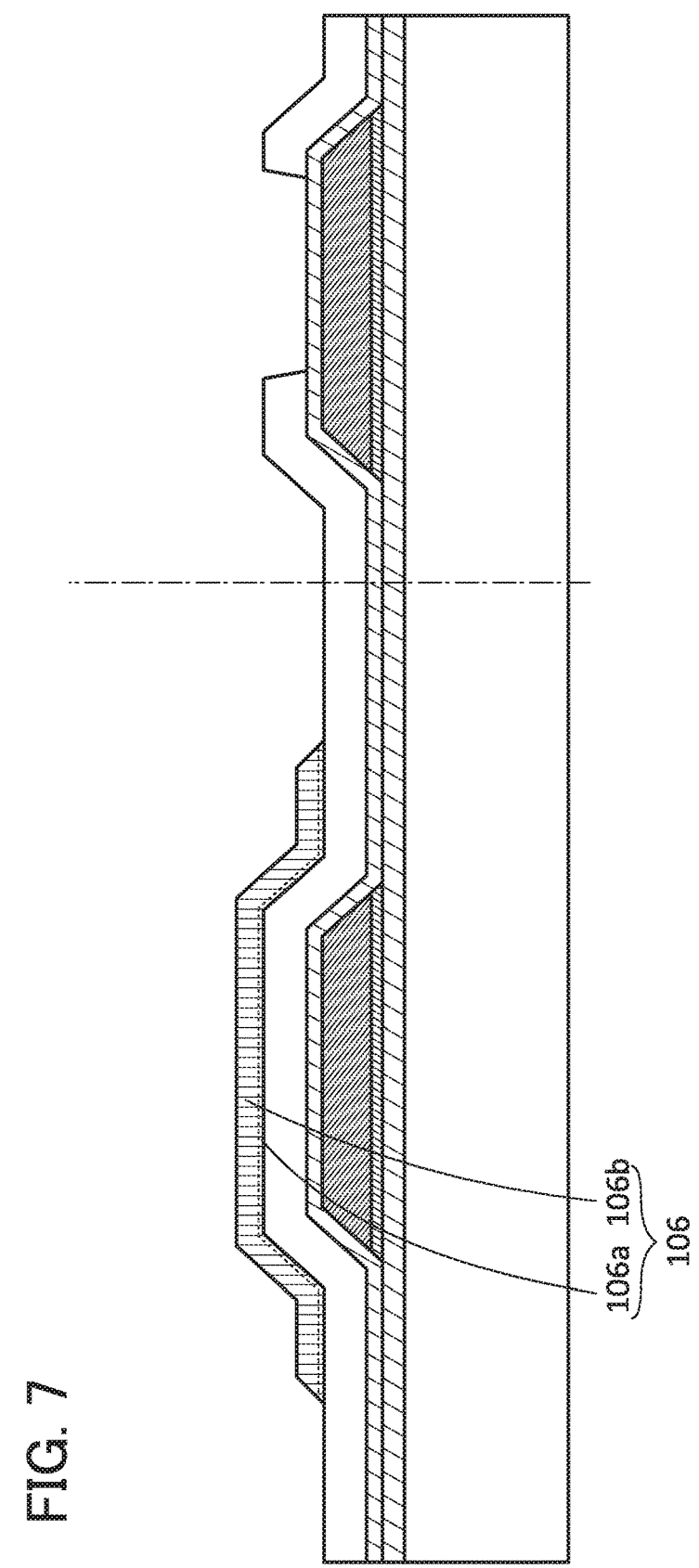
FIG. 7 is a cross-sectional view illustrating a method for manufacturing a semiconductor device according to one embodiment of the present invention.

Next, a stack of semiconductors is processed with a photolithography step, so that a semiconductor 106 including the semiconductor 106a and the semiconductor 106b is formed (see FIG. 7).

Next, an insulator that is to be the insulator 112 is formed.

Next, a conductor that is to be the conductor 114a is formed.

Next, a conductor that is to be the conductor 114b is formed.

Next, a stack of the conductors is processed with a photolithography step. At etching in the step, an etching rate of the upper conductor is higher than that of the lower conductor, whereby the conductor 114b and the conductor 114a whose end portion extends beyond the end portion of the conductor 114b can be formed.

Next, with use of the conductor 114a or the like as a mask, the insulator to be the insulator 112 is processed, whereby the insulator 112 whose end portion extends beyond the end portion of the conductor 114a is formed. By this step, the upper surface of the semiconductor 106 (the thickness is greater than or equal to 0.1 nm and less than or equal to 5 nm) may be etched.

Figure 8:
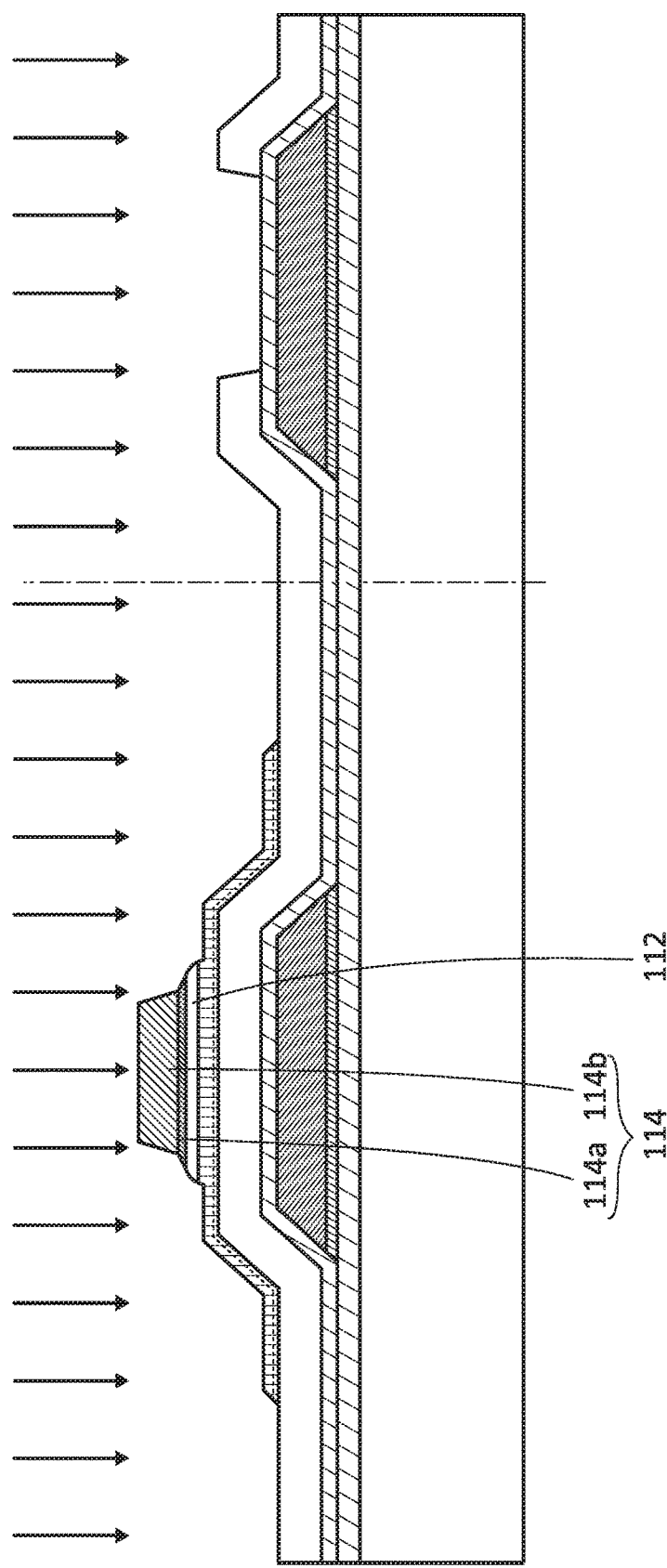
FIG. 8 is a cross-sectional view illustrating a method for manufacturing a semiconductor device according to one embodiment of the present invention.

Next, with use of the insulator 112, the conductor 114a, and the conductor 114b as a mask, the semiconductor 106 is processed (see FIG. 8).

A treatment in this step can be performed in such a manner that an impurity enabling the carrier density of the semiconductor 106 to be increased is added. In the case where the semiconductor 106 is an oxide semiconductor, as the impurity one or more elements selected from boron, carbon, nitrogen, neon, aluminum, phosphorus argon, manganese, arsenic, xenon, krypton, and the like may be selected, for example. For the impurity, it is particularly preferable to use argon. A doping method or the like may be performed for adding an impurity. Alternatively, this step may be performed by a plasma treatment in an atmosphere containing the above element (e.g., argon), for example. The plasma treatment is preferably performed in such a manner that a self-bias is applied to the substrate 100 side, for example.

When the treatment is performed on the oxide semiconductor, oxygen in the oxide semiconductor is released and an oxygen vacancy (also referred to as Vo) can be formed. In a state where a proximate hydrogen is in the oxygen vacancy (the state is referred to as VoH), a donor level is formed in an oxide semiconductor, and the carrier density of the processed region can be increased, and the resistance in the region can be reduced. The details of generation of donor level by VoH are described later.

Figure 9:
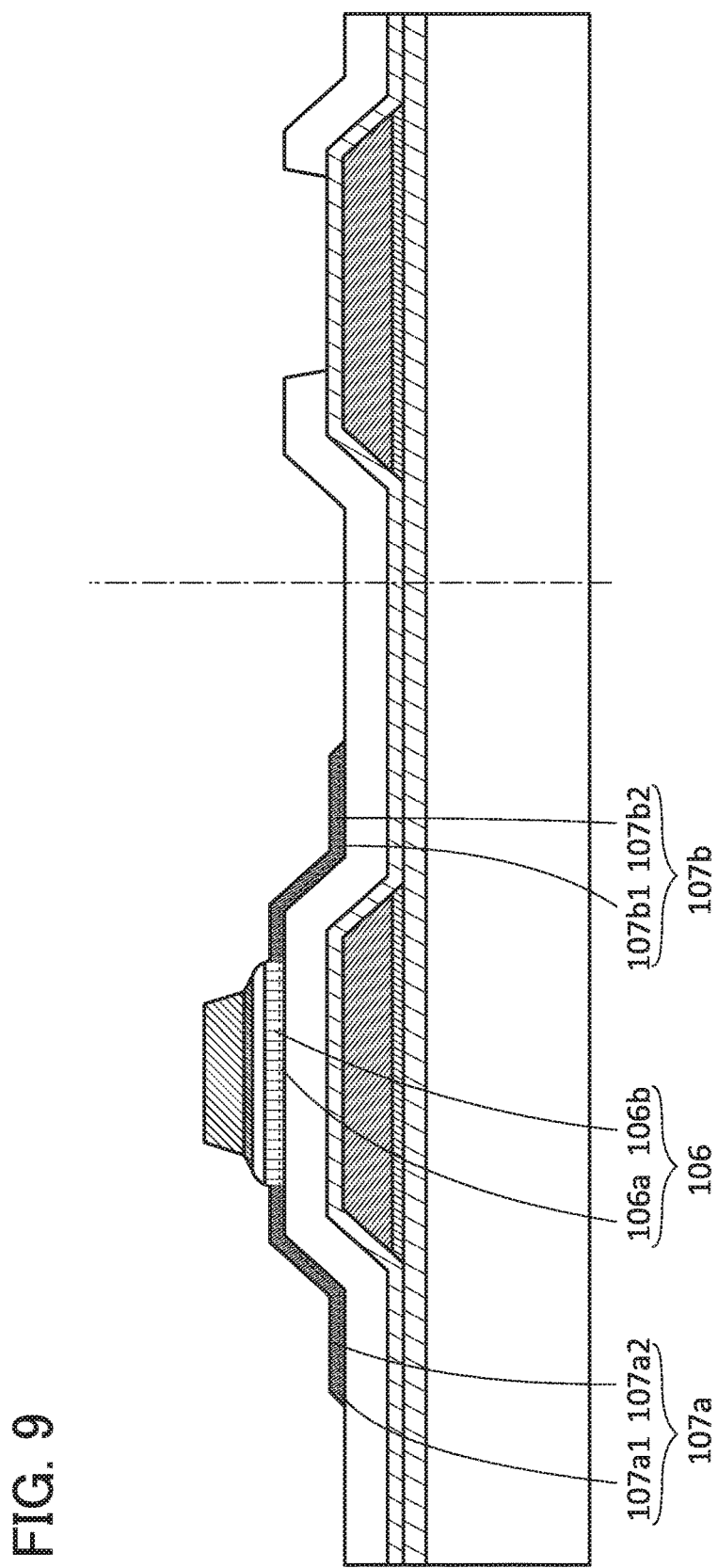
FIG. 9 is a cross-sectional view illustrating a method for manufacturing a semiconductor device according to one embodiment of the present invention.

In the above manner, the region 107a1 and the region 107b1 which are processed regions in the semiconductor 106a and the region 107a2 and the region 107b2 which are processed regions in the semiconductor 106b can be formed (see FIG. 9). Note that the region 107a1 and the region 107a2 are collectively called a region 107a. The region 107b1 and the region 107b2 are collectively called a region 107b.

Next, an insulator 138 is formed. The insulator 138 is to be the insulator 108 through a step performed later; thus, description of the insulator 108 is referred to.

The insulator 138 is preferably formed by a PECVD method. For example, an insulator containing hydrogen, particularly silicon nitride containing hydrogen (also referred to as SiNH) is deposited as the insulator 138, whereby hydrogen can be added to the region 107a and the region 107b. As a result, the Vo in the region 107a and the region 107b is filled with the hydrogen, and accordingly VoH forming a donor level can be efficiently generated. Even when Vo is caused by a release of hydrogen from VoH in the region 107a and the region 107h, the Vo can be returned to VoH promptly as long as a sufficient amount of hydrogen is contained in the insulator 138. Thus, the region 107a and the region 107b formed in the above manner can be held in a low resistance state. In other words, when the region 107a and the region 107b are used as a source region and a drain region, the amount of on-state current of the transistor 150 can be increased.

An oxide semiconductor having become a conductor can be referred to as an oxide conductor. Oxide semiconductors generally have a visible light transmitting property because of their large energy gap. An oxide conductor is an oxide semiconductor having a donor level in the vicinity of the conduction band. Therefore, the influence of absorption due to the donor level is small, and an oxide conductor has a visible light transmitting property comparable to that of an oxide semiconductor.

The temperature dependence of resistivity in the oxide conductor is described with reference to FIG. 38.

As oxide conductors included in samples whose resistivity were measured, the following oxide conductors were formed: an oxide conductor (OC_SiNH) formed by making a silicon nitride containing hydrogen being in contact with an oxide semiconductor; an oxide conductor (OC_Ar dope+SiNH) formed by adding argon to an oxide semiconductor with an doping apparatus and making the oxide semiconductor being in contact with a silicon nitride containing hydrogen; and an oxide conductor (OC_Ar plasma+SiNH) formed by irradiating an oxide semiconductor with an argon ion with use of argon plasma in a plasma treatment apparatus and making the oxide semiconductor being in contact with a silicon nitride fill containing hydrogen.

A method for forming a sample including the oxide conductor (OC_SiNH) is described below. A 400-nm-thick silicon oxynitride film was deposited over a glass substrate by a PECVD method and then exposed to oxygen plasma so that an oxygen ion was added to the silicon oxynitride, whereby an oxynitride silicon film from which oxygen is released by heating was formed. Next, over the oxynitride silicon from which oxygen is released by heating, a 100-nm-thick In—Ga—Zn oxide was deposited by a sputtering method using a sputtering target with an atomic ratio In:Ga:Zn=1:1:1.2, subjected to heat treatment in a nitrogen atmosphere at 450° C., and then subjected to heat treatment in a mixed gas of nitrogen and oxygen at 450° C. Next, a 100-nm-thick silicon nitride was deposited by a PECVD method. Then, the film was subjected to heat treatment in a mixed gas of nitrogen and oxygen at 350° C.

A method for forming a sample including the oxide conductor (OC_Ar dope+SiNH) is described below. A 400-nm-thick silicon oxynitride was deposited over a glass substrate by a PECVD method and then exposed to oxygen plasma so that an oxygen ion was added to the silicon oxynitride, whereby an oxynitride silicon from which oxygen is released by heating was formed. Next, over the oxynitride silicon from which oxygen is released by heating, a 100-nm-thick In—Ga—Zn oxide film was deposited by a sputtering method using a sputtering target with an atomic ratio In:Ga:Zn=5:5:6, subjected to heat treatment in a nitrogen atmosphere at 450° C., and then subjected to heat treatment in a mixed gas of nitrogen and oxygen at 450° C. Then, argon was added to the In—Ga—Zn oxide film at an acceleration voltage of 10 kV and a dose of $5\times10^{14}/cm^2$ with a doping apparatus, whereby oxygen vacancies were formed in the In—Ga—Zn oxide film. Next, a 100-nm-thick silicon nitride film was deposited by a PEVD method. Then, the film was subjected to heat treatment in a mixed gas of nitrogen and oxygen at 350° C.

A method for forming a sample including the oxide conductor (OC_Ar plasma+SiNH) is described below. A 400-nm-thick silicon oxynitride film was deposited over a glass substrate by a PECVD method and then irradiated with oxygen plasma, whereby an oxynitride silicon from which oxygen is released by heating was formed. Next, over the oxynitride silicon from which oxygen is released by heating, a 100-nm-thick In—Ga—Zn oxide was deposited by a sputtering method using a sputtering target with an atomic ratio In:Ga:Zn=1:1:1.2, subjected to heat treatment in a nitrogen atmosphere at 450° C., and then subjected to heat treatment in a mixed gas of nitrogen and oxygen at 450° C. Next, argon plasma was generated with a plasma treatment apparatus, and an accelerated argon ion was made to collide against the In—Ga—Zn oxide film, whereby an oxygen vacancy was generated. Next, a 100-nm-thick silicon nitride film was deposited by a PECVD method. Then, the film was subjected to heat treatment in a mixed gas of nitrogen and oxygen at 350° C.

Figure 38:
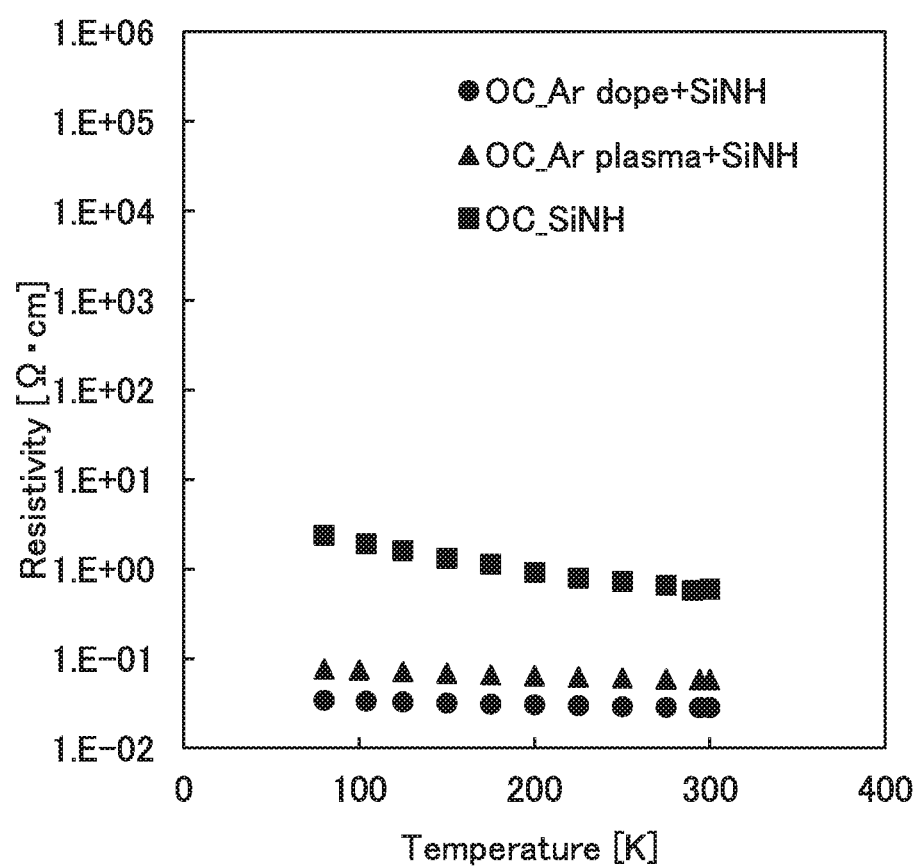
FIG. 38 is a graph showing temperature dependence of resistivity.

FIG. 38 shows the results of measured resistivity of each sample. The measurement of resistivity was performed by the four probe Van der Pauw method. In FIG. 38, the horizontal axis represents measurement temperature, and the vertical axis represents resistivity. A square represents the measurement result of the oxide conductor (OC_SiNH), a circle represents the measurement result of the oxide conductor (OC_Ar dope+SiNH), and a triangle represents the measurement result of the oxide conductor (OC_Ar plasma+SiNH).

The oxide semiconductor that is not in contact with the silicon nitride containing hydrogen, though not shown, had high resistivity, and it was difficult to measure the resistivity. Thus, it is found that the oxide conductive has lower resistivity than the oxide semiconductor.

According to FIG. 38, in the case where the oxide conductor (OC_Ar dope+SiNH) and the oxide conductor (OC_Ar plasma+SiNH) contain oxygen vacancy and hydrogen, a variation in resistivity is small. Typically, the range of the variations in resistivity of the oxide conductors at temperatures from 80 K to 290 K is within ±20%. Alternatively, the range of the variations in resistivity of the oxide conductor films at temperatures from 150 K to 250 K is within ±10%. In other words, the oxide conductor is a degenerate semiconductor and it is suggested that the conduction band edge agrees with or substantially agrees with the Fermi level. Thus, when the oxide conductor is used as a source region and a drain region of a transistor, an ohmic contact occurs at a portion where the oxide conductor is in contact with a conductor functioning as a source electrode and a drain electrode, and the contact resistance of the oxide conductor and the conductor functioning as a source electrode and a drain electrode can be reduced. Furthermore, the oxide conductor has low temperature dependence of resistivity; thus, a fluctuation of contact resistance of the oxide conductor and a conductor functioning as a source electrode and a drain electrode is small, and a highly reliable transistor can be formed.

Next, an insulator to be an insulator 148 is formed. That insulator that is to be the insulator 148 is an insulator that is to be the insulator 118 through a step performed later; thus, description of the insulator 118 is referred to.

Next, a second heat treatment may be performed. In this case, by the second heat treatment, excess oxygen in the insulator 102 is moved to the semiconductor 106b through the semiconductor 106a. The semiconductor 106b is covered with any of the semiconductor 106c, the insulator 112, and the insulator 108; thus, outward diffusion of excess oxygen is less likely to occur. Therefore, by performing the second heat treatment at this time, defects (oxygen vacancies) in the semiconductor 106b can be efficiently reduced. Note that the second heat treatment may be performed at a temperature such that excess oxygen (oxygen) in the insulator 102 is diffused to the semiconductor 106b. For example, the description of the first heat treatment may be referred to for the second heat treatment. The second heat treatment is preferably performed at a temperature lower than that of the first heat treatment by higher than or equal to 20° C. and lower than or equal to 150° C., preferably higher than or equal to 40° C. and lower than or equal to 100° C. Accordingly, release of excess oxygen (oxygen) from the insulator 102 can be inhibited.

Figure 10:
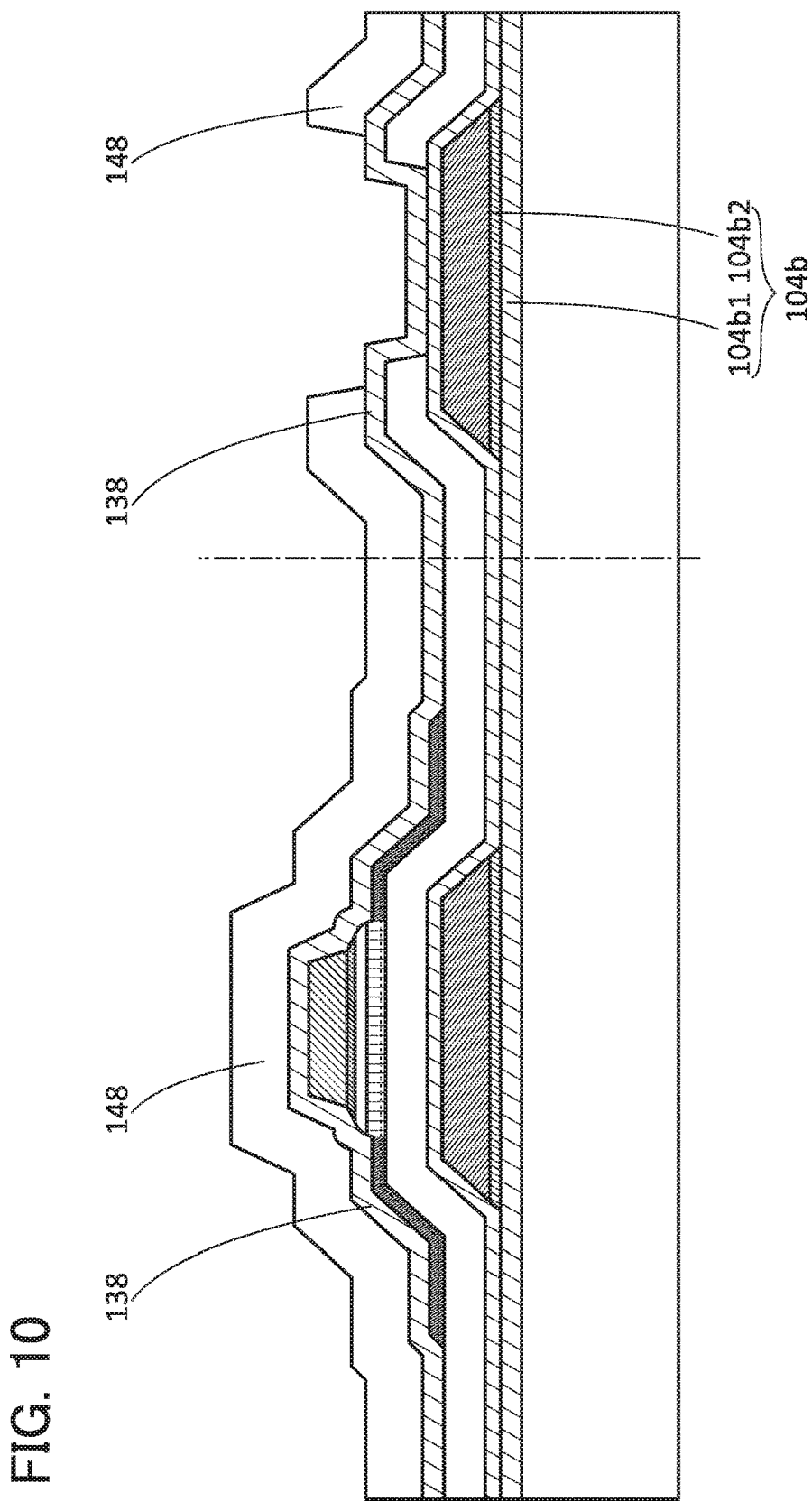
FIG. 10 is a cross-sectional view illustrating a method for manufacturing a semiconductor device according to one embodiment of the present invention.

Next, the insulator is processed with a photolithography step or the like, the insulator 148 is formed (see FIG. 10). Formation of the insulator 148 is performed so that a region of the insulator 138 which overlaps with the conductor 104b is exposed.

Figure 11:
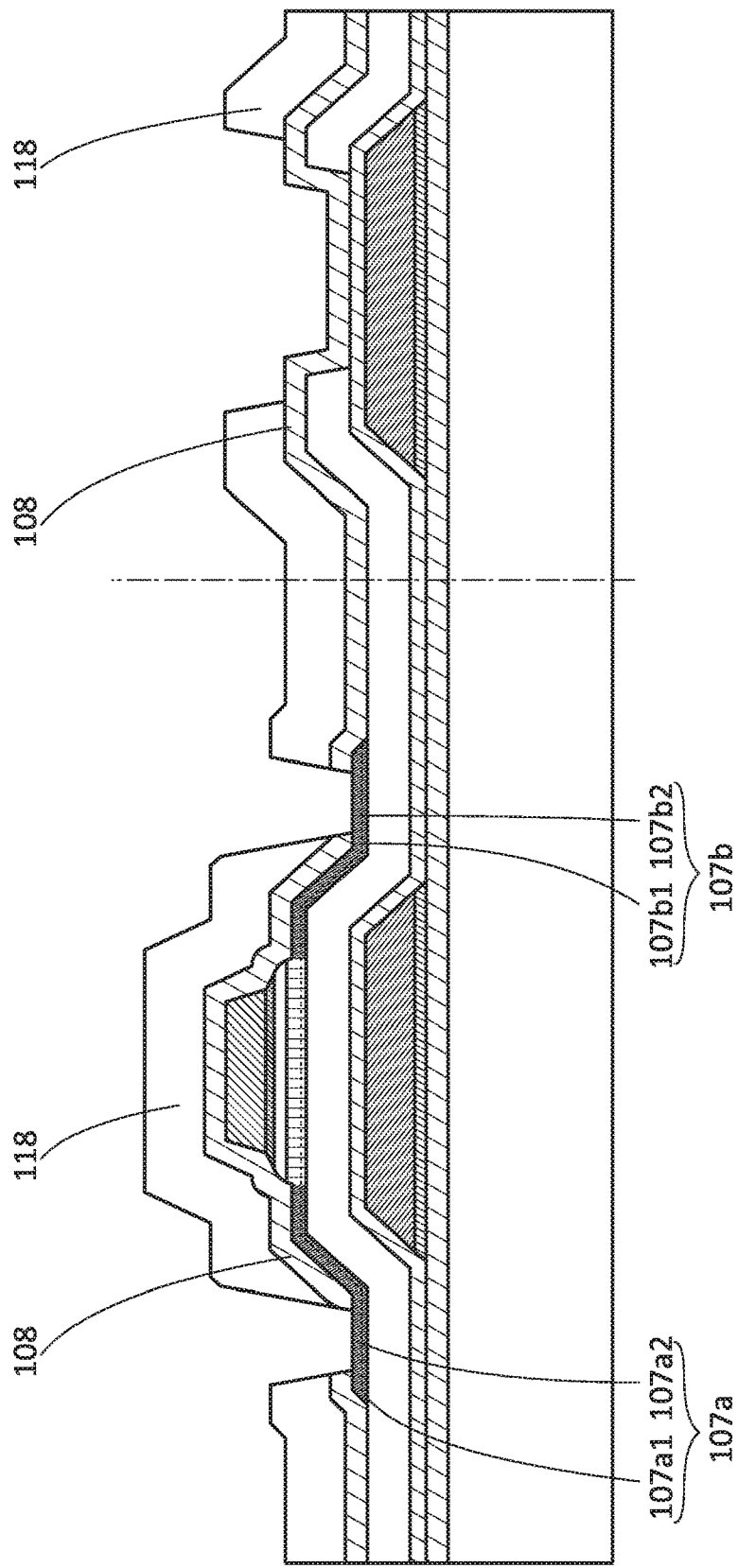
FIG. 11 is a cross-sectional view illustrating a method for manufacturing a semiconductor device according to one embodiment of the present invention.

Next, a stack of the insulator 138 and the insulator 148 is processed with a lithography step, whereby a stack of the insulator 108 and the insulator 118 is formed (see FIG. 11). Formation of the insulator 108 and the insulator 118 is performed so that the region 107a and the region 107b are exposed.

Next, a conductor that is to be the conductor 116a1, the conductor 116b1, and the conductor 116c1 is formed.

Next, a conductor that is to be the conductor 116a2, the conductor 116b2, and the conductor 116c2 is formed.

Next, a stack of the conductors is processed by a lithography step, whereby the conductor 116a including the conductor 116a1 and the conductor 116a2, the conductor 116b including the conductor 116b1 and the conductor 116b2, and the conductor 116c including the conductor 116c1 and the conductor 116c2 are formed. The conductor 116a, the conductor 116b, and the conductor 116c are formed through one step in the above manner, a process can be shortened. Thus, a semiconductor device can be manufactured with high productivity.

Figure 12:
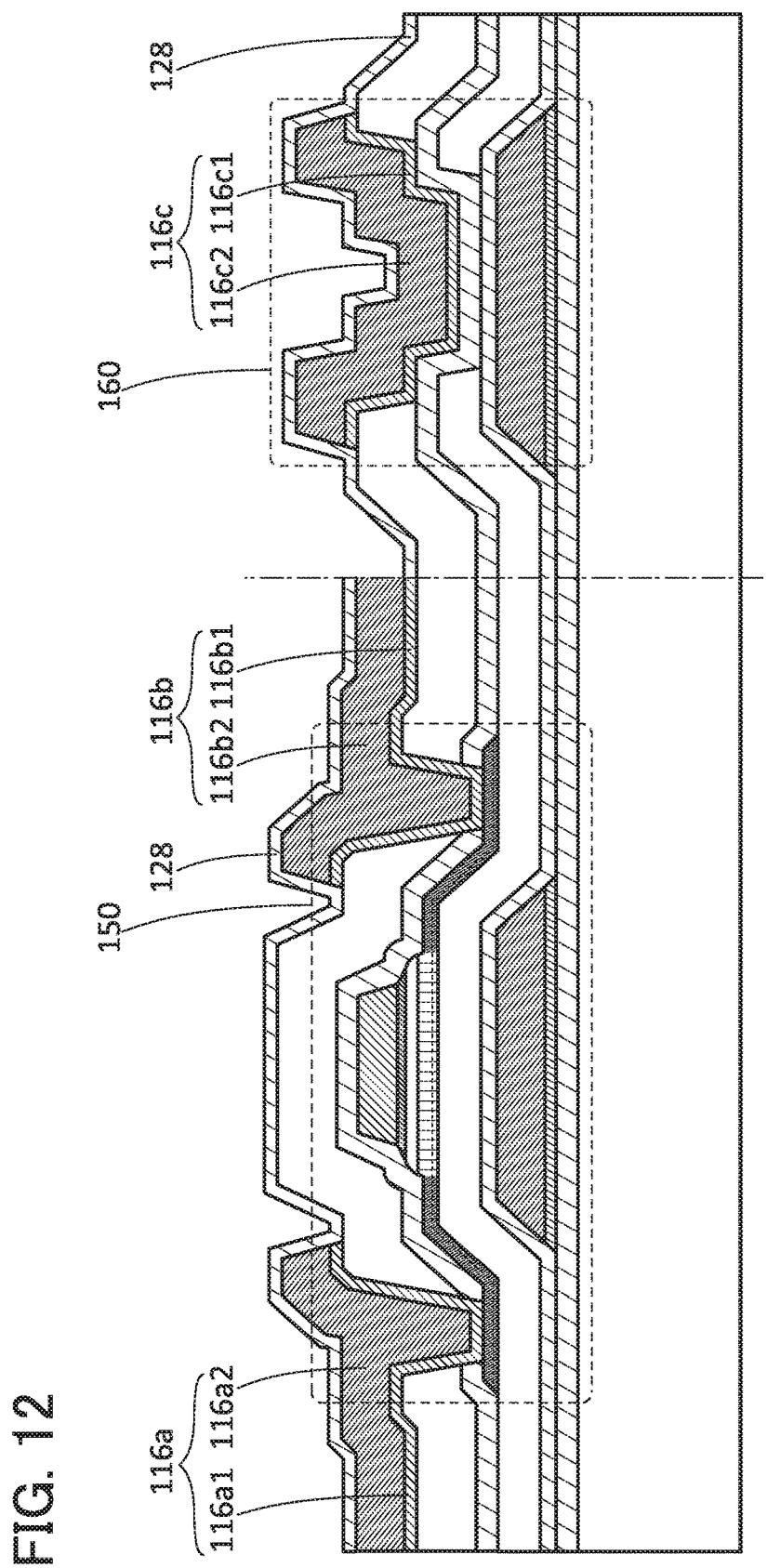
FIG. 12 is a cross-sectional view illustrating a method for manufacturing a semiconductor device according to one embodiment of the present invention.

Next, the insulator 128 is formed (see FIG. 12).

As described above, a semiconductor device including the transistor 150 and the capacitor 160 can be manufactured.

<Modified Example of Semiconductor Device>

Figure 13:
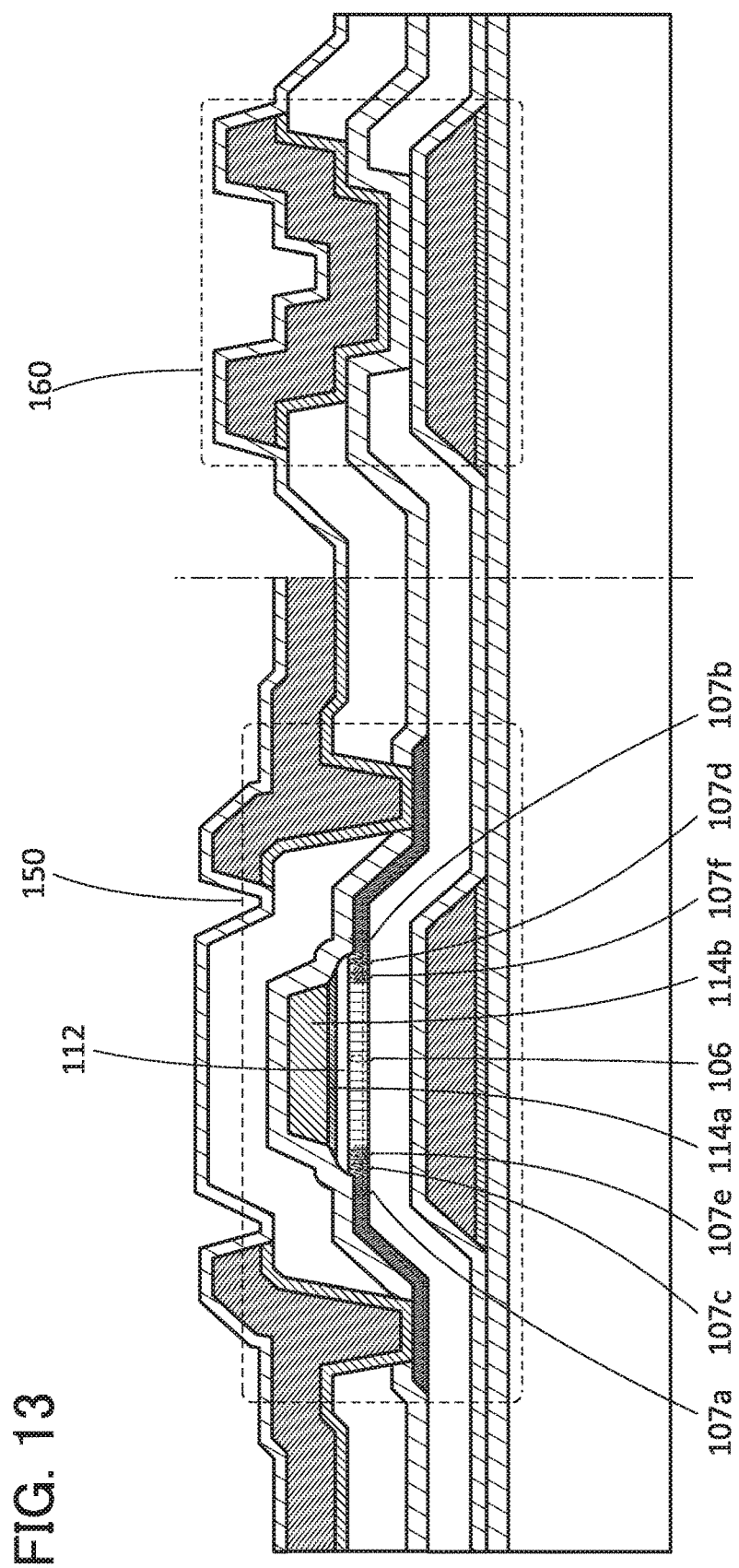
FIG. 13 is a cross-sectional view illustrating a semiconductor device according to one embodiment of the present invention.

FIG. 1 and the like illustrate a structure in whish the semiconductor 106 of the transistor 150 includes a region that functions as a channel formation region, and the region 107a and the region 107b that function as a source region and a drain region. However, a semiconductor device according to one embodiment of the present invention is not limited to the above structure. For example, as illustrated in FIG. 13, a structure in which a region 107c, a region 107d, a region 107e, and a region 107f are further provided on an inner side of the region 107a and the region 107b may be employed.

The region 107c includes a region adjacent to the region 107a. In addition, the region 107c includes a region that overlaps with the insulator 112 and do not overlap with the conductor 114a. The region 107d includes a region adjacent to the region 107b. In addition, the region 107d includes a region that overlaps with the insulator 112 and do not overlap with the conductor 114a. The region 107e includes a region adjacent to the region 107c. In addition, the region 107e includes a region that overlaps with the conductor 114a and do not overlap with the conductor 114b. The region 107f includes a region adjacent to the region 107d. In addition, the region 107f includes a region that overlaps with the conductor 114a and do not overlap with the conductor 114b.

The region 107c may include a region that functions as a lightly doped drain (LDD) region. The LDD region is a region whose carrier density and/or impurity concentration is lower than that of the source region or the drain region, and includes a region whose carrier density and/or impurity concentration is higher than that of the channel formation region. Furthermore, the region 107c includes, for example, a region that functions as an off-set region. The off-set region includes a region whose carrier density and/or impurity concentration is equivalent to that of the channel formation region.

The region 107d may include a region that functions as a lightly doped drain (LDD) region. Furthermore, the region 107d includes, for example, a region that functions as an off-set region. The region 107e may include a region that functions as a lightly doped drain (LDD) region. Furthermore, the region 107e includes, for example, a region that functions as an off-set region. The region 107f may include a region that functions as a lightly doped drain (LDD) region. Furthermore, the region 107f includes, for example, a region that functions as an off-set region. Note that in the semiconductor 106, a region where the region 107e and/or the region 107f overlaps with the conductor 114a is referred to as an overlap region.

At least one of the region 107c, the region 107d, the region 107e, and the region 107f includes a region that functions as an LDD region or/and a region that functions as an off-set region, whereby a deterioration of the transistor due to concentration of the electric field on the drain can be reduced. In other words, a highly reliable semiconductor device can be obtained.

For example, it may be preferred when the region 107c and the region 107d each include a region that functions as an LDD region and the region 107e and the region 107f each include a region that functions as an off-set region, particularly, a deterioration of the transistor due to concentration of electric field on the drain can be reduced.

Note that each region that functions as an LDD region preferably has a length in the channel length direction that is lower than 20%, lower than 10%, lower than 5%, or lower than 2% of a distance between the source region and the drain region. Alternatively, each overlap region preferably has a length in the channel length direction that is lower than 20%, lower than 10%, lower than 5%, or lower than 2% of a distance between the source region and the drain region. Alternatively, each region that functions as an off-set region preferably has a length in the channel length direction that is lower than 20%, lower than 10%, lower than 5%, or lower than 2% of a distance between the source region and the drain region.

Figure 14:
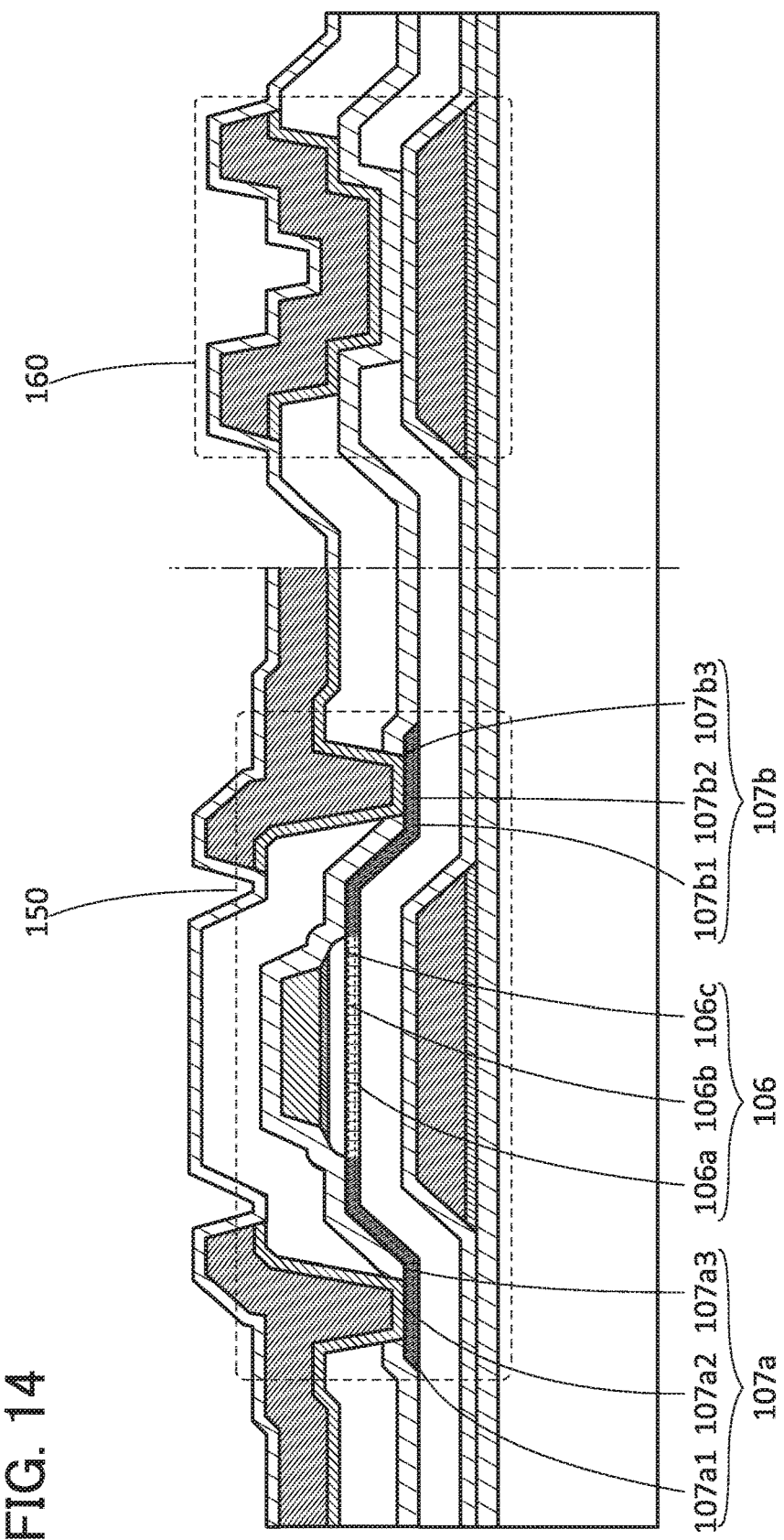
FIG. 14 is a cross-sectional view illustrating a semiconductor device according to one embodiment of the present invention.
Figure 15:
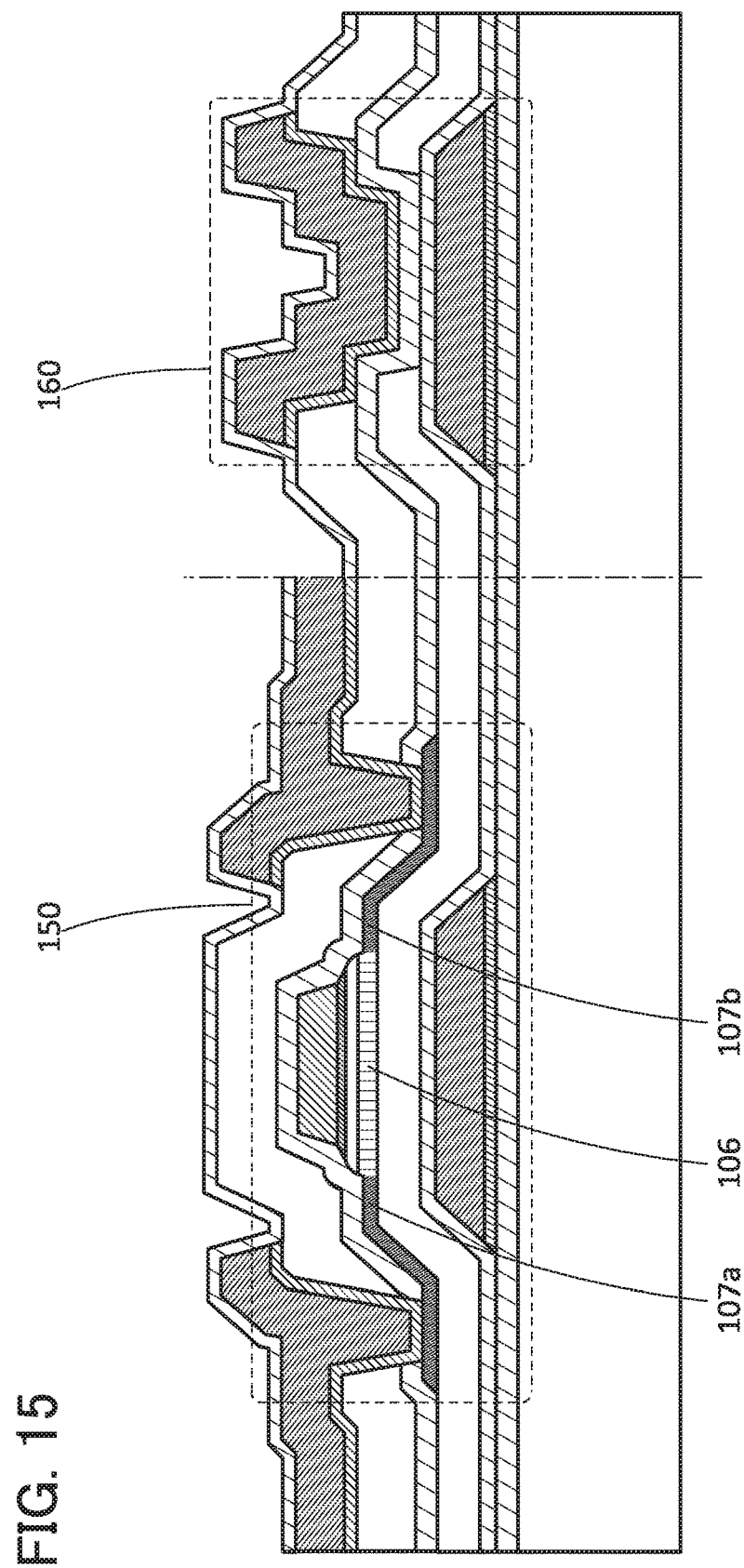
FIG. 15 is a cross-sectional view illustrating a semiconductor device according to one embodiment of the present invention.

Although FIG. 1 and the like illustrate a structure in which the semiconductor 106 having a region that functions as a channel formation region of the transistor 150 includes two layers of the semiconductor 106a and the semiconductor 106b, the semiconductor device according to one embodiment of the present invention is not limited to the above structure. For example, as illustrated in FIG. 14, the semiconductor 106 may include three layers of the semiconductor 106a, the semiconductor 106b, and the semiconductor 106c. In this case, the region 107a includes the region 107a1, the region 107a2, and a region 107a3. The region 107b includes the region 107b1, the region 107b2, and the region 107b3. Alternatively, as illustrated in FIG. 15, the semiconductor 106 may be a single layer. In this case, the region 107a has a single-layer structure. In addition, the region 107b has a single-layer structure.

Figure 16:
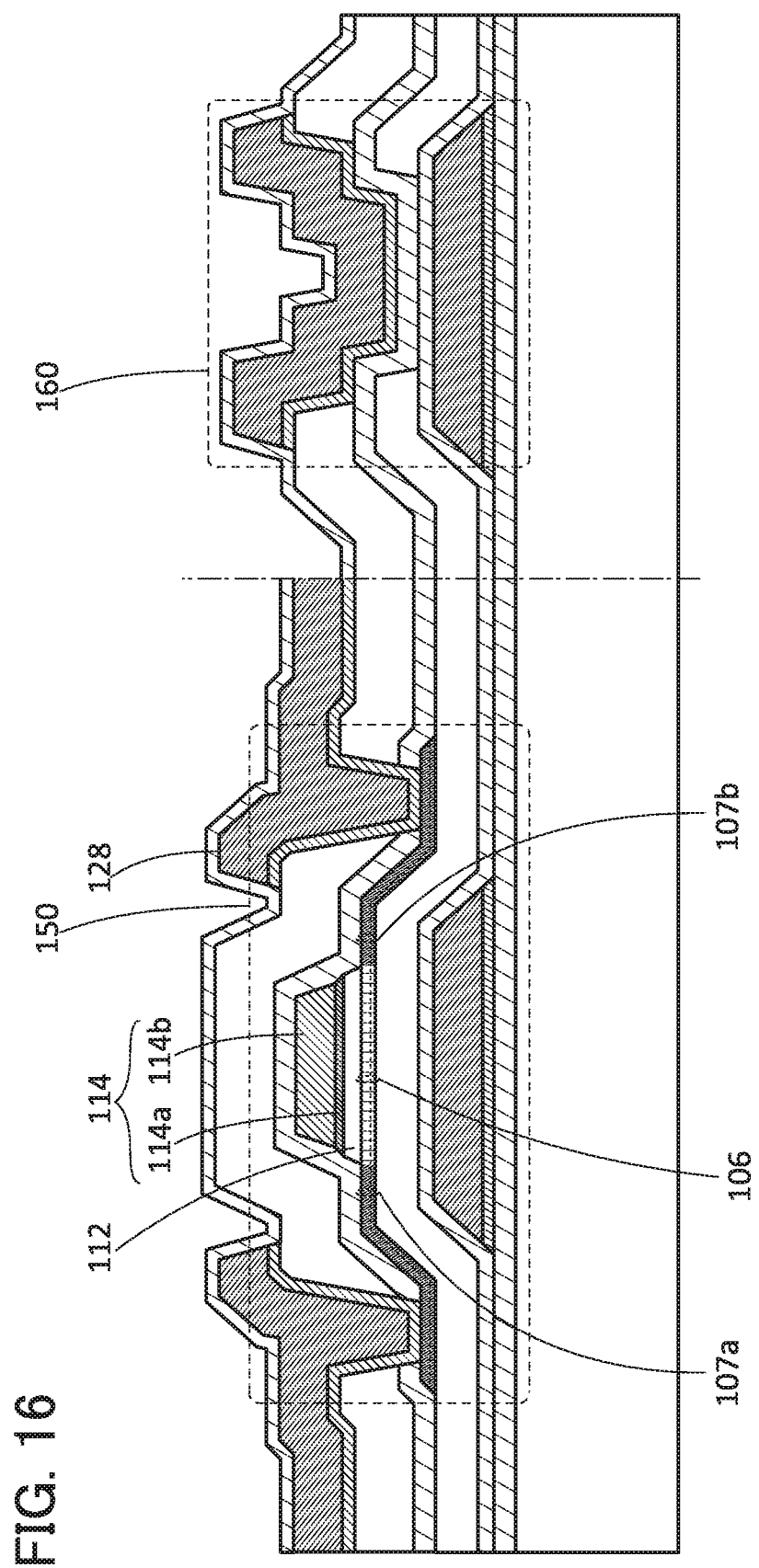
FIG. 16 is a cross-sectional view illustrating a semiconductor device according to one embodiment of the present invention.

Although FIG. 1 and the like illustrate a structure in which the insulator 112 including a region that functions as a gate insulator of the transistor 150 has an end portion whose cross-sectional shape is a circular arc, the semiconductor device according to one embodiment of the present invention is not limited to the structure. For example, as illustrated in FIG. 16, a structure which does not has a region where a cross-sectional shape of the end portion of the insulator 112 is a circular arc may be employed.

Note that in the transistor 150 according to one embodiment of the present invention, at least one of the insulator 112, the conductor 114a, and the conductor 114b preferably has a taper angle. For example, the insulator 112 seen in cross section preferably has an angle θ1 formed between the top surface of the semiconductor 106 and the side surface of the insulator 112, which is less than 90°, greater than or equal to 30° and less than or equal to 85°, or greater than or equal to 45° and less than or equal to 70°. The conductor 114a seen in cross section preferably has an angle θ2 formed between the top surface of the insulator 112 and the side surface of the conductor 114a, which is less than 90°, greater than or equal to 10° and less than or equal to 85°, greater than or equal to 15° and less than or equal to 85°, greater than or equal to 30° and less than or equal to 85°, or greater than or equal to 45° and less than or equal to 70°. The conductor 114b seen in cross section preferably has an angle θ3 formed between a straight line that is approximately parallel to the top surface of the conductor 114a and a straight line that is approximately parallel to the side surface of the conductor 114b, which is less than 90°, greater than or equal to 30° and less than or equal to 85° or greater than or equal to 45° and less than or equal to 70°. Furthermore, it is preferred that the angle θ1 be smaller than the angle θ2 because the coverage with a layer formed later is increased. Moreover, it is preferred that the angle θ3 be smaller than the angle θ2 because the coverage with a layer formed later is increased.

<Positional Relation of Wiring>

Connection of wirings and the like of the semiconductor device according to one embodiment of the present invention is described below.

Figure 17A:
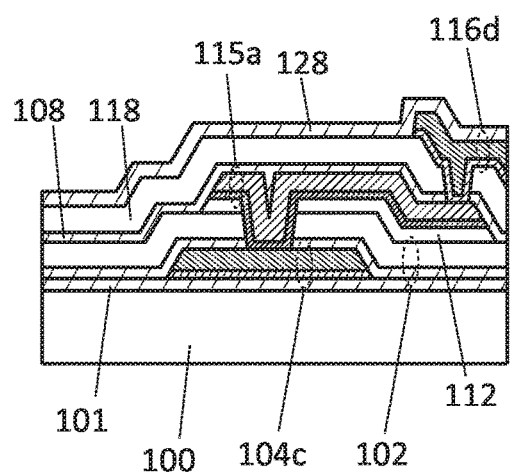
FIGS. 17A to 17D are cross-sectional views each illustrating a semiconductor device according to one embodiment of the present invention.

FIG. 17A is a cross-sectional view illustrating an example of connection of wirings of the semiconductor device. FIG. 17A illustrates a connection portion in the case where a conductor 104c formed from the same layer as the conductor 104a and/or the conductor 104b is electrically connected to a conductor 116d formed from the same layer as the conductor 116a, the conductor 116b and/or the conductor 116c. Specifically, the conductor 104c have a region that is in contact with a conductor 115a formed from the same layer as the conductor 114 and the like through openings provided in the insulator 102 and the insulator 112. In addition, the conductor 116d may have a region that is in contact with the conductor 115a through openings provided in the insulator 108 and the insulator 118.

The openings provided in the insulator 102 and the insulator 112 may be formed in one process or through different processes. The openings provided in the insulator 108 and the insulator 118 may be formed in one process or through different processes. These steps are performed in a process of manufacturing the transistor 150 and the capacitor 160, which may increase the productivity of the semiconductor device.

Figure 17B:
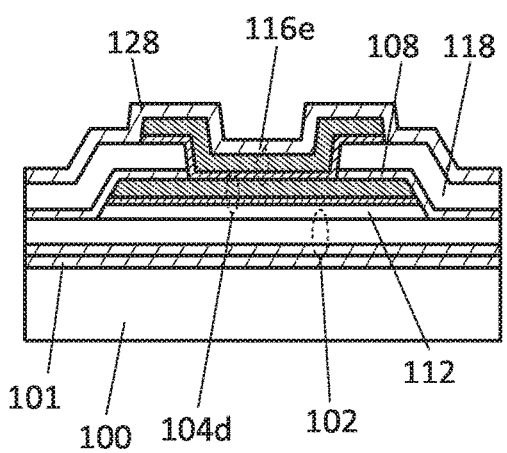

FIG. 17B is a cross-sectional view illustrating an example of connection between wirings of the semiconductor device.

FIG. 17B illustrates a connection portion where a conductor 104d formed from the same layer as the conductor 104a and/or the conductor 104b is electrically connected to a conductor 116e formed from the same layer as the conductor 116a, the conductor 116b and/or the conductor 116c. Specifically, the conductor 104d may include a region in contact with the conductor 116e through openings provided in the insulator 108 and the insulator 118.

The openings provided in the insulator 108 and the insulator 118 may be formed in one process or through different processes. These steps are performed in a process of manufacturing the transistor 150 and the capacitor 160, which may increase the productivity of the semiconductor device.

Figure 17C:
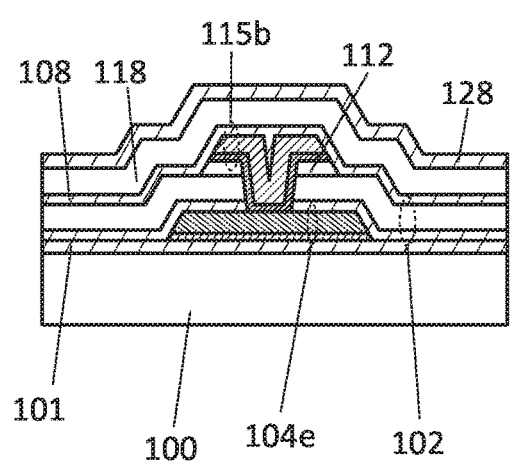

FIG. 17C is a cross-sectional view illustrating an example of connection between wirings of the semiconductor device. FIG. 17C illustrates a connection portion where a conductor 104e formed from the same layer as the conductor 104a and/or the conductor 104b is electrically connected to a conductor 115b formed from the same layer as the conductor 114 and the like. Specifically, the conductor 104e may include a region that is in contact with the conductor 115b through openings provided in the insulator 102 and the insulator 112.

The openings provided in the insulator 102 and the insulator 112 may be formed in one process or through different processes. These steps are performed in a process of manufacturing the transistor 150 and the capacitor 160, which may increase the productivity of the semiconductor device.

Figure 17D:
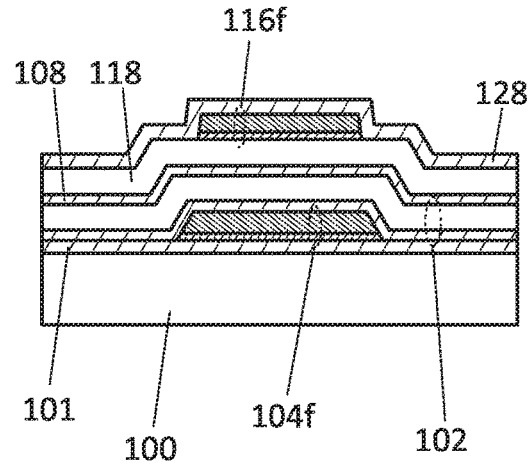

FIG. 17D is a cross-sectional view illustrating an example of intersection of wirings of the semiconductor device. FIG. 17D illustrates a region where a conductor 104f formed from the same layer as the conductor 104a and/or the conductor 104b overlaps with a conductor 116f formed from the same layer as the conductor 116a and the conductor 116b and/or the conductor 116c with the insulator 102, the insulator 108 and the insulator 118 provided therebetween.

With a plurality of insulators provided between wirings, the parasitic capacitance between the wirings can be reduced. Thus, a lowering in frequency characteristics (f-characteristic) due to the parasitic capacitance can be suppressed, which means that the semiconductor device according to one embodiment of the present invention has favorable f-characteristic.

<Oxide Semiconductor>

An oxide semiconductor that can be used for the semiconductor 106, the semiconductor 106a, the semiconductor 106b, the semiconductor 106c, and the like will be described below.

An oxide semiconductor is an oxide containing indium, for example. An oxide semiconductor can have a high carrier mobility (electron mobility) by containing indium, for example. An oxide semiconductor preferably contains an element M. The element M is preferably aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, and the like. Note that two or more of the above elements may be used in combination as the element M. The element M is an element having a high bonding energy with oxygen, for example. The element M is an element whose bonding energy with oxygen is higher than that of indium. The element M is an element that can increase the energy gap of the oxide semiconductor, for example. Further, the oxide semiconductor preferably contains zinc. When the oxide semiconductor contains zinc, the oxide semiconductor is easily to be crystallized, for example.

Note that the oxide semiconductor is not limited to the oxide semiconductor containing indium. The oxide semiconductor may be, for example, an oxide semiconductor which does not contain indium and contains zinc, such as a zinc tin oxide or a gallium tin oxide, an oxide semiconductor containing gallium, or an oxide semiconductor containing tin.

For the oxide semiconductor, for example, an oxide with a wide energy gap is used. For example, the energy gap of the oxide semiconductor is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

As factors of inhibiting electron movement is decreased, the on-state current of the transistor can be increased. For example, in the case where there is no factor of inhibiting electron movement, electrons are assumed to be efficiently moved. The electron movement is inhibited, for example, in the case where the channel formation region has large physical unevenness.

Therefore, to increase the on-state current of the transistor, for example, root mean square (RMS) roughness with a measurement area of 1 μm×1 μm of a top surface or a bottom surface of the oxide semiconductor is less than 1 nm, preferably less than 0.6 nm, further preferably less than 0.5 nm, still further preferably less than 0.4 nm. The average surface roughness (also referred to as Ra) with the measurement area of 1 μm×1 μm is less than 1 nm, preferably less than 0.6 nm, further preferably less than 0.5 nm, still further preferably less than 0.4 nm. The maximum difference (P–V) with the measurement area of 1 μm×1 μm is less than 10 nm, preferably less than 9 nm, further preferably less than 8 nm, still further preferably less than 7 nm. RMS roughness, Ra, and P–V can be measured using a scanning probe microscope SPA-500 manufactured by SU Nano Technology Inc.

Note that when copper enters the oxide semiconductor, an electron trap is generated in some cases. The electron trap makes the threshold voltage of the transistor shift in the positive direction in some cases. It is preferable that the copper concentration at a surface of or inside the oxide semiconductor be lower. For example, the oxide semiconductor preferably includes a region in which the copper concentration is lower than or equal to $1\times10^{19}$ atoms/cm$^3$, lower than or equal to $5\times10^{18}$ atoms/cm$^3$, or lower than or equal to $1\times10^{18}$ atoms/cm$^3$.

<Structure of Oxide Semiconductor>

The structure of an oxide semiconductor is described below.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor is classified into a single crystal oxide semiconductor and a non-single-crystal oxide semiconductor. Examples of a non-single-crystal oxide semiconductor film include a c-axis aligned crystalline oxide semiconductor (CAAC-OS) film, a polycrystalline oxide semiconductor film, a nanocrystalline oxide semiconductor (nc-OS) film, an amorphous-like oxide semiconductor (a-like OS) film, and an amorphous oxide semiconductor film.

From another perspective, an oxide semiconductor is classified into an amorphous oxide semiconductor and a crystalline oxide semiconductor. In addition, examples of a crystalline oxide semiconductor include a single crystal oxide semiconductor, a CAAC-OS, a polycrystalline oxide semiconductor, a microcrystalline oxide semiconductor, and a nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor film cannot be regarded as a completely amorphous oxide semiconductor film. Moreover, an oxide semiconductor film that is not isotropic (e.g., an oxide semiconductor film that has a periodic structure in a microscopic region) cannot be regarded as a completely amorphous oxide semiconductor film. Note that an a-like OS film has a periodic structure in a microscopic region, but at the same time has a void and has an unstable structure. For this reason, an a-like OS film has physical properties similar to those of an amorphous oxide semiconductor film.

<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 34A:
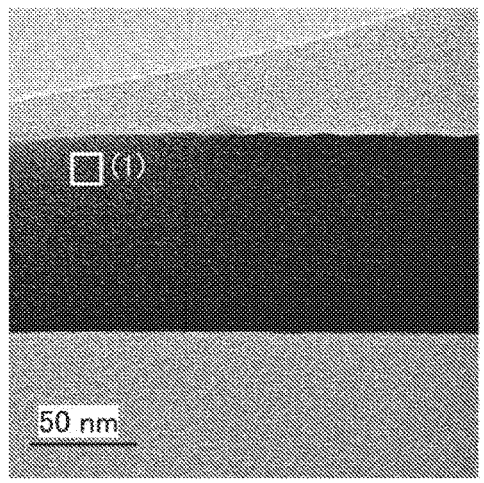
FIGS. 34A to 34D are Cs-corrected high-resolution TEM images of a cross section of a CAAC-OS and a cross-sectional schematic view of a CAAC-OS.

The CAAC-OS observed with a TEM is described below. FIG. 34A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. Note that the Cs-corrected high-resolution TEM image can be obtained with, for example, an atomic resolution analytical electron microscope JEM-ARM200F manufactured by JEOL Ltd.

Figure 34B:
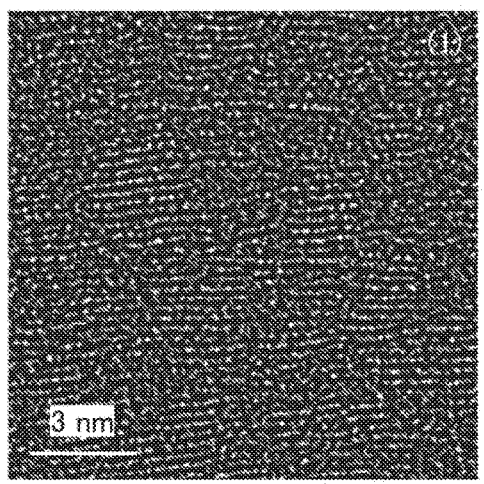

FIG. 34B is an enlarged Cs-corrected high-resolution TEM image of a region (1) in FIG. 34A. FIG. 34B shows that metal atoms are arranged in a layered manner in a pellet. Each metal atom layer has a configuration reflecting unevenness of a surface over which a CAAC-OS film is formed (hereinafter, the surface is referred to as a formation surface) or a top surface of the CAAC-OS, and is arranged parallel to the formation surface or the top surface of the CAAC-OS.

Figure 34C:
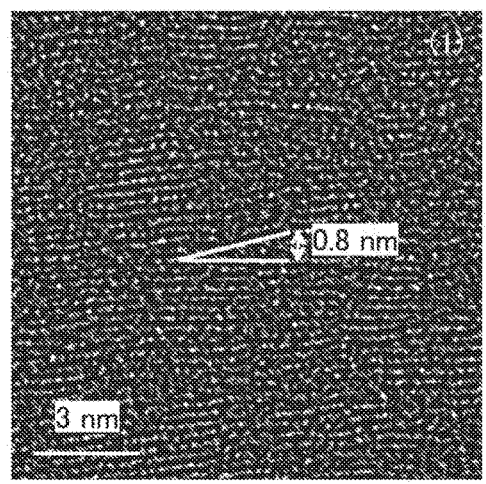

As shown in FIG. 34B, the CAAC-OS has a characteristic atomic arrangement. The characteristic atomic arrangement is denoted by an auxiliary line in FIG. 34C. FIGS. 34B and 34C prove that the size of a pellet is approximately 1 nm to 3 nm, and the size of a space caused by tilt of the pellets is approximately 0.8 nm. Therefore, the pellet can also be referred to as a nanocrystal (nc). Note that a CAAC-OS can be referred to as an oxide semiconductor including c-axis aligned nanocrystals (CANC).

Figure 34D:
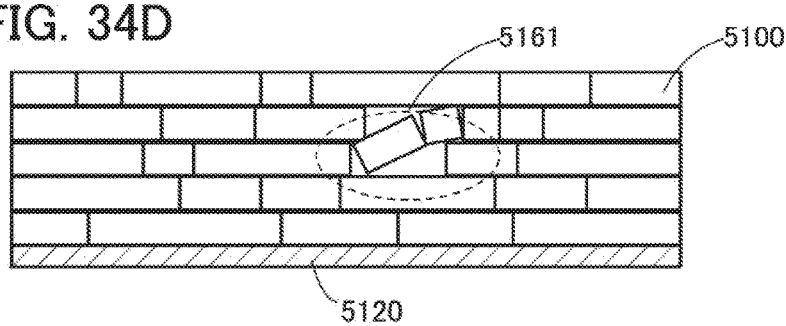

Here, according to the Cs-corrected high-resolution TEM images, the schematic arrangement of pellets 5100 of a CAAC-OS over a substrate 5120 is illustrated by such a structure in which bricks or blocks are stacked (see FIG. 34D). The part in which the pellets are tilted as observed in FIG. 34C corresponds to a region 5161 shown in FIG. 34D.

Figure 35A:
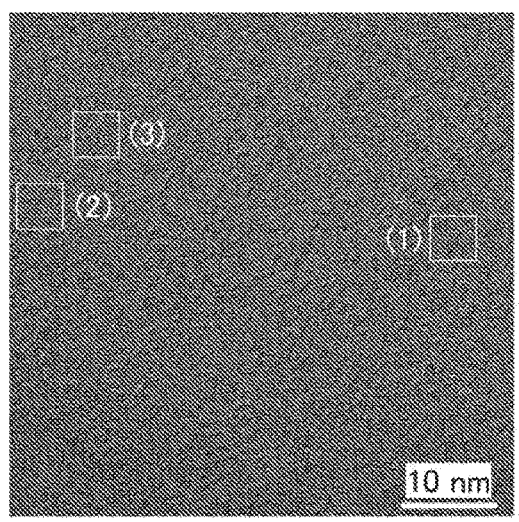
FIGS. 35A to 35D are Cs-corrected high-resolution TEM images of a plane of a CAAC-OS.
Figure 35B:
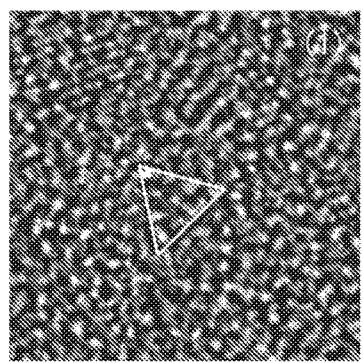
Figure 35C:
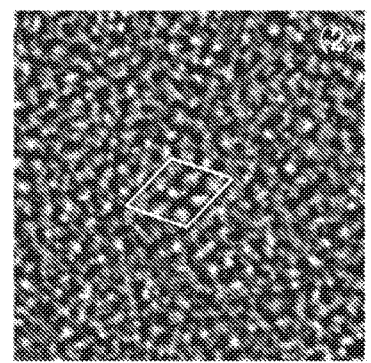
Figure 35D:
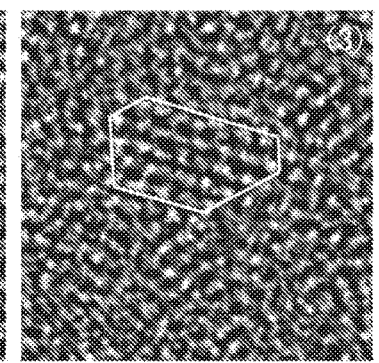

FIG. 35A shows a Cs-corrected high-resolution TEM image of a plane of the CAAC-OS observed from a direction substantially perpendicular to the sample surface. FIGS. 35B, 35C, and 35D are enlarged Cs-corrected high-resolution TEM images of regions (1), (2), and (3) in FIG. 35A, respectively. FIGS. 35B, 35C, and 35D indicate that metal atoms are arranged in a triangular, quadrangular, or hexagonal configuration in a pellet. However, there is no regularity of arrangement of metal atoms between different pellets.

Figure 36A:
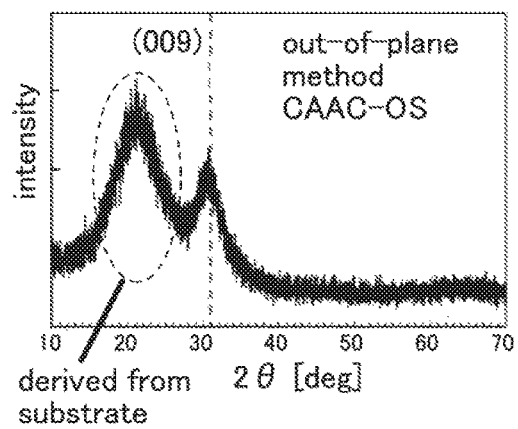
FIGS. 36A to 36C show structural analysis by XRD of a CAAC-OS and a single crystal oxide semiconductor.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle ($2\theta$) of around 31° as shown in FIG. 36A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when $2\theta$ is around 36°, in addition to the peak at $2\theta$ of around 31°. The peak of $2\theta$ at around 36° indicates that a crystal having no c-axis alignment is included in part of the CAAC-OS. It is preferable that in the CAAC-OS analyzed by an out-of-plane method, a peak appear when $2\theta$ is around 31° and that a peak not appear when $2\theta$ is around 36°.

Figure 36B:
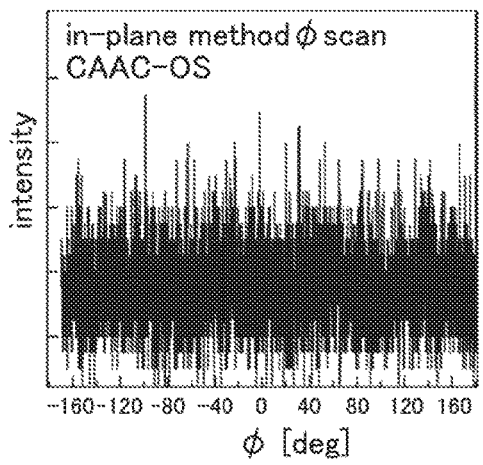
Figure 36C:
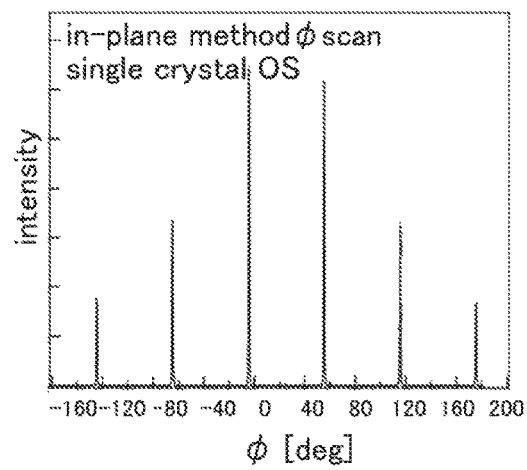

On the other hand, in structural analysis of the CAAC-OS by an in-plane method in which an X-ray is incident on a sample in a direction substantially perpendicular to the c-axis, a peak appears when $2\theta$ is around 56°. This peak is derived from the (110) plane of the $InGaZnO_4$ crystal. In the case of the CAAC-OS, when analysis ($\phi$ scan) is performed with $2\theta$ fixed at around 56° and with the sample rotated using a normal vector of the sample surface as an axis ($\phi$ axis), as shown in FIG. 36B, a peak is not clearly observed. In contrast, in the case of a single crystal oxide semiconductor of $InGaZnO_4$, when $\phi$ scan is performed with $2\theta$ fixed at around 56°, as shown in FIG. 36C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 49A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 49B shows a diffraction pattern obtained in such a manner that an electron beam with a probe diameter of 300 nm is incident on the same sample in a direction perpendicular to the sample surface. As in FIG. 49B, a ring-like diffraction pattern is observed. Thus, the electron diffraction also indicates that the a-axes and b-axes of the pellets included in the CAAC-OS do not have regular alignment. The first ring in FIG. 49B is considered to be derived from the (010) plane, the (100) plane, and the like of the InGaZnO$_4$ crystal. The second ring in FIG. 49B is considered to be derived from the (110) plane and the like.

As described above, the CAAC-OS is an oxide semiconductor with high crystallinity. Entry of impurities, formation of defects, or the like might decrease the crystallinity of an oxide semiconductor film. This means that the CAAC-OS film has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancy in the oxide semiconductor serves as a carrier trap or serves as a carrier generation source when hydrogen is captured therein.

The CAAC-OS film having small numbers of impurities and oxygen vacancies is an oxide semiconductor film with low carrier density (specifically, lower than $8\times10^{11}$/cm$^3$, preferably lower than $1\times10^{11}$/cm$^3$, further preferably lower than $1\times10^{10}$/cm$^3$, and is higher than or equal to $1\times10^{-9}$/cm$^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor film having stable characteristics.

<nc-OS>

Next, an nc-OS is described.

An nc-OS film has a region in which a crystal part is observed and a region in which a crystal part is not clearly observed in a high-resolution TEM image. In most cases, the size of a crystal part included in the nc-OS film is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method. For example, when the nc-OS film is analyzed by an out-of-plane method using an X-ray beam having a diameter larger than the size of a pellet, a peak which shows a crystal plane does not appear. Furthermore, a diffraction pattern like a halo pattern is observed when the nc-OS film is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS layer, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS or an amorphous oxide semiconductor. Note that there is no regularity of crystal orientation between different pellets in the nc-OS. Therefore, the nc-OS has a higher density of defect states than the CAAC-OS.

<a-like OS Film>

Note that an a-like OS film has a structure intermediate between those of the nc-OS film and the amorphous oxide semiconductor film.

In a high-resolution TEM image of the a-like OS, a void may be observed. Furthermore, in the high-resolution. TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (sample A), an nc-OS (sample B), and a CAAC-OS (sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of the InGaZnO$_4$ crystal has a structure in which nine layers including three In—O layers and six Ga—Zn—O layers are stacked in the c-axis direction. Thus, the spacing between these adjacent layers is substantially equivalent to the lattice spacing (also referred to as d value) on the (009) plane, and is 0.29 nm according to crystal structure analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 50:
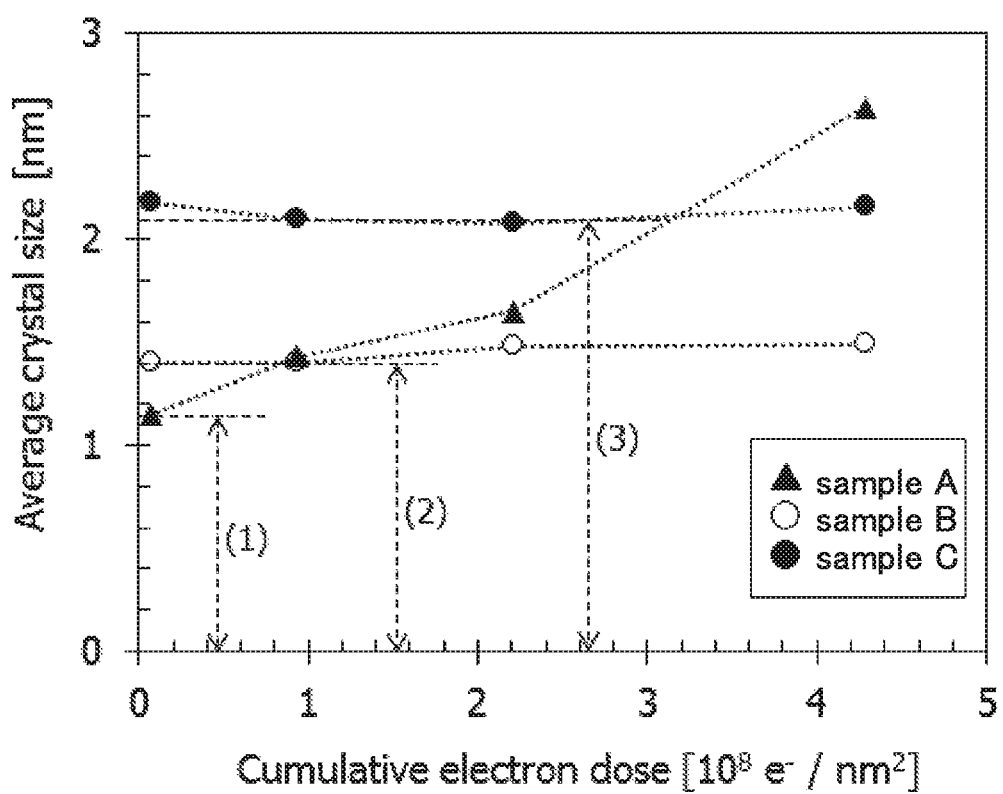
FIG. 50 shows a change in a crystal part of an In—Ga—Zn oxide induced by electron irradiation.

FIG. 50 shows change in the average size of crystal parts (at 22 points to 45 points) in each sample. Note that the crystal part size corresponds to the length of a lattice fringe. FIG. 50 indicates that the crystal part size in the a-like OS (sample A) increases with an increase in the cumulative electron dose. Specifically, as shown by (1) in FIG. 50, a crystal part of approximately 1.2 nm at the start of TEM observation (the crystal part is also referred to as an initial nucleus) grows to a size of approximately 2.6 nm at a cumulative electron dose of 4.2×10$^8$ e$^-$/nm$^2$. In contrast, the crystal part size in the nc-OS (sample B) and the CAAC-OS (sample C) shows little change from the start of electron irradiation to a cumulative electron dose of 4.2×10$^8$ e$^-$/nm$^2$. Specifically, as shown by (2) and (3) in FIG. 50, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that single crystals with the same composition do not exist in some cases. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor film, an a-like OS film, an nc-OS film, and a CAAC-OS film, for example.

<Deposition Model>

Examples of deposition models of a CAAC-OS film and an nc-OS film are described below.

Figure 39A:
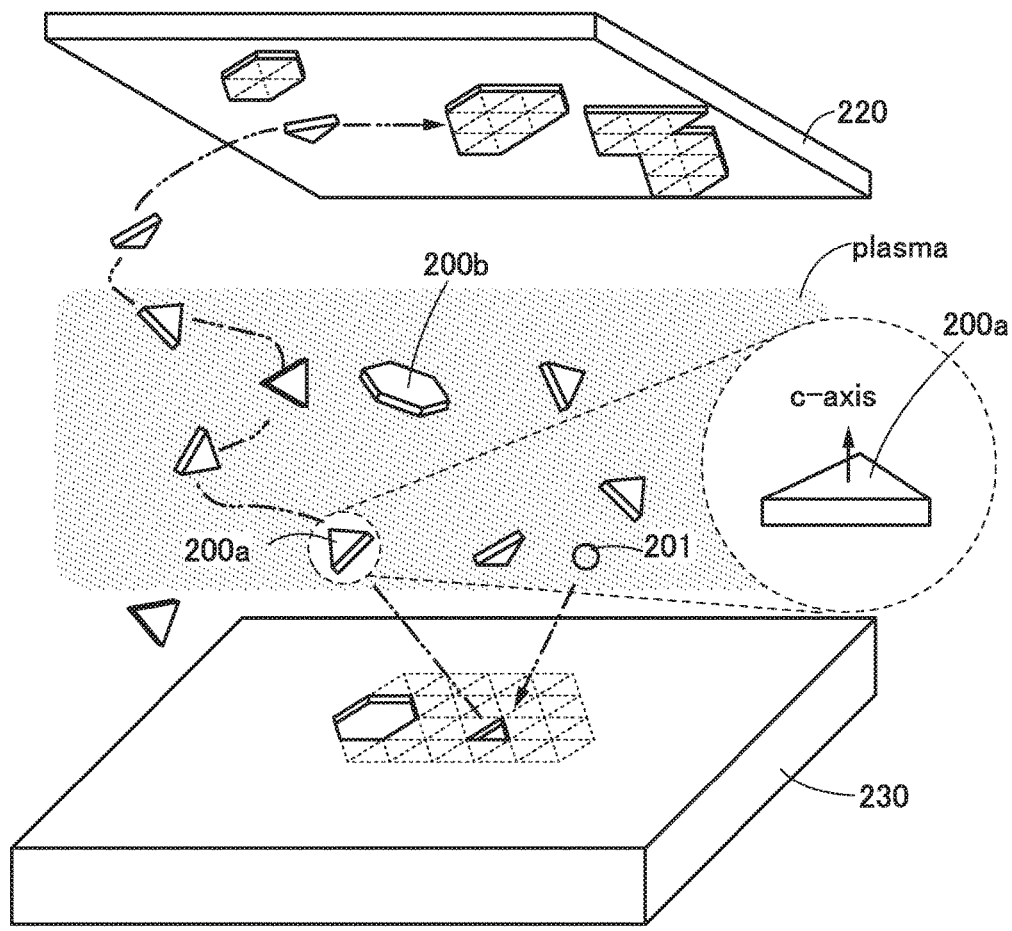
FIG. 39A illustrates a deposition model of a CAAC-OS schematically and a pellet.

FIG. 39A is a schematic view of the inside of a deposition chamber where a CAAC-OS film is deposited by a sputtering method.

A target 230 is attached to a backing plate. Under the target 230 and the backing plate, a plurality of magnets are provided. The plurality of magnets cause a magnetic field over the target 230. A sputtering method in which the disposition speed is increased by utilizing a magnetic field of magnets is referred to as a magnetron sputtering method.

The target 230 has a polycrystalline structure in which a cleavage plane exists in at least one crystal grain. Note that the details of the cleavage plane are described later.

A substrate 220 is placed to face the target 230, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 50 vol % or higher) and controlled to higher than or equal to 0.01 Pa and lower than or equal to 100 Pa, preferably higher than or equal to 0.1 Pa and lower than or equal to 10 Pa. Here, discharge starts by application of a voltage at a constant value or higher to the target 230, and plasma is observed. Note that the magnetic field over the target 230 forms a high-density plasma region. In the high-density plasma region, the deposition gas is ionized, so that an ion 201 is generated. Examples of the ion 201 include an oxygen cation (O$^+$) and an argon cation (Ar$^+$).

The ion 201 is accelerated toward the target 230 side by an electric field, and collides with the target 230 eventually. At this time, a pellet 200a and a pellet 200b which are flat-plate-like (pellet-like) sputtered particles are separated and sputtered from the cleavage plane. Note that structures of the pellet 200a and the pellet 200b may be distorted by an impact of collision of the ion 201.

The pellet 200a is a flat-plate-like (pellet-like) sputtered particle having a triangle plane, e.g., regular triangle plane. The pellet 200b is a flat-plate-like (pellet-like) sputtered particle having a hexagon plane, e.g., regular hexagon plane. Note that a flat-plate-like (pellet-like) sputtered particle such as the pellet 200a and the pellet 200b is collectively called a pellet 200. The shape of a flat plane of the pellet 200 is not limited to a triangle or a hexagon. For example, the flat plane may have a shape formed by combining greater than or equal to 2 and less than or equal to 6 triangles. For example, a square (rhombus) is formed by combining two triangles (regular triangles) in some cases.

The thickness of the pellet 200 is determined depending on the kind of deposition gas and the like. The thicknesses of the pellets 200 are preferably uniform; the reasons thereof are described later. In addition, the sputtered particle preferably has a pellet shape with a small thickness as compared to a dice shape with a large thickness.

Figure 41:
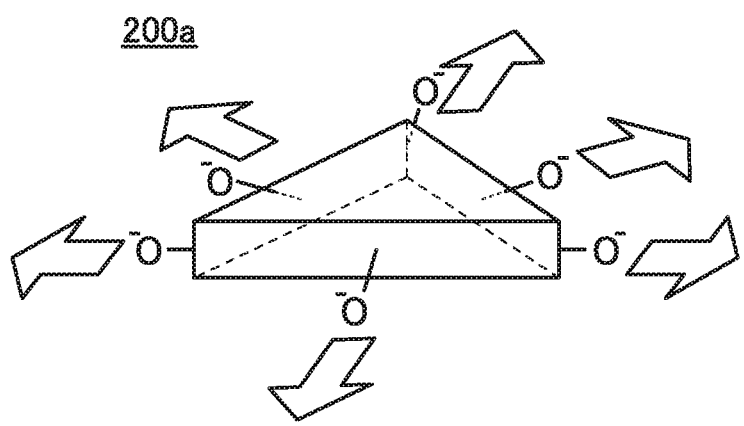
FIG. 41 illustrates a pellet.

The pellet 200 receives a charge when passing through the plasma, so that side surfaces thereof are negatively or positively charged in some cases. The pellet 200 includes an oxygen atom on its side surface, and the oxygen atom may be negatively charged. For example, a case in which the pellet 200a includes, on its side surfaces, oxygen atoms that are negatively charged is illustrated in FIG. 41. As in this view, when the side surfaces are charged in the same polarity, charges repel each other, and accordingly, the pellet 200a can maintain a flat-plate shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged.

Figure 42:
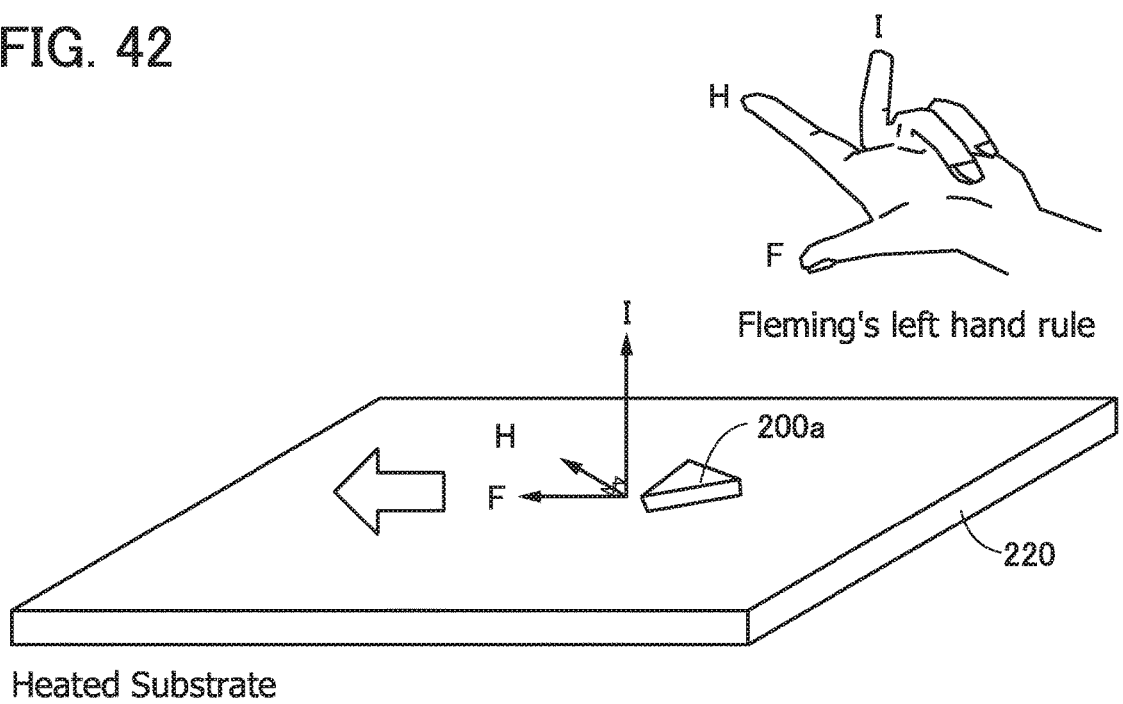
FIG. 42 illustrates force applied to a pellet on a formation surface.

As illustrated in FIG. 39A, the pellet 200 flies like a kite in plasma and flutters up to the substrate 220. Since the pellets 200 are charged, when the pellet 200 gets close to a region where another pellet 200 has already been deposited, repulsion is generated. Here, above the substrate 220, a magnetic field is generated in a direction parallel to a top surface of the substrate 220. A potential difference is given between the substrate 220 and the target 230, and accordingly, current flows from the substrate 220 toward the target 230. Thus, the pellet 200 is given a force (Lorentz force) on the top surface of the substrate 220 by an effect of the magnetic field and the current (see FIG. 42). This is explainable with Fleming's left-hand rule. In order to increase a force applied to the pellet 200, it is preferable to provide, on the top surface, a region where the magnetic field in a direction parallel to the top surface of the substrate 220 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 220 is 1.5 times or higher, preferably twice or higher, further preferably 3 times or higher, still further preferably 5 times or higher as high as the magnetic field in a direction perpendicular to the top surface of the substrate 220.

Figure 43A:
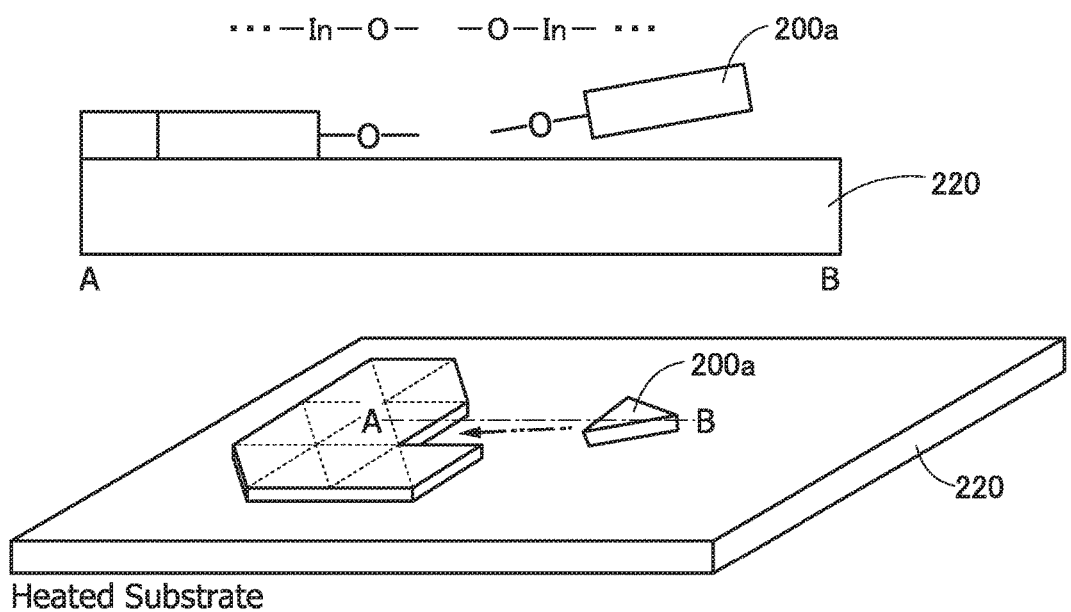
FIGS. 43A and 43B illustrate movement of a pellet on a formation surface.
Figure 43B:
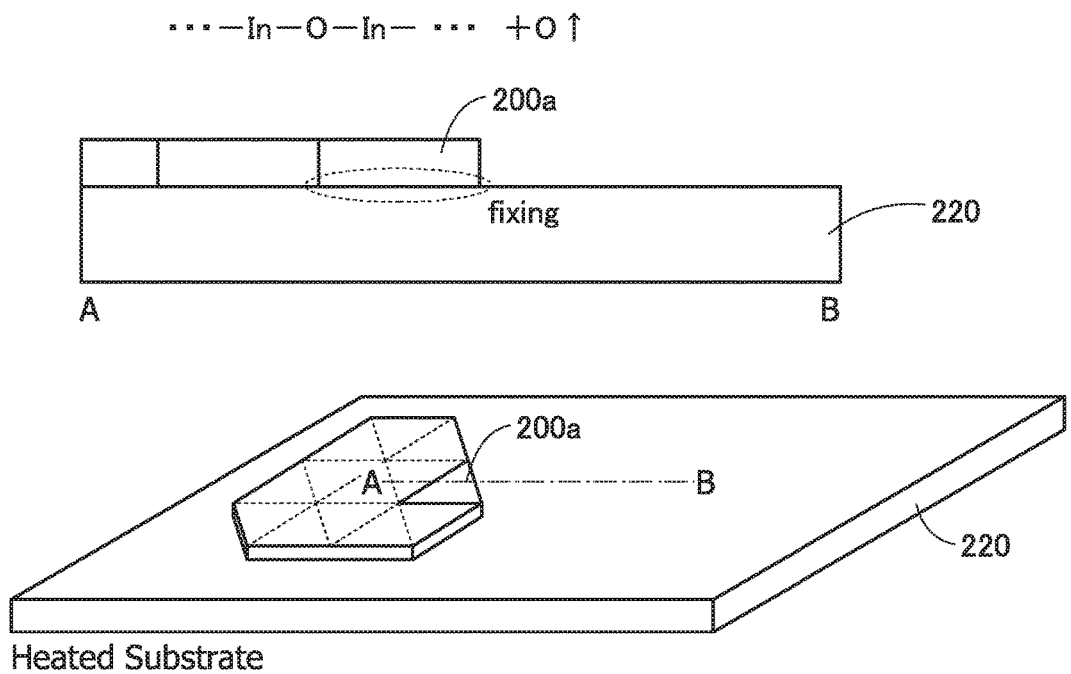

Further, the substrate 220 is heated, and the resistance such as friction between the pellet 200 and the substrate 220 is low. As a result, as illustrated in FIG. 43A, the pellet 200 glides above the surface of the substrate 220. The glide of the pellet 200 is caused in a state where the flat plane faces the substrate 220. Then, as illustrated in FIG. 43B, when the pellet 200 reaches the side surface of another pellet 200 that has been already deposited, the side surfaces of the pellets 200 are bonded. At this time, the oxygen atom on the side surface of the pellet 200 is released. With the released oxygen atom, oxygen vacancies in a CAAC-OS is filled in some cases; thus, the CAAC-OS has a low density of defect states.

Further, the pellet 200 is heated on the substrate 220, whereby atoms are rearranged, and the structure distortion caused by the collision of the ion 201 can be reduced. The pellet 200 whose structure distortion is reduced is substantially single crystal. Even when the pellets 200 are heated after being bonded, expansion and contraction of the pellet 200 itself hardly occurs, which is caused by turning the pellet 200 to be substantially single crystal. Thus, formation of defects such as a grain boundary due to expansion of a space between the pellets 200 can be prevented, and accordingly, generation of crevasses can be prevented. Further, the space is filled with elastic metal atoms and the like, whereby the elastic metal atoms have a function, like a highway, of jointing side surfaces of the pellets 200 which are not aligned with each other.

It is considered that as shown in such a model, the pellets 200 are deposited on the substrate 220. Thus, a CAAC-OS film can be deposited even when a surface over which a film is formed (film formation surface) does not have a crystal structure, which is different from film deposition by epitaxial growth. For example, even when a surface (film formation surface) of the substrate 220 has an amorphous structure, a CAAC-OS film can be formed.

Figure 39B:
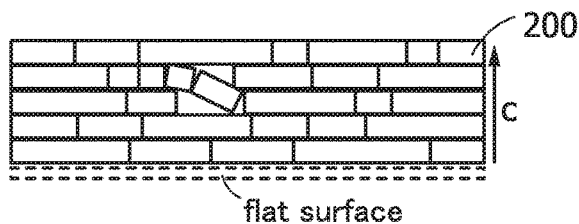
FIGS. 39B and 39C illustrate cross-sectional views of a CAAC-OS.

Further, it is found that in formation of the CAAC-OS, the pellets 200 are arranged in accordance with a surface shape of the substrate 220 that is the film formation surface even when the film formation surface has unevenness besides a flat surface. For example, in the case where the surface of the substrate 220 is flat at the atomic level, the pellets 200 are arranged so that flat planes parallel to the a-b plane face downwards; thus, a layer with a uniform thickness, flatness, and high crystallinity is formed. By stacking n layers (n is a natural number), the CAAC-OS can be obtained (see FIG. 39B).

Figure 39C:
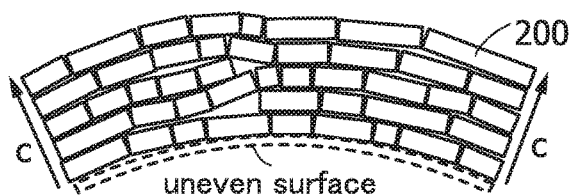

In the case where the surface of the substrate 220 has unevenness, a CAAC-OS film in which n layers (n is a natural number) in each of which the pellets 200 are arranged along the unevenness surface are stacked is formed. Since the substrate 220 has unevenness, a gap is easily generated between in the pellets 200 in the CAAC-OS in some cases. Note that owing to intermolecular force, the pellets 200 are arranged so that a gap between the pellets is as small as possible even on the unevenness surface. Therefore, even when the film formation surface has unevenness, a CAAC-OS film with high crystallinity can be formed (see FIG. 39C).

As a result, laser crystallization is not needed for formation of a CAAC-OS, and a uniform film can be formed even over a large-sized glass substrate.

Since the CAAC-OS film is deposited in accordance with such a model, the sputtered particle preferably has a pellet shape with a small thickness. Note that when the sputtered particles has a dice shape with a large thickness, planes facing the substrate 220 vary, which may lead to formation of a film whose thickness or crystal alignment is not uniformed.

According to the deposition model described above, a CAAC-OS with high crystallinity can be formed even on a film formation surface with an amorphous structure.

Further, formation of a CAAC-OS can be described with a deposition model including a zinc oxide particle besides the pellet 200.

The zinc oxide particle reaches the substrate 220 before the pellet 200 does because the zinc oxide particle is smaller than the pellet 200 in mass. On the surface of the substrate 220, crystal growth of the zinc oxide particle preferentially occurs in the horizontal direction, so that a thin zinc oxide layer is formed. The zinc oxide layer has c-axis alignment. Note that c-axes of crystals in the zinc oxide layer are aligned in the direction parallel to a normal vector of the substrate 220. The zinc oxide layer serves as a seed layer that makes a CAAC-OS grow and thus has a function of increasing crystallinity of the CAAC-OS. The thickness of the zinc oxide layer is greater than or equal to 0.1 nm and less than or equal to 5 nm, mostly greater than or equal to 1 nm and less than or equal to 3 nm. Since the zinc oxide layer is sufficiently thin, a grain boundary is hardly observed.

Thus, in order to deposit a CAAC-OS with high crystallinity, a target containing zinc at a proportion higher than that of the stoichiometric composition is preferably used.

Figure 40:
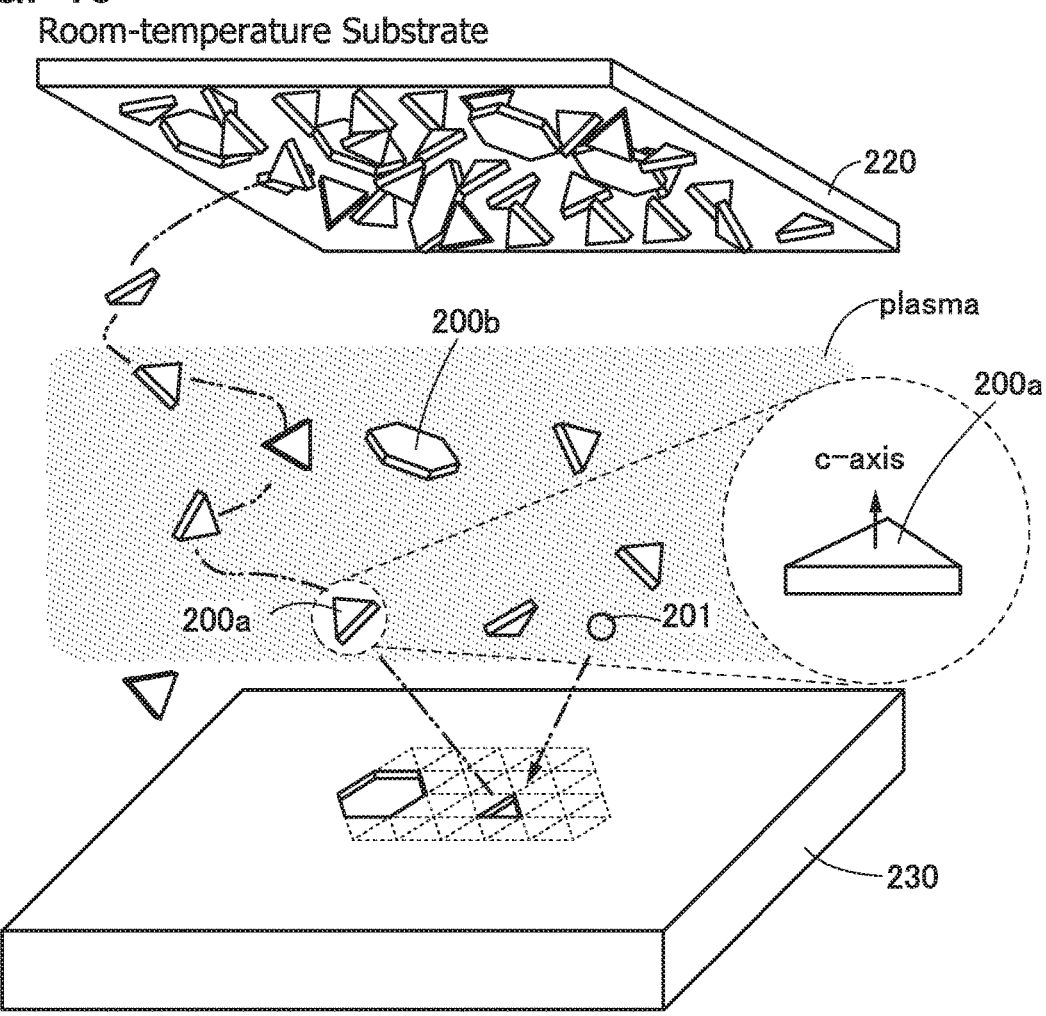
FIG. 40 illustrates a deposition model of an nc-OS schematically and a pellet.

An nc-OS can be understood with a deposition model illustrated in FIG. 40. Note that a difference between FIG. 40 and FIG. 39A lies only in the fact that whether the substrate 220 is heated or not.

Thus, the substrate 220 is not heated, and a resistance such as friction between the pellet 200 and the substrate 220 is high. As a result, the pellets 200 cannot glide on the surface of the substrate 220 and are stacked randomly, thereby forming a nc-OS.

<Cleavage Plane>

A cleavage plane that has been mentioned in the deposition model of the CAAC-OS will be described below.

Figure 44A:
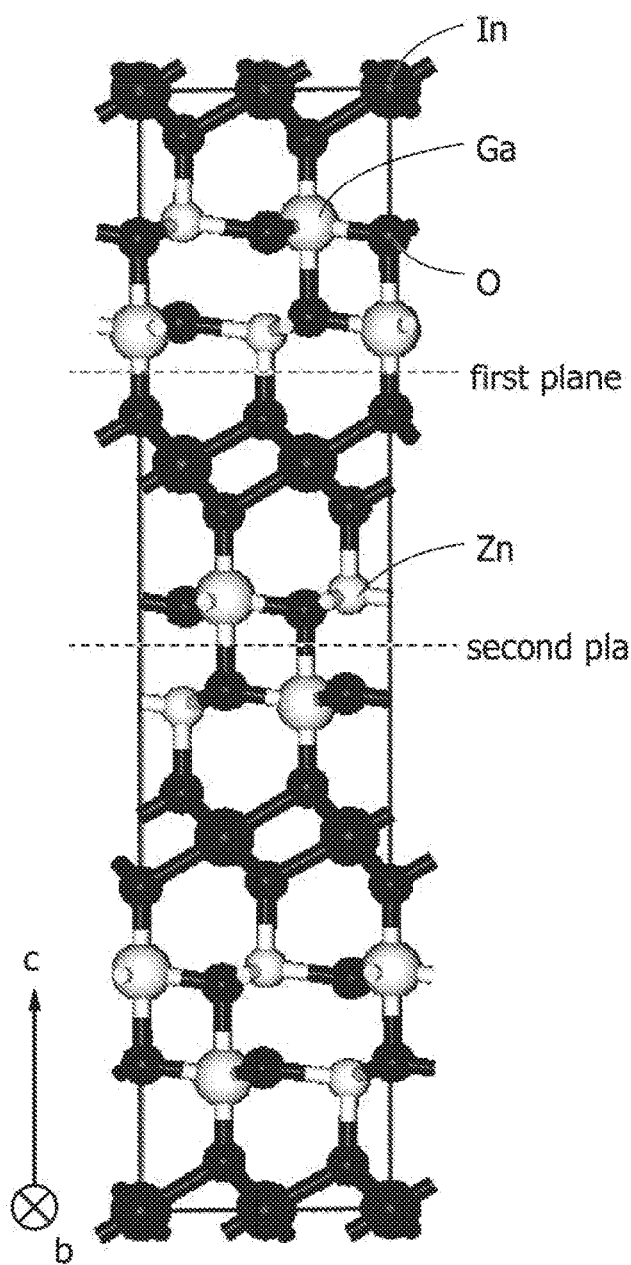
FIGS. 44A and 44B show an $InGaZnO_4$ crystal.
Figure 44B:
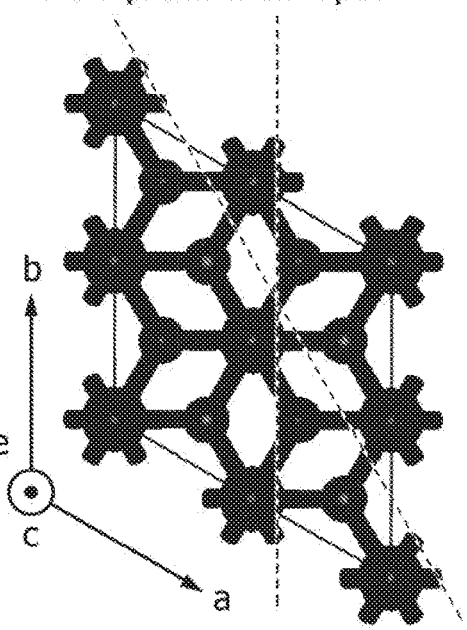

First, a cleavage plane of the target is described using FIGS. 44A and 44B. FIGS. 44A and 44B show a structure of an InGaZnO$_4$ crystal. Note that FIG. 44A shows a structure in the case where the InGaZnO$_4$ crystal is observed from a direction parallel to the b-axis when the c-axis is in an upward direction. Further, FIG. 44B shows a structure of the case where the InGaZnO$_4$ crystal is observed from a direction parallel to the c-axis.

Energy needed for cleavage at each of crystal planes of the InGaZnO$_4$ crystal is calculated by the first principles calculation. Note that a "pseudopotential" and density functional theory program (CASTEP) using the plane wave basis are used for the calculation. Note that an ultrasoft type pseudopotential is used as the pseudopotential. Further, GGA/PBE is used as the functional. Cut-off energy is 400 eV.

Energy of a structure in an initial state is obtained after structural optimization including a cell size is performed. Further, energy of a structure after the cleavage at each plane is obtained after structural optimization of atomic arrangement is performed in a state where the cell size is fixed.

On the basis of the structure of the InGaZnO$_4$ crystal in FIGS. 44A and 44B, a structure cleaved at any one of a first plane, a second plane, a third plane, and a fourth plane is formed and subjected to structural optimization calculation in which the cell size is fixed. Here, the first plane is a crystal plane between a Ga—Zn—O layer and an In—O layer and is parallel to the (001) plane (or the a-b plane) (see FIG. 44A). The second plane is a crystal plane between a Ga—Zn—O layer and a Ga—Zn—O layer and is parallel to the (001) plane (or the a-b plane) (see FIG. 44A). The fourth plane is a crystal plane parallel to the (100) plane (or the b-c plane) (see FIG. 44B).

Under the above conditions, the energy of the structure at each plane after the cleavage is calculated. Next, a difference between the energy of the structure after the cleavage and the energy of the structure in the initial state is divided by the area of the cleavage plane; thus, cleavage energy which serves as a measure of easiness of cleavage at each plane is calculated. Note that the energy of a structure indicates energy obtained in such a manner that electronic kinetic energy of electrons included in the structure and interactions between atoms included in the structure, between the atom and the electron, and between the electrons are considered.

As calculation results, the cleavage energy of the first plane is 2.60 J/m$^2$, that of the second plane is 0.68 J/m$^2$, that of the third plane is 2.18 J/m$^2$, and that of the fourth plane is 2.12 J/m$^2$ (see Table 1).

TABLE 1

| | cleavage energy [J/m$^2$] |
|---|---|
| first plane | 2.60 |
| second plane | 0.68 |
| third plane | 2.18 |
| fourth plane | 2.12 |

From the calculations, in the structure of the InGaZnO$_4$ crystal shown in FIGS. 44A and 44B, the cleavage energy at the second plane is the lowest. In other words, a plane between a Ga—Zn—O layer and a Ga—Zn—O layer is cleaved most easily (cleavage plane). Therefore, in this specification, the cleavage plane indicates the second plane, which is a plane where cleavage is performed most easily.

Since the cleavage plane is the second plane between a Ga—Zn—O layer and a Ga—Zn—O layer, the InGaZnO$_4$ crystals shown in FIG. 44A can be separated at two planes equivalent to the second planes. Therefore, in the case where an ion or the like is made to collide with a target, a wafer-like unit (we call this a pellet) which is cleaved at a plane with the lowest cleavage energy is thought to be blasted off as the minimum unit. In that case, a pellet of InGaZnO$_4$ includes three layers: a Ga—Zn—O layer, an In—O layer, and a Ga—Zn—O layer.

The cleavage energies of the third plane (crystal plane parallel to the (110) plane) and the fourth plane (crystal plane parallel to the (100) plane (or the b-c plane)) are lower than that of the first plane (crystal plane between the Ga—Zn—O layer and the In—O layer and plane that is parallel to the (001) plane (or the a-b plane)), which suggests that most of the flat planes of the pellets have triangle shapes or hexagonal shapes.

Figure 45A:
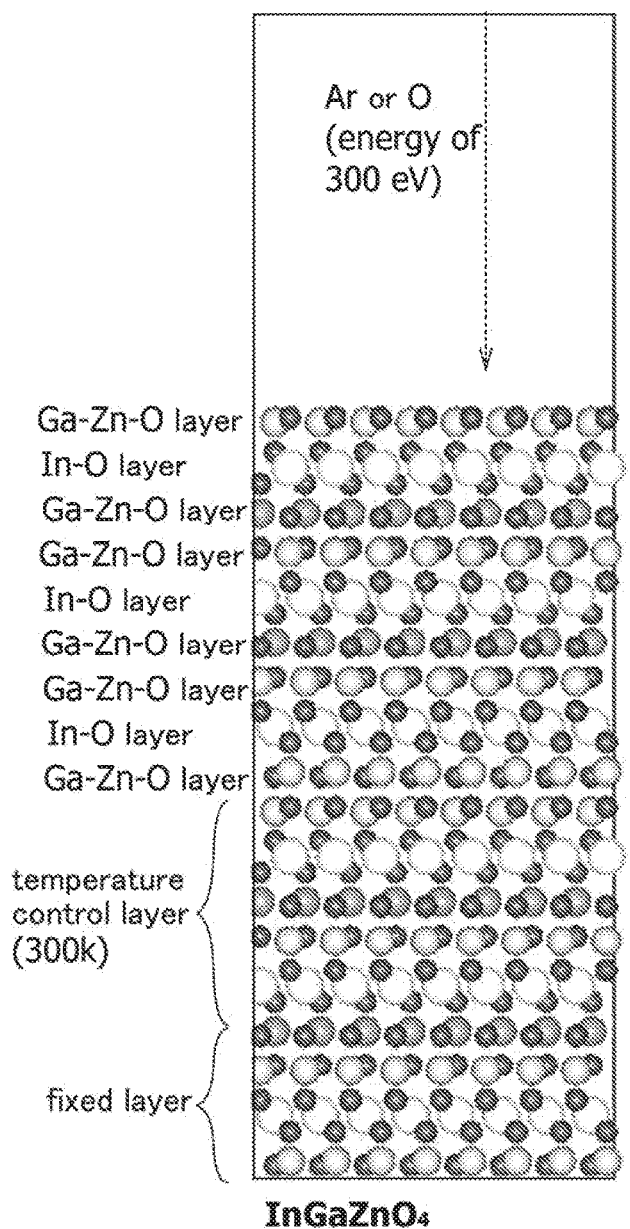
FIGS. 45A and 45B illustrate a structure of $InGaZnO_4$ and the like before an atom collides.
Figure 45B:
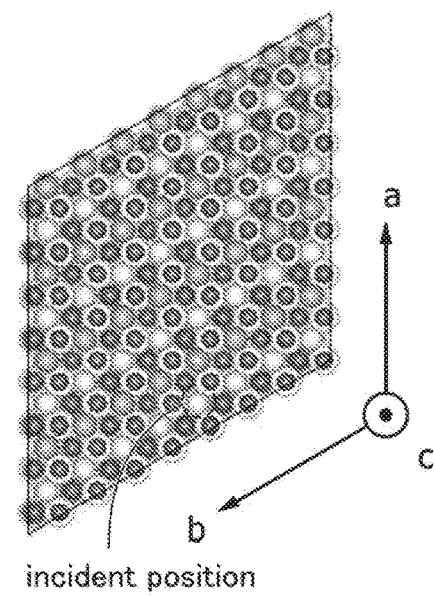

Next, through classical molecular dynamics calculation, on the assumption of an InGaZnO$_4$ crystal having a homologous structure as a target, a cleavage plane in the case where the target is sputtered using argon (Ar) or oxygen (O) is examined. FIG. 45A shows a cross-sectional structure of an InGaZnO$_4$ crystal (2688 atoms) used for the calculation, and FIG. 45B shows a top structure thereof. Note that a fixed layer in FIG. 45A is a layer which prevents the positions of the atoms from moving. A temperature control layer in FIG. 45A is a layer whose temperature is constantly set to a fixed temperature (300 K).

For the classical molecular dynamics calculation, Materials Explorer 5.0 manufactured by Fujitsu Limited. is used. Note that the initial temperature, the cell size, the time step size, and the number of steps are set to be 300 K, a certain size, 0.01 fs, and ten million, respectively. In calculation, an atom to which an energy of 300 eV is applied is made to enter a cell from a direction perpendicular to the a-b plane of the InGaZnO$_4$ crystal under the conditions.

Figure 46A:
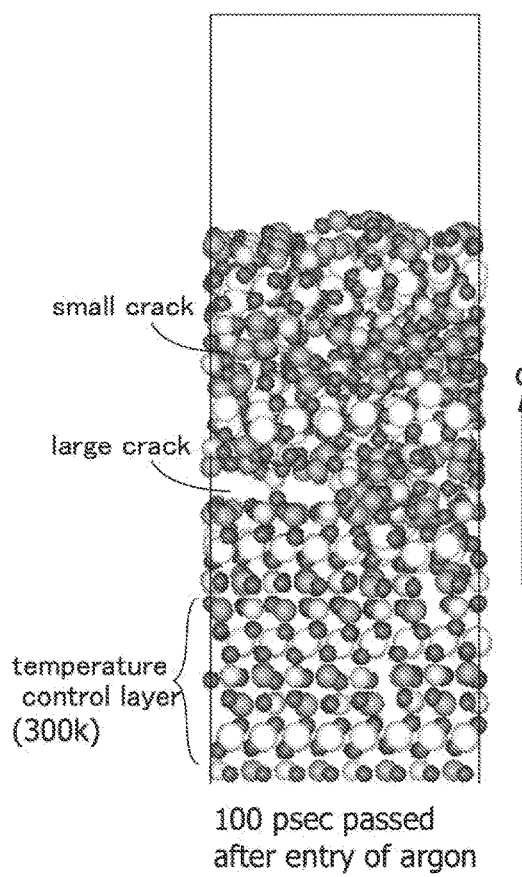
FIGS. 46A and 46B show a structure of $InGaZnO_4$ and the like after collision of an atom.
Figure 46B:
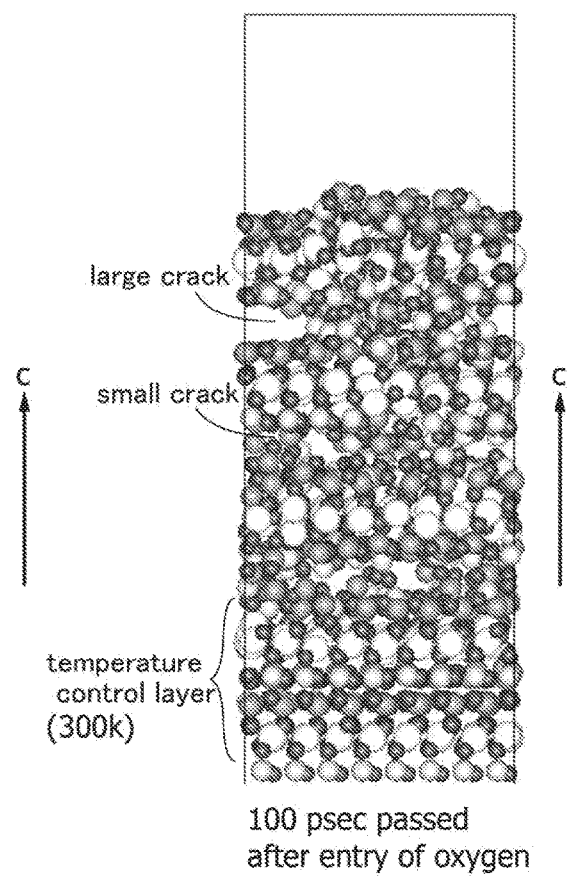

FIG. 46A shows atomic order when 99.9 picoseconds have passed after argon enters the cell including the InGaZnO$_4$ crystal in FIGS. 45A and 45B. FIG. 46B shows an atomic arrangement when 99.9 picoseconds have passed after oxygen enters the cell. Note that in FIGS. 46A and 46B, part of the fixed layer in FIG. 45A is omitted.

According to FIG. 46A, in a period from entry of argon into the cell to when 99.9 picoseconds have passed, a crack is formed from the cleavage plane corresponding to the second plane shown in FIG. 44A. Thus, in the case where argon collides with the InGaZnO$_4$ crystal and the uppermost surface is the second plane (the zero-th), a large crack is found to be formed in the second plane (the second).

On the other hand, according to FIG. 46B, in a period from entry of oxygen into the cell to when 99.9 picoseconds have passed, a crack is found to be formed from the cleavage plane corresponding to the second plane in FIG. 44A. Note that in the case where oxygen collides with the cell, a large crack is found to be formed in the second plane (the first) of the InGaZnO$_4$ crystal.

Accordingly, it is found that an atom (ion) collides with a target including an. InGaZnO$_4$ crystal having a homologous structure from the upper surface of the target, the InGaZnO$_4$ crystal is cleaved along the second plane, and a flat-plate-like sputtered particle (pellet) is separated. It is also found that the pellet formed in the case where oxygen collides with the cell is smaller than that formed in the case where argon collides with the cell.

The above calculation suggests that the separated pellet includes a damaged region. In some cases, the damaged region included in the pellet can be repaired in such a manner that a defect caused by the damage reacts with oxygen.

Here, a difference in size of the pellet depending on atoms which are made to collide is studied.

Figure 47A:
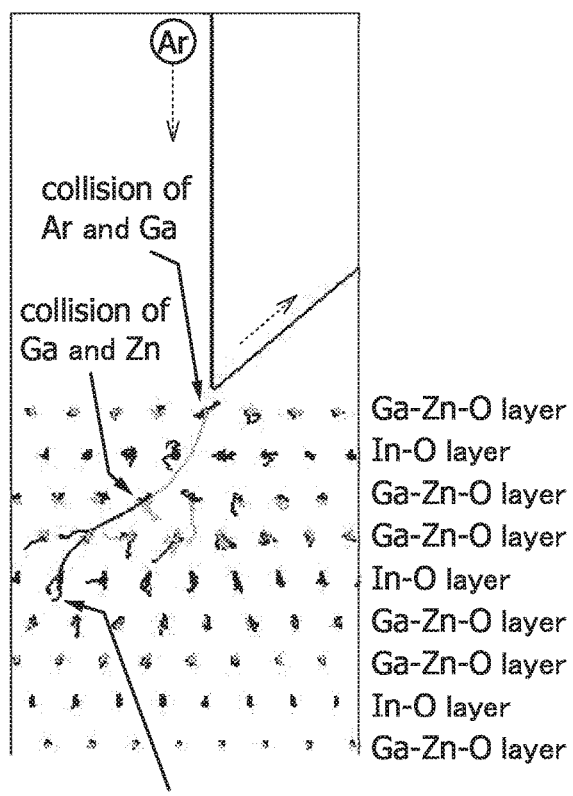
FIGS. 47A and 47B show trajectories of atoms after collision of atoms.

FIG. 47A shows trajectories of the atoms from 0 picosecond to 0.3 picoseconds after argon enters the cell including the InGaZnO$_4$ crystal shown in FIGS. 45A and 45B. Accordingly, FIG. 47A corresponds to a period from FIGS. 45A and 45B to FIG. 46A.

According to FIG. 47A, when argon collides with gallium (Ga) of the first layer (Ga—Zn—O layer), gallium collides with zinc (Zn) of the third layer (Ga—Zn—O layer) and then, zinc reaches the vicinity of the sixth layer (Ga—Zn—O layer). Note that the argon which collides with the gallium is sputtered to the outside. Accordingly, in the case where argon collides with the target including the InGaZnO$_4$ crystal, a crack is thought to be formed in the second plane (the second) in FIG. 45A.

Figure 47B:
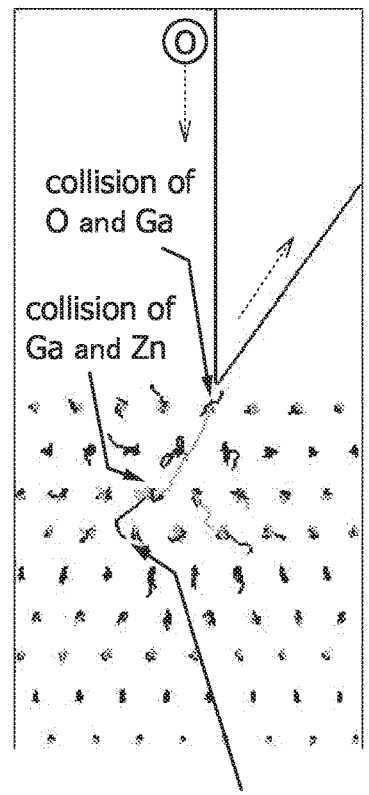

FIG. 47B shows trajectories of the atoms from 0 picosecond to 0.3 picoseconds after oxygen enters the cell including the InGaZnO$_4$ crystal shown in FIGS. 45A and 45B. Accordingly, FIG. 47B corresponds to a period from FIGS. 45A and 45B to FIG. 46A.

On the other hand, according to FIG. 47B, when oxygen collides with gallium (Ga) of the first layer (Ga—Zn—O layer) counted from the top, the gallium collides with zinc (Zn) of the third layer (Ga—Zn—O layer) counted from the top and then, the zinc does not reach the fifth layer (In—O layer) counted from the top. Note that the oxygen which collides with the gallium is sputtered to the outside. Accordingly, in the case where oxygen collides with the target including the InGaZnO$_4$ crystal, a crack is thought to be formed in the second plane (the first) in FIG. 45A.

This calculation also shows that the InGaZnO$_4$ crystal with which an atom (ion) collides is separated from the cleavage plane.

In addition, a difference in depth of a crack is examined in view of conservation laws. The energy conservation law and the law of conservation of momentum can be represented by the following formula (1) and the following formula (2). Here, E represents energy of argon or oxygen before collision (300 eV), m$_A$ represents mass of argon or oxygen, v$_A$ represents the speed of argon or oxygen before collision, v'$_A$ represents the speed of argon or oxygen after collision, m$_{Ga}$ represents mass of gallium, v$_{Ga}$ represents the speed of gallium before collision, and v'$_{Ga}$ represents the speed of gallium after collision.

$$E = \tfrac{1}{2} m_A v_A^2 + \tfrac{1}{2} m_{Ga} v_{Ga}^2 \tag{1}$$

$$m_A v_A + m_{Ga} v_{Ga} = m_A v'_A + m_{Ga} v'_{Ga} \tag{2}$$

On the assumption that collision of argon or oxygen is elastic collision, the relationship among v$_A$, v'$_A$, v$_{Ga}$, and v'$_{Ga}$ can be represented by the following formula (3).

$$v'_A - v'_{Ga} = -(v_A - v_{Ga}) \tag{3}$$

From the formulae (1), (2), and (3), when v$_{Ga}$ is 0, the speed of gallium v'$_{Ga}$ after collision of argon or oxygen can be represented by the following formula (4).

$$v'_{Ga} = \frac{\sqrt{m_A}}{m_A + m_{Ga}} \cdot 2\sqrt{2E} \tag{4}$$

In the formula (4), mass of argon or oxygen is substituted into m$_A$, whereby the speeds after collision of the atoms are compared. In the case where the argon and the oxygen have the same energy before collision, the speed of gallium in the case where argon collides with the gallium was found to be 1.24 times as high as that in the case where oxygen collides with the gallium. Thus, the energy of the gallium in the case where argon collides with the gallium is higher than that in the case where oxygen collides with the gallium by the square of the speed.

The speed (energy) of gallium after collision in the case where argon collides with the gallium is found to be higher than that in the case where oxygen collides with the gallium. Accordingly, it is considered that a crack is formed at a deeper position in the Case where argon collides with the gallium than in the case where oxygen collides with the gallium.

The above calculation shows that when sputtering is performed using a target including the InGaZnO$_4$ crystal having a homologous structure, separation occurs from the cleavage plane to form a pellet. On the other hand, even when sputtering is performed on a region having another structure of a target without the cleavage plane, a pellet is not formed, and a sputtered particle with an atomic-level size which is minute than a pellet is formed. Because the sputtered particle is smaller than the pellet, the sputtered particle is thought to be removed through a vacuum pump connected to a sputtering apparatus. Therefore, a model in which particles with a variety of sizes and shapes fly to a substrate and are deposited hardly applies to the case where sputtering is performed using a target including the InGaZnO$_4$ crystal having a homologous structure. The model illustrated in FIG. 39A where sputtered pellets are deposited to form a CAAC-OS is a reasonable model.

The CAAC-OS deposited in such a manner has a density substantially equal to that of a single crystal OS. For example, the density of the single crystal OS film having a homologous structure of InGaZnO$_4$ is 6.36 g/cm$^3$, and the density of the CAAC-OS film having substantially the same atomic ratio is approximately 6.3 g/cm$^3$.

Figure 48A:
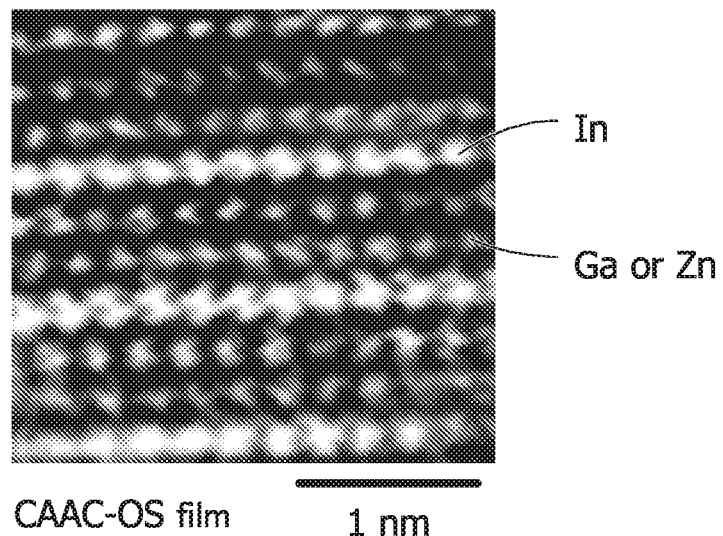
FIGS. 48A and 48B are cross-sectional. HAADF-STEM images of a CAAC-OS and a target.
Figure 48B:
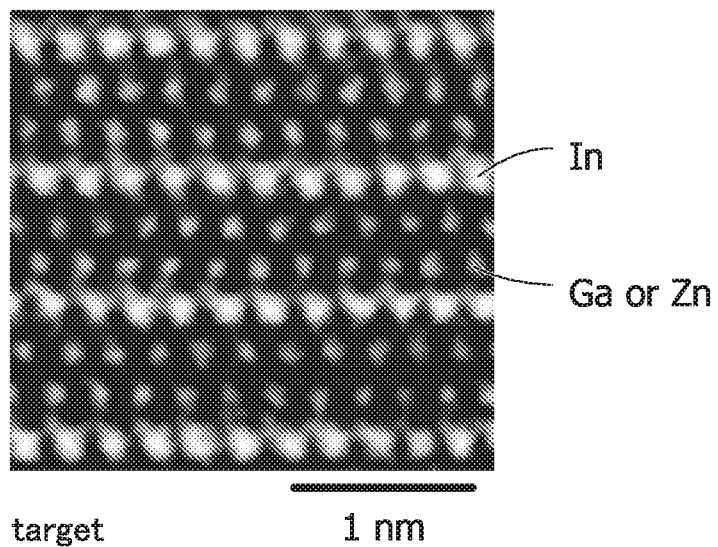

FIGS. 48A and 48B show atomic arrangements of cross sections of an In—Ga—Zn oxide film (see FIG. 48A) that is a CAAC-OS film deposited by a sputtering method and a target thereof (see FIG. 48B). For observation of atomic arrangement, a high-angle annular dark field scanning transmission electron microscopy (HAADF-STEM) is used. In the case of observation by HAADF-STEM, the intensity of an image of each atom is proportional to the square of its atomic number. Therefore, Zn (atomic number: 30) and Ga (atomic number: 31), whose atomic numbers are close to each other, are hardly distinguished from each other. A Hitachi scanning transmission electron microscope HD-2700 is used for the HAADF-STEM.

When FIG. 48A and FIG. 48B are compared, it is found that the CAAC-OS and the target each have a homologous structure and atomic order in the CAAC-OS correspond to that in the target. Thus, as illustrated in the deposition model in FIG. 39A, the crystal structure of the target is transferred, whereby a CAAC-OS is formed.

<Band Diagram>

Band diagrams in a given cross section of the above transistor are described below.

Figure 18A:
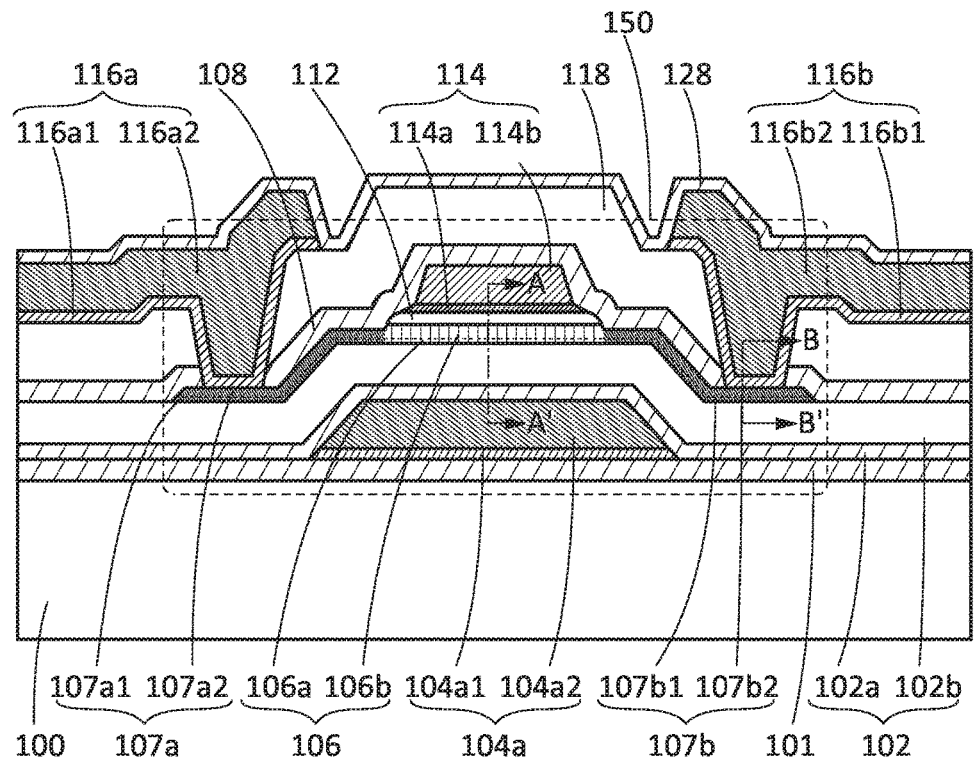
FIGS. 18A to 18C are a cross-sectional view and band diagrams of a transistor according to one embodiment of the present invention.

FIG. 18A is a cross-sectional view of the transistor 150 according to one embodiment of the present invention.

For the description of the transistor 150 illustrated in FIG. 18A, the description of FIG. 1 is referred to.

Figure 18B:
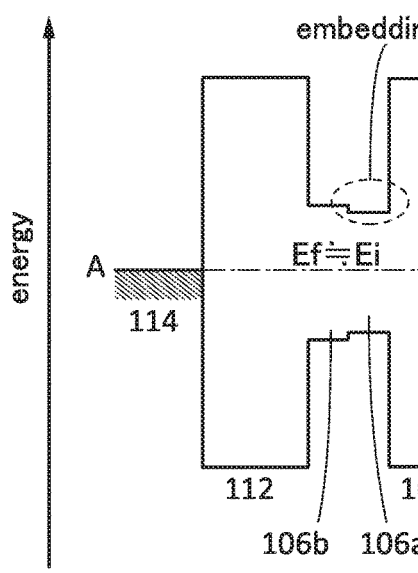

FIG. 18B is a band diagram in a cross section including a channel formation region of the transistor 150 along A-A' illustrated in FIG. 18A. The energy gap of the semiconductor 106a is slightly smaller than that of the semiconductor 106b. The energy gaps of the insulator 102a, the insulator 102b, and the insulator 112 are sufficiently larger than those of the semiconductor 106a and the semiconductor 106b. The Fermi levels (expressed as Ef) of the semiconductor 106a, the semiconductor 106b, the insulator 102a, the insulator 102b, and the insulator 112 are each positioned at an intrinsic Fermi level (expressed as Ei). Work functions of the conductor 104a and the conductor 114 are the same as an energy gap between the vacuum level and the Fermi level.

When the gate voltage is set to the threshold voltage of the transistor 150 or higher, owing to a difference of energy between the semiconductor 106a and the semiconductor 106b at the conduction band minimum, electrons preferentially flow in the semiconductor 106a. In other words, the electrons are assumed to be embedded in the semiconductor 106a. Note that the energy at the conduction band minimum is expressed as Ec, and the energy at the valence band top is expressed as Ev.

Thus, in the transistor 150 of one embodiment of the present invention, the influence of interface scattering is reduced by embedded electrons in the semiconductor 106a. Accordingly, the channel resistance of the transistor 150 of one embodiment of the present invention is low.

Figure 18C:
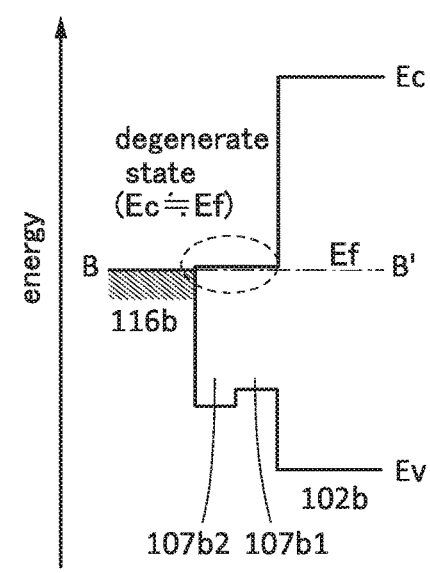

FIG. 18C is a band diagram in a cross section including a source region or a drain region of the transistor 150 along B-B' in FIG. 18A. The region 107a1, the region 107b1, the region 107a2, and the region 107b2 are each in a degenerate state. The Fermi level of the semiconductor 106a is positioned at substantially the same level of the energy at the conduction band minimum in the region 107b1. The Fermi level of the semiconductor 106b is positioned at substantially the same level of the energy at the conduction band minimum in the region 107b2. The same applies to the region 107a1 and the region 107a2.

In this case, between the conductor 116b functioning as the source electrode or the drain electrode and the region 107b2, the energy barrier is sufficiently low; accordingly, the ohmic contact occurs. In addition, the ohmic contact occurs between the region 107b2 and the region 107b1. Furthermore, between the conductor 116a functioning as the source electrode or the drain electrode and the region 107a2, the energy barrier is sufficiently low; accordingly, the ohmic contact occurs. In addition, the ohmic contact occurs between the region 107a2 and the region 107a1. Thus, the electrons are smoothly accepted and donated between the conductors 116a and 116b and the semiconductors 106a and 106b.

As described above, in the transistor of one embodiment of the present invention, electrons are smoothly accepted and donated between the source electrode and the drain electrode and the channel formation region, and the channel resistance is low. Thus, the transistor has excellent switching characteristics.

Next, the semiconductor 106a and the semiconductor 106b having energy bands shown in FIG. 18B are described.

For example, the semiconductor 106a is an oxide semiconductor containing one or more elements other than oxygen that are contained in the semiconductor 106b. Since the semiconductor 106a contains one or more elements other than oxygen that are contained in the semiconductor 106b, an interface state is less likely to be generated at the interface between the semiconductor 106a and the semiconductor 106b.

The semiconductor 106a and the semiconductor 106b preferably contain at least indium. In the case of using an In-M-Zn oxide as the semiconductor 106a, when the total proportion of In and M is assumed to be 100 atomic %, the proportions of In and M are preferably set to be lower than 50 atomic % and higher than 50 atomic %, respectively, further preferably lower than 25 atomic % and higher than 75 atomic %, respectively. In the case of using an In-M-Zn oxide as the semiconductor 106b, when the total proportion of In and M is assumed to be 100 atomic %, the proportions of In and M are preferably set to be higher than 25 atomic % and lower than 75 atomic %, respectively, further preferably higher than 34 atomic % and lower than 66 atomic %, respectively.

As the semiconductor 106b, an oxide having an electron affinity higher than that of the semiconductor 106a is used. For example, as the oxide semiconductor 106b, an oxide having higher electron affinity than the oxide 106a by greater than or equal to 0.07 eV and less than or equal to 1.3 eV, preferably greater than or equal to 0.1 eV and less than or equal to 0.7 eV, further preferably greater than or equal to 0.15 eV and less than or equal to 0.4 eV is used. Note that the electron affinity refers to an energy gap between the vacuum level and the conduction band minimum.

In the case where the semiconductor 106 includes the semiconductor 106a, the semiconductor 106b, and the semiconductor 106c as illustrated in FIG. 14, electrons can be embedded. In that case, for the semiconductor 106c, the explanation of the semiconductor 106a is referred to.

The transistor structures described above are merely examples, and a transistor structure obtained by combining any of them is also included in the category of one embodiment of the present invention.

<Application Example of Semiconductor Device>

An application example of a semiconductor device of one embodiment of the present invention is described below.

<Display Device>

The following shows configuration examples of a display device of one embodiment of the present invention.

[Configuration Example]

Figure 19A:
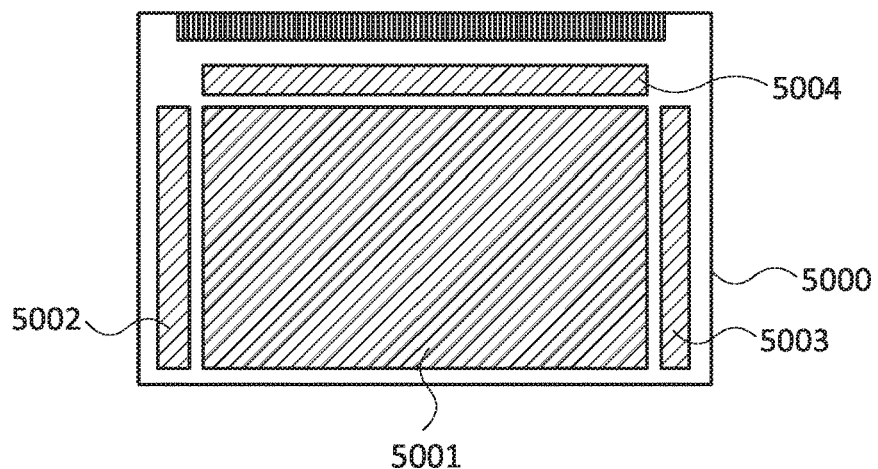
FIGS. 19A to 19C are a top view and circuit diagrams of a display device according to one embodiment of the present invention.
Figure 19B:
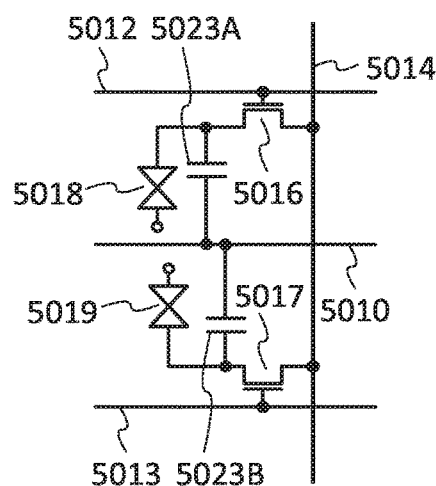
Figure 19C:
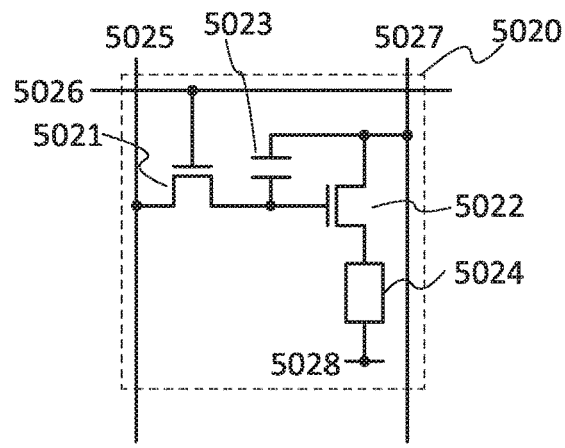

FIG. 19A is a top view of a display device of one embodiment of the present invention. FIG. 19B shows a pixel circuit where a liquid crystal element is used for a pixel of a display device of one embodiment of the present invention. FIG. 19C illustrates a pixel circuit where an organic EL element is used for a pixel of a display device of one embodiment of the present invention.

Any of the above-described transistors can be used as a transistor used for the pixel. Here, an example in which an n-channel transistor is used is shown. Note that a transistor manufactured through the same steps as the transistor used for the pixel may be used for a driver circuit. For a capacitor used in the pixel, the above capacitor can be used. Thus, by using any of the above-described transistors and the capacitors for a pixel or a driver circuit, the display device can have high display quality and/or high reliability.

There is a case where performance of the display device can be improved when a structure of a transistor used in the pixel is differentiated from a structure of a transistor used in the driver circuit. For example, a transistor with an s-channel structure may be used for a pixel, and a transistor with no s-channel structure may be used for a driver circuit. The transistor with an s-channel structure has higher on-state current and lower off-state current than the transistor with no s-channel structure. Thus, the transistor with an s-channel structure is preferable for a transistor used in a pixel, which is required to have high on-state current and/or low off-state current. The area occupied by the transistor with an s-channel structure can be small when the on-state current that is equivalent to that of the transistor with no s-channel structure is needed. Thus, the aperture ratio of the pixel may be increased. Specifically, the aperture ratio of the pixel can be higher than or equal to 40%, preferably higher than or equal to 50%, further preferably higher than or equal to 60%. Furthermore, the transistor with an s-channel structure has high light-blocking properties; thus, a deterioration of the transistor used in a pixel due to light may be suppressed. In contrast, in the driver circuit, the transistor with no s-channel structure is preferably used because the parasitic capacitance can be reduced. The degree of freedom for design of the driver circuit may be increased with use of the transistor with no s-channel structure.

For example, the transistor with an s-channel structure may be used for the driver circuit, and the transistor with no s-channel structure may be used for the pixel. The transistor with an s-channel structure has higher on-state current and lower off-state current. Thus, the transistor with an s-channel structure is preferable for a transistor used in a pixel, which is required to have high on-state current and/or low off-state current. The area occupied by the transistor with an s-channel structure can be small when the on-state current that is equivalent to that of the transistor with no s-channel structure is needed. Thus, the area of the driver circuit can be reduced, and the frame of the display device can be reduced in some cases. Specifically, the width of the frame can be smaller than or equal to 3 mm, preferably smaller than or equal to 1 mm, further preferably smaller than or equal to 0.8 mm. In contrast, in the pixel, the transistor with no s-channel structure is preferably used because the parasitic capacitance can be reduced. The degree of freedom for design of the driver circuit may be increased with use of the transistor with no s-channel structure. In particular, in the case where the pixel has a threshold correction function in a light-emitting device, the effect of the function may be increased by a reduction of parasitic capacitance.

For example, the transistor with an s-channel structure may be used for part of the pixel, and the transistor with no s-channel structure may be used for the other part of the pixel. The transistor with an s-channel structure has higher on-state current and lower off-state current. Thus, the transistor with an s-channel structure is preferable for a transistor used in part of the pixel, which is required to have high on-state current and/or low off-state current. The area occupied by the transistor with an s-channel structure can be small when the on-state current that is equivalent to that of the transistor with no s-channel structure is needed. Thus, the aperture ratio of the pixel may be increased. Specifically, the aperture ratio of the pixel can be higher than or equal to 40%, preferably higher than or equal to 50%, further preferably higher than or equal to 60%. Furthermore, the transistor with an s-channel structure has high light-blocking properties; thus, a deterioration of the transistor used in a pixel due to light may be suppressed. In contrast, in the other part of the pixel, the transistor with no s-channel structure is preferably used because the parasitic capacitance can be reduced. In particular, in the case where the pixel has a threshold correction function in a light-emitting device, the effect of the function may be increased by a reduction of parasitic capacitance.

For example, the transistor with an s-channel structure may be used for part of the driver circuit, and the transistor with no s-channel structure may be used for the other part of the driver circuit. The transistor with an s-channel structure has higher on-state current and lower off-state current. Thus, the transistor with an s-channel structure is preferable for a transistor used in part of the driver circuit, which is required to have high on-state current and/or low off-state current. The area occupied by the transistor with an s-channel structure can be small when the on-state current that is equivalent to that of the transistor with no s-channel structure is needed. Thus, the area of the driver circuit can be reduced, and the frame of the display device can be reduced in some cases. Specifically, the width of the frame can be smaller than or equal to 3 mm, preferably smaller than or equal to 1 mm, further preferably smaller than or equal to 0.8 mm. In contrast, in the other part of the driver circuit, the transistor with no s-channel structure is preferably used because the parasitic capacitance can be reduced.

FIG. 19A illustrates an example of a top view of an active matrix display device. A pixel portion 5001, a first scan line driver circuit 5002, a second scan line driver circuit 5003, and a signal line driver circuit 5004 are provided over a substrate 5000 in the display device. The pixel portion 5001 is electrically connected to the signal line driver circuit 5004 through a plurality of signal lines and is electrically connected to the first scan line driver circuit 5002 and the second scan line driver circuit 5003 through a plurality of scan lines. Pixels including display elements are provided in respective regions divided by the scan lines and the signal lines. The substrate 5000 of the display device is electrically connected to a timing control circuit (also referred to as a controller or a control IC) through a connection portion such as a flexible printed circuit (FPC).

The first scan line driver circuit 5002, the second scan line driver circuit 5003, and the signal line driver circuit 5004 are formed over the substrate 5000 where the pixel portion 5001 is formed. Therefore, a display device can be manufactured at cost lower than that in the case where a driver circuit is separately formed. Further, in the case where a driver circuit is separately formed, the number of wiring connections is increased. By providing the driver circuit over the substrate 5000, the number of wiring connections can be reduced. Accordingly, the reliability and/or yield can be improved.

<Liquid Crystal Display Device>

FIG. 19B illustrates an example of a circuit configuration of the pixel. Here, a pixel circuit which is applicable to a pixel of a VA liquid crystal display device, or the like is illustrated.

This pixel circuit can be applied to a structure in which one pixel includes a plurality of pixel electrodes. The pixel electrodes are connected to different transistors, and the transistors can be driven with different gate signals. Accordingly, signals applied to individual pixel electrodes in a multi-domain pixel can be controlled independently.

A gate wiring 5012 of a transistor 5016 and a gate wiring 5013 of a transistor 5017 are separated so that different gate signals can be supplied thereto. In contrast, a source or drain electrode 5014 functioning as a data line is shared by the transistors 5016 and 5017. For the transistors 5016 and 5017, the above-described transistor 150 and the like can be used as appropriate. For a capacitor 5023A and a capacitor 5023B, the above-described capacitor 160 can be used as appropriate. Thus, the liquid crystal display device can have high display quality and/or high reliability.

A gate electrode of the transistor 5016 is electrically connected to the gate wiring 5012, and a gate electrode of the transistor 5017 is electrically connected to the gate wiring 5013. When different gate signals are supplied to the gate wiring 5012 and the gate wiring 5013, operation timings of the transistor 5016 and the transistor 5017 can be varied. As a result, alignment of liquid crystals can be controlled.

Further, a capacitor may be formed using a capacitor wiring 5010, a gate insulator functioning as a dielectric, and a capacitor electrode electrically connected to the first pixel electrode or the second pixel electrode.

The multi-domain pixel includes a first liquid crystal element 5018 and a second liquid crystal element 5019. The first liquid crystal element 5018 includes the first pixel electrode, a counter electrode, and a liquid crystal layer therebetween. The second liquid crystal element 5019 includes the second pixel electrode, a counter electrode, and a liquid crystal layer therebetween.

Note that a pixel circuit in the display device of one embodiment of the present invention is not limited to that shown in FIG. 19B. For example, a switch, a resistor, a capacitor, a transistor, a sensor, a logic circuit, or the like may be added to the pixel circuit shown in FIG. 19B.

<Light-Emitting Device>

FIG. 19C illustrates another example of a circuit configuration of the pixel. Here, a display device (also referred to as light-emitting device) using a light-emitting element typified by an organic EL element.

In an organic EL element, by application of voltage to a light-emitting element, electrons are injected from one of a pair of electrodes included in the organic EL element and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Based on such a mechanism, such a light-emitting element is referred to as a current-excitation type light-emitting element.

FIG. 19C illustrates an applicable example of a pixel circuit. Here, two n-channel transistors and one capacitor are provided in one pixel, for example. Note that the above-described transistor 150 and the like can be used as the n-channel transistors. The above-described capacitor 160 and the like can be used as the capacitor. Further, digital time grayscale driving can be employed for the pixel circuit.

The configuration of the applicable pixel circuit and operation of a pixel employing digital time grayscale driving will be described.

A pixel 5020 includes a switching transistor 5021, a driver transistor 5022, a light-emitting element 5024, and a capacitor 5023. A gate electrode of the switching transistor 5021 is connected to a scan line 5026, a first electrode (one of a source electrode and a drain electrode) of the switching transistor 5021 is connected to a signal line 5025, and a second electrode (the other of the source electrode and the drain electrode) of the switching transistor 5021 is connected to a gate electrode of the driver transistor 5022. The gate electrode of the driver transistor 5022 is connected to a power supply line 5027 through the capacitor 5023, a first electrode of the driver transistor 5022 is connected to the power supply line 5027, and a second electrode of the driver transistor 5022 is connected to a first electrode (a pixel electrode) of the light-emitting element 5024. A second electrode of the light-emitting element 5024 corresponds to a common electrode 5028. The common electrode 5028 is electrically connected to a common potential line provided over the same substrate.

As each of the switching transistor 5021 and the driver transistor 5022, the above-described transistor 150 and the like can be used as appropriate. As the capacitor 5023, the above-described capacitor 160 and the like can be used. In this manner, an organic EL display device having high display quality and/or high reliability can be provided.

The potential of the second electrode (the common electrode 5028) of the light-emitting element 5024 is set to be a low power supply potential. Note that the low power supply potential is lower than a high power supply potential supplied to the power supply line 5027. For example, the low power supply potential can be GND, 0 V, or the like. The high power supply potential and the low power supply potential are set to be higher than or equal to the forward threshold voltage of the light-emitting element 5024, and the difference between the potentials is applied to the light-emitting element 5024, whereby current is supplied to the light-emitting element 5024, leading to light emission. The forward voltage of the light-emitting element 5024 refers to a voltage at which a desired luminance is obtained, and includes at least forward threshold voltage.

Note that gate capacitance of the driver transistor 5022 may be used as a substitute for the capacitor 5023 in some cases, so that the capacitor 5023 can be omitted. The gate capacitance of the driver transistor 5022 may be formed between the channel formation region and the gate electrode.

Next, a signal input to the driver transistor 5022 is described. In the case of a voltage-input voltage driving method, a video signal for turning on or off the driver transistor 5022 is input to the driver transistor 5022. In order for the driver transistor 5022 to operate in a linear region, voltage higher than the voltage of the power supply line 5027 is applied to the gate electrode of the driver transistor 5022. Note that voltage higher than or equal to voltage which is the sum of power supply line voltage and the threshold voltage $V_{th}$ of the driver transistor 5022 is applied to the signal line 5025.

In the case of performing analog grayscale driving, a voltage higher than or equal to a voltage which is the sum of the forward voltage of the light-emitting element 5024 and the threshold voltage $V_{th}$ of the driver transistor 5022 is applied to the gate electrode of the driver transistor 5022. A video signal by which the driver transistor 5022 is operated in a saturation region is input, so that current is supplied to the light-emitting element 5024. In order for the driver transistor 5022 to operate in a saturation region, the potential of the power supply line 5027 is set higher than the gate potential of the driver transistor 5022. When an analog video signal is used, it is possible to supply current to the light-emitting element 5024 in accordance with the video signal and perform analog grayscale driving.

Note that in the display device of one embodiment of the present invention, a pixel configuration is not limited to that shown in FIG. 19C. For example, a switch, a resistor, a capacitor, a sensor, a transistor, a logic circuit, or the like may be added to the pixel circuit shown in FIG. 19C.

<Modification Example 1 of Light-Emitting Device>

Figure 20A:
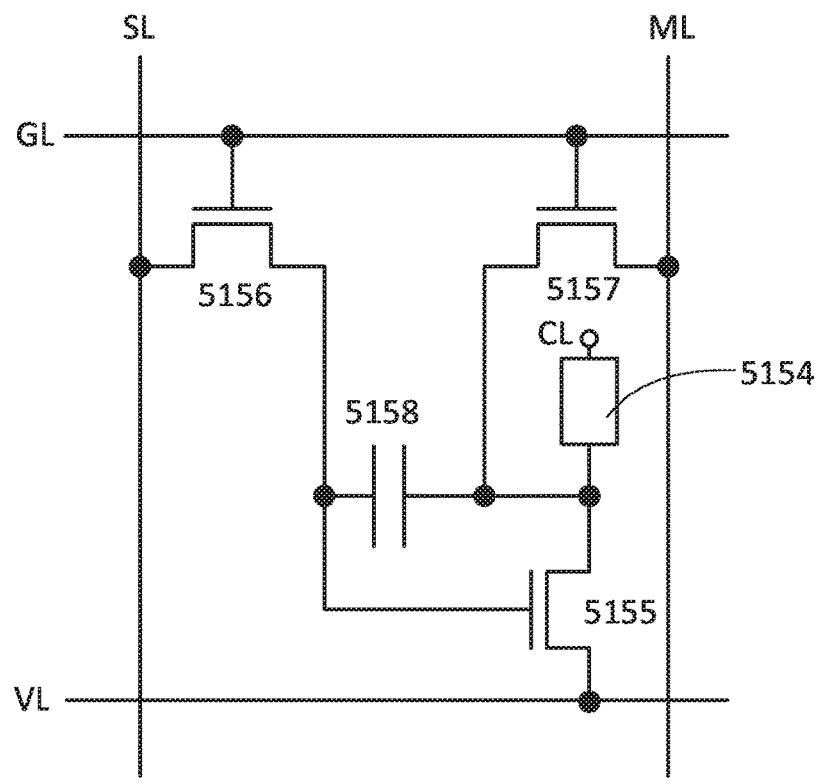
FIGS. 20A and 20B are circuit diagrams of a display device according to one embodiment of the present invention.

FIG. 20A illustrates an applicable example of a pixel circuit, for example. Here, three n-channel transistors and one capacitor are provided in one pixel, for example.

FIG. 20A illustrates an example of a circuit diagram of a pixel 5111. The pixel 5111 includes a transistor 5155, a transistor 5156, a transistor 5157, a capacitor 5158, and a light-emitting element 5154.

The potential of a pixel electrode in the light-emitting element 5154 is controlled in accordance with an image signal Sig input to the pixel 5111. The luminance of the light-emitting element 5154 depends on a potential difference between the pixel electrode and the common electrode.

The transistor 5156 has a function of controlling electrical connection between the wiring SL and the gate of the transistor 5155. One of the source and the drain of the transistor 5155 is electrically connected to an anode of the light-emitting element 5154, and the other of the source and the drain is electrically connected to the wiring VL. The transistor 5157 has a function of controlling electrical connection between the wiring ML and the other of the source and the drain of the transistor 5155. One of a pair of electrodes of the capacitor 5158 is connected to the gate of the transistor 5155, and the other is connected to the anode of the light-emitting element 5154.

The switching of the transistor 5156 is performed in accordance with the potential of a wiring GL connected to a gate of the transistor 5156. The switching of the transistor 5157 is performed in accordance with the potential of the wiring GL connected to a gate of the transistor 5157.

The above-described transistor 150 and the like can be used for at least one of the transistors 5155, 5156, and 5157. The above-described capacitor 160 and the like can be used as the capacitor 5158.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Next, an operation example of the pixel 5111 illustrated in FIG. 20A is described.

Figure 20B:
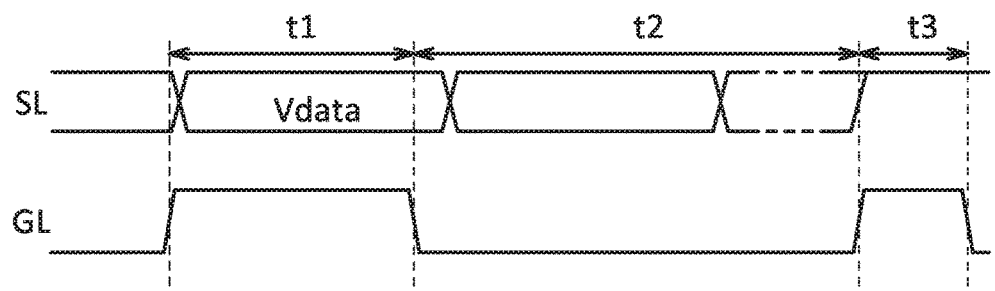

FIG. 20B is a timing chart of the potential of the wiring GL electrically connected to the pixel 5111 in FIG. 20A and the potential of the image signal Sig supplied to the wiring SL. Note that in the timing chart in FIG. 20B, all the transistors included in the pixel 5111 in FIG. 20A are n-channel transistors.

First, in a period t1, a potential at high level is applied to the wiring GL. Then, the transistor 5156 and the transistor 5157 are turned on. A potential Vdata of the image signal Sig is applied to the wiring SL, and the potential Vdata is applied to the gate of the transistor 5155 via the transistor 5156.

A potential Vano is applied to the wiring VL, and a potential Vcat is applied to the wiring CL. The potential Vano is preferably higher than the potential obtained by adding the threshold voltage Vthe of the light-emitting element 5154 and the threshold voltage Vth of the transistor 5155 to the potential Vcat. When the potential difference is generated between the wiring VL and the wiring CL, the value of the drain current of the transistor 5155 is determined in accordance with the potential Vdata. Then, the drain current is supplied to the light-emitting element 5154, whereby the luminance of the light-emitting element 5154 is determined.

In the case where transistor 5155 is an n-channel transistor, in the period t1, the potential of the wiring ML is preferably lower than the sum of the potential of the wiring CL and the threshold voltage Vthe of the light-emitting element 5154, and the potential of the wiring VL is higher than the sum of the potential of the wiring ML and the threshold voltage Vth of the transistor 5155. With the above structure, even when the transistor 5157 is in an on state, the drain current of the transistor 5155 can be made to flow preferentially to the wiring ML rather than to the light-emitting element 5154.

Next, in a period t2, the potential at a low level is applied to the wiring GL. Then, the transistor 5156 and the transistor 5157 are turned off. Since the transistor 5156 is off, the potential Vdata is held at the gate of the transistor 5155. A potential Vano is applied to the wiring VL, and a potential Vcat is applied to the wiring CL. Thus, the light-emitting element 5154 emits light in accordance with the luminance determined in the period t1.

Next, in a period t3, the potential at a high level is applied to the wiring GL. Then, the transistor 5156 and the transistor 5157 are turned on. In addition, a potential is applied to the wiring SL so that the gate voltage of the transistor 5155 is higher than the threshold voltage Vth. The potential Vcat is applied to the wiring CL. In addition, the potential of the wiring ML is lower than the sum of the potential of the wiring CL and the threshold voltage Vthe of the light-emitting element 5154, and the potential of the wiring VL is higher than the sum of the potential of the wiring ML and the threshold voltage Vth of the transistor 5155. With the above structure, the drain current of the transistor 5155 can be made to flow preferentially to the wiring ML rather than the light-emitting element 5154.

Then, the drain current of the transistor 5155 is supplied to the monitor circuit through the wiring ML. The monitor circuit generates a signal including information about the value of the drain current by using the drain current flowing through the wiring ML. Thus, using the above signal, the light-emitting device according to one embodiment of the present invention can correct the value of the potential Vdata of the image signal Sig supplied to the pixel 5111.

Note that in the light-emitting device including the pixel 5111 illustrated in FIG. 20A, the operation in the period t3 is not necessarily performed after the operation in the period t2. For example, in the light-emitting device, the operation in the period t3 may be performed after the operations in the periods t1 and t2 are repeated a plurality of times. Alternatively, after the operation in the period t3 is performed on pixels 5111 in one row, the light-emitting elements 5154 may be brought into a non-light-emitting state by writing an image signal corresponding to the lowest grayscale level 0 to the pixels 5111 in the row which have been subjected to the above operation. Then, the operation in the period t3 may be performed on pixels 5111 in the next row.

<Modification Example 2 of Light-Emitting Device>

Figure 21A:
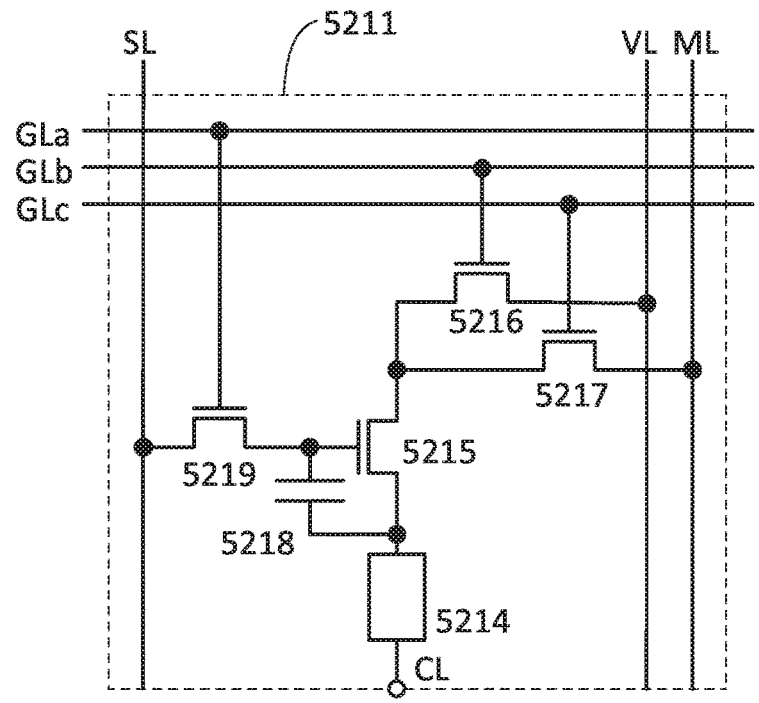
FIGS. 21A and 21B are circuit diagrams of a display device according to one embodiment of the present invention.

FIG. 21A shows an example of a pixel circuit. Here, four n-channel transistors and one capacitor are provided in one pixel.

FIG. 21A shows an example of a circuit diagram of a pixel 5211. The pixel 5211 includes a transistor 5215, a transistor 5216, a transistor 5217, a capacitor 5218, and a light-emitting element 5214, and a transistor 5219.

The potential of a pixel electrode in the light-emitting element 5214 is controlled in accordance with an image signal Sig input to the pixel 5211. The luminance of the light-emitting element 5214 depends on a potential difference between the pixel electrode and the common electrode.

The transistor 5219 has a function of controlling electrical connection between the wiring SL and the gate of the transistor 5215. One of the source and the drain of the transistor 5215 is connected to the anode of the light-emitting element 5214. The transistor 5216 has a function of controlling electrical connection between the wiring VL and the other of the source and the drain of the transistor 5215. The transistor 5217 has a function of controlling electrical connection between the wiring ML and the other of the source and the drain of the transistor 5215. One of a pair of electrodes of the capacitor 5218 is connected to the gate of the transistor 5215, and the other is connected to the anode of the light-emitting element 5214.

The switching of the transistor 5219 is performed in accordance with the potential of a wiring GLa connected to a gate of the transistor 5219. The switching of the transistor 5216 is performed in accordance with the potential of a wiring GLb connected to a gate of the transistor 5216. The switching of the transistor 5217 is performed in accordance with the potential of a wiring GLc connected to a gate of the transistor 5217.

The above-described transistor 150 and the like can be used as at least one of the transistor 5215, the transistor 5216, the transistor 5217, and the transistor 5219. The above-described capacitor 160 and the like can be used as the capacitor 5218.

Next, an example of operation of the pixel 5211 illustrated in FIG. 21A for external correction is described.

Figure 21B:
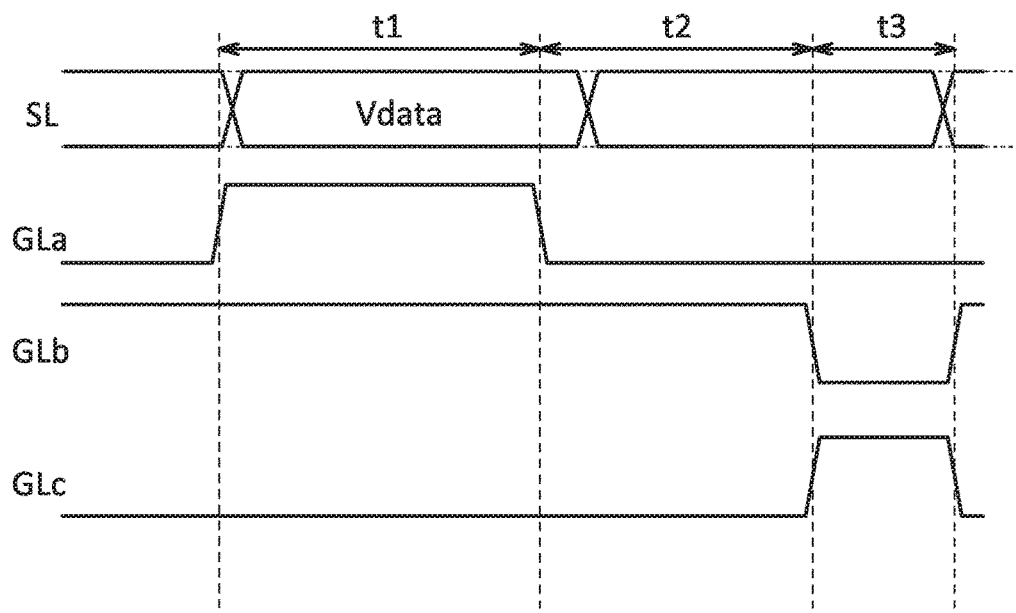

FIG. 21B is a timing chart of potentials of the wiring GLa, the wiring GLb, and the wiring GLc, which are connected to the pixel 5211 illustrated in FIG. 21A, and a potential of the image signal Sig supplied to the wiring SL. Note that in the timing chart in FIG. 21B, all the transistors included in the pixel 5211 in FIG. 21A are n-channel transistors.

First, in a period t1, a high-level potential is applied to the wiring GLa, a high-level potential is applied to the wiring GLb, and a low-level potential is applied to the wiring GLc. Accordingly, the transistor 5219 and the transistor 5216 are turned on, and the transistor 5217 is turned off. A potential Vdata of the image signal Sig is applied to the wiring SL, and the potential Vdata is applied to the gate of the transistor 5215 through the transistor 5219.

A potential Vano is applied to the wiring VL, and a potential Vcat is applied to the wiring CL. The Potential Vano is preferably higher than the sum of the potential. Vcat and the threshold voltage Vthe of the light-emitting element 5214. The potential Vano of the wiring VL is applied to the other of the source and the drain of the transistor 5215 through the transistor 5216. Thus, the value of the drain current of the transistor 5215 is determined by the potential Vdata. Then, the drain current is supplied to the light-emitting element 5214, whereby the luminance of the light-emitting element 5214 is determined.

In the period t2, the low-level potential is applied to the wiring GLa, the high-level potential is applied to the wiring GLb, and the low-level potential is applied to the wiring GLc. Accordingly, the transistor 5216 is turned on, and the transistor 5219 and the transistor 5217 are turned off. Since the transistor 5219 is off, the potential Vdata is held at the gate of the transistor 5215. A potential Vano is applied to the wiring VL, and a potential Vcat is applied to the wiring CL. Thus, the light-emitting element 5214 maintains the luminance determined in the period t1.

Next, in a period t3, the high-level potential is applied to the wiring GLa, the low-level potential is applied to the wiring GLb, and the high-level potential is applied to the wiring GLc. Accordingly, the transistor 5217 is turned on, and the transistors 5219 and the transistor 5216 are turned off. The potential Vcat is applied to the wiring CL. The potential Vano is applied to the wiring ML, which is connected to the monitor circuit.

By the above operation, the drain current of the transistor 5215 is supplied to the wiring ML through the transistor 5217. In addition, the drain current, is also supplied to the monitor circuit through the wiring ML. The monitor circuit generates a signal including information about the value of the drain current by using the drain current flowing through the wiring ML. Thus, using the above signal, the light-emitting device according to one embodiment of the present invention can correct the value of the potential Vdata of the image signal Sig supplied to the pixel 5211.

Note that in the light-emitting device including the pixel 5211 illustrated in FIG. 21A, the operation in the period t3 is not necessarily performed after the operation in the period t2. For example, in the light-emitting device, the operation in the period t3 may be performed after the operations in the periods t1 and t2 are repeated a plurality of times. Alternatively, after the operation in the period t3 is performed on pixels 5211 in one row, the light-emitting elements 5214 may be brought into a non-light-emitting state by writing an image signal corresponding to the lowest grayscale level 0 to the pixels 5211 in the row which have been subjected to the above operation. Then, the operation in the period t3 may be performed on pixels 5211 in the next row.

<Modification Example 3 of Light-Emitting Device>

Figure 22A:
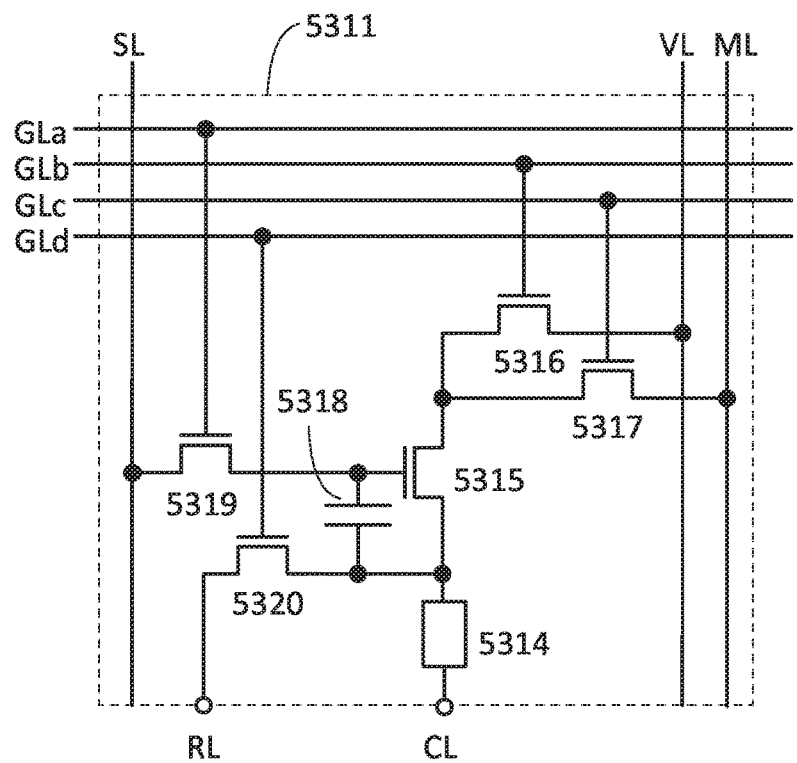
FIGS. 22A and 22B are circuit diagrams of a display device according to one embodiment of the present invention.

FIG. 22A shows an example of a pixel circuit. Here, five n-channel transistors and one capacitor are provided in one pixel, for example.

FIG. 22A shows an example of a circuit diagram of a pixel 5311. The pixel 5311 in FIG. 22A includes a transistor 5315, a transistor 5316, a transistor 5317, a capacitor 5318, a light-emitting element 5314, a transistor 5319, and a transistor 5320.

The transistor 5320 has a function of controlling electrical connection between a wiring RL and an anode of the light-emitting element 5314. The transistor 5319 has a function of controlling electrical connection between the wiring SL and a gate of the transistor 5315. One of a source and a drain of the transistor 5315 is connected to the anode of the light-emitting element 5314. The transistor 5316 has a function of controlling electrical connection between the wiring VL and the other of the source and the drain of the transistor 5315. The transistor 5317 has a function of controlling electrical connection between the wiring ML and the other of the source and the drain of the transistor 5315. One of a pair of electrodes of the capacitor 5318 is connected to the gate of the transistor 5315, and the other is connected to the anode of the light-emitting element 5314.

The switching of the transistor 5319 is performed in accordance with the potential of a wiring GLa connected to a gate of the transistor 5319. The switching of the transistor 5316 is performed in accordance with the potential of a wiring GLb connected to a gate of the transistor 5316. The switching of the transistor 5317 is performed in accordance with the potential of a wiring GLc connected to a gate of the transistor 5317. The switching of the transistor 5320 is performed in accordance with the potential of a wiring GLd connected to a gate of the transistor 5320.

The above-described transistor 150 and the like can be used as at least one of the transistor 5315, the transistor 5316, the transistor 5317, the transistor 5319, and the transistor 5320. The above-described capacitor 160 and the like can be used as the capacitor 5318.

Next, an example of operation of the pixel 5311 illustrated in FIG. 22A for external correction is described.

Figure 22B:
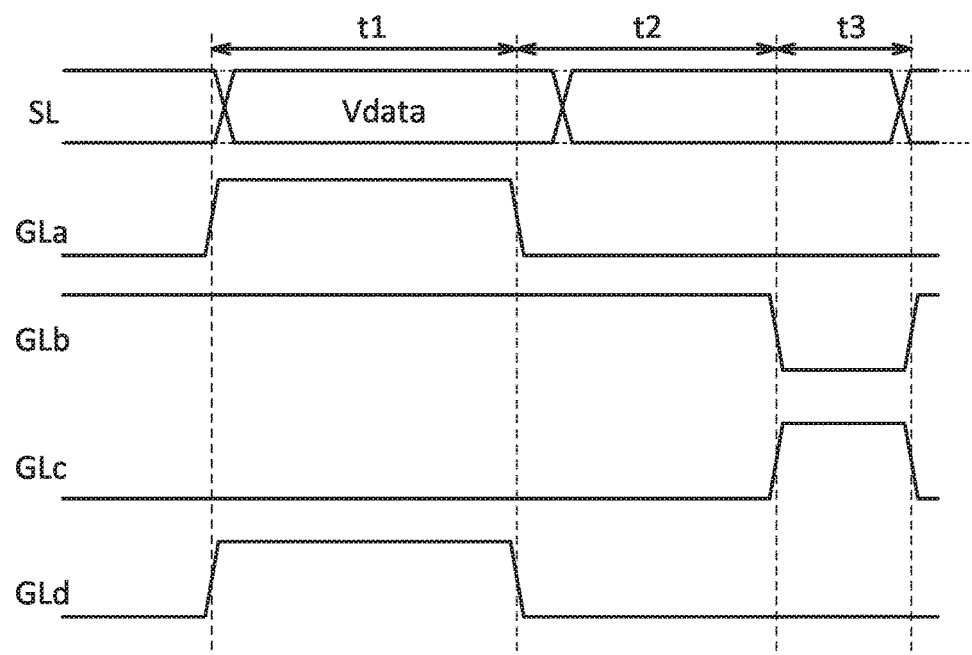

FIG. 22B is a timing chart of potentials of the wiring GLa, the wiring GLb, the wiring GLc, and the wiring GLd, which are connected to the pixel 5311 illustrated in FIG. 22A, and a potential of the image signal Sig supplied to the wiring SL. Note that in the timing chart in FIG. 22B, all the transistors included in the pixel 5311 in FIG. 22A are n-channel transistors.

First, in a period t1, a high-level potential is applied to the wiring GLa, a high-level potential is applied to the wiring GLb, a low-level potential is applied to the wiring GLc, and a high-level potential is applied to the wiring GLd. Accordingly, the transistor 5319, the transistor 5316, and the transistor 5320 are turned on, and the transistor 5317 is turned off. A potential Vdata of the image signal Sig is applied to the wiring SL, and the potential Vdata is applied to the gate of the transistor 5315 through the transistor 5319. Thus, the value of the drain current of the transistor 5315 is determined by the potential Vdata. A potential Vano is applied to the wiring VL and a potential V1 is applied to the wiring RL; therefore, the drain current flows between the wiring VL and the wiring RL through the transistor 5316 and the transistor 5320.

The potential Vano is preferably higher than the sum of the potential Vcat and the threshold voltage Vthe of the light-emitting element 5314. The potential Vano of the wiring VL is supplied to one of a source and a drain of the transistor 5315 through the transistor 5316. The potential V1 applied to the wiring RL is supplied to the other of the source and the drain of the transistor 5315 through the transistor 5320. The potential Vcat is applied to the wiring CL.

Note that it is preferable that the potential. V1 be sufficiently lower than a potential obtained by subtracting the threshold voltage Vth of the transistor 5315 from the potential V0. The light-emitting element 5314 does not emit light in the period t1 because the potential V1 can be set sufficiently lower than a potential obtained by subtracting the threshold voltage Vthe of the light-emitting element 5314 from the potential Vcat.

Next, in the period t2, a low-level potential is applied to the wiring GLa, a high-level potential is applied to the wiring GLb, a low-level potential is applied to the wiring GLc, and a low-level potential is applied to the wiring GLd. Accordingly, the transistor 5316 is turned on, and the transistor 5319, the transistor 5317, and the transistor 5320 are turned off. Since the transistor 5319 is off, the potential Vdata is held at the gate of the transistor 5315.

A potential Vano is applied to the wiring VL, and a potential Vcat is applied to the wiring CL. Accordingly, the drain current of the transistor 5315, the value of which is determined in the period t1, is supplied to the light-emitting element 5314 because the transistor 5320 is turned off By supply of the drain current to the light-emitting element 5314, the luminance of the light-emitting element 5314 is determined, and the luminance is held in the period t2.

Next, in a period t3, a high-level potential is applied to the wiring GLa, a high-level potential is applied to the wiring GLb, a low-level potential is applied to the wiring GLc, and a high-level potential is applied to the wiring GLd. Accordingly, the transistor 5317 is turned on, and the transistor 5319, the transistor 5316, and the transistor 5320 are turned off. The potential Vcat is applied to the wiring CL. The potential Vano is applied to the wiring ML, which is connected to the monitor circuit.

By the above operation, the drain current of the transistor 5315 is supplied to the wiring ML through the transistor 5317. In addition, the drain current is also supplied to the monitor circuit through the wiring ML. The monitor circuit generates a signal including information about the value of the drain current by using the drain current flowing through the wiring ML. Thus, using the above signal, the light-emitting device according to one embodiment of the present invention can correct the value of the potential Vdata of the image signal Sig supplied to the pixel 5311.

Note that in the light-emitting device including the pixel 5311 illustrated in FIG. 22A, the operation in the period t3 is not necessarily performed after the operation in the period t2. For example, in the light-emitting device, the operation in the period t3 may be performed after the operations in the periods t1 and t2 are repeated a plurality of times. Alternatively, after the operation in the period t3 is performed on pixels 5311 in one row, the light-emitting elements 5314 may be brought into a non-light-emitting state by writing an image signal corresponding to the lowest grayscale level 0 o the pixels 5311 in the row which have been subjected to the above operation. Then, the operation in the period t3 may be performed on pixels 5311 in the next row.

In the pixel 5311 illustrated in FIG. 22A, even when a variation in resistance of a portion between the anode and the cathode of the light-emitting element 5314 among pixels is caused by deterioration of the light-emitting element 5314 or the like, the potential of the source of the transistor 5315 can be set to a predetermined potential V1 at the time of applying the potential. Vdata to the gate of the transistor 5315. Thus, a variation in luminance of the light-emitting element 5314 among pixels can be prevented.

<Modification Example 4 of Light-Emitting Device>

Figure 23A:
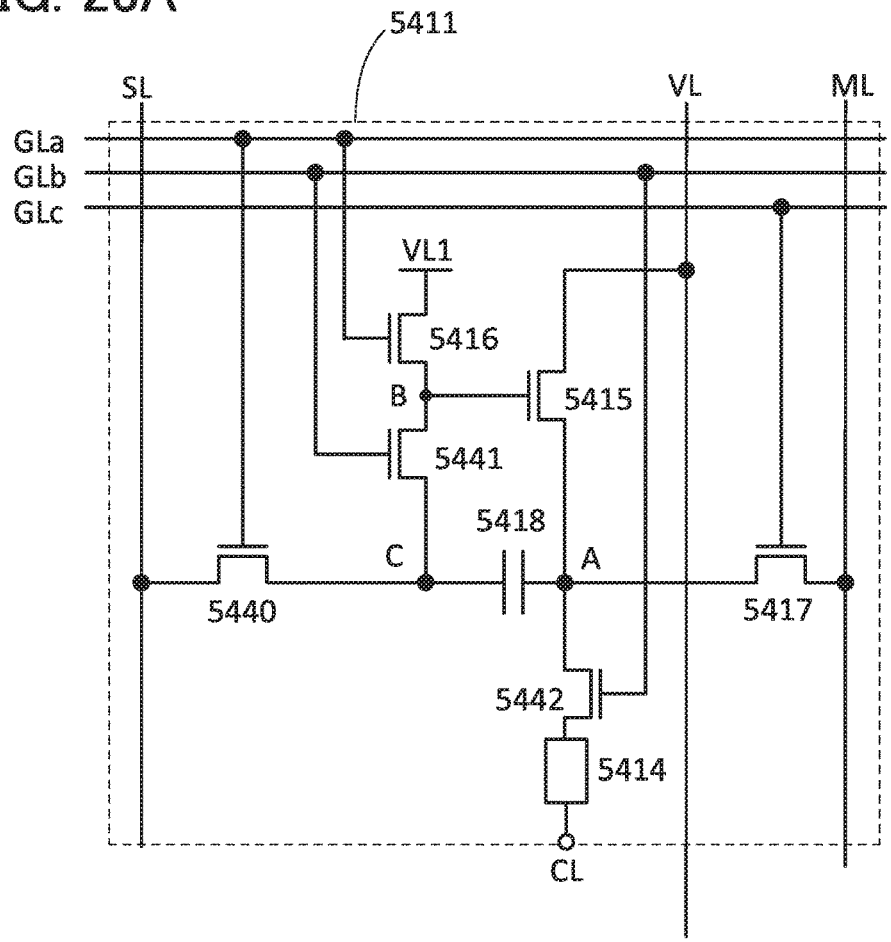
FIGS. 23A and 23B are circuit diagrams of a display device according to one embodiment of the present invention.

FIG. 23A illustrates an example of a pixel circuit. Here, six n-channel transistors and one capacitor are provided in one pixel.

FIG. 23A shows an example of a circuit diagram of the pixel 5411. The pixel 5411 includes a transistor 5415, a transistor 5416, a transistor 5417, a capacitor 5418, a light-emitting element 5414, a transistor 5440, a transistor 5441, and a transistor 5442.

The potential of a pixel electrode in the light-emitting element 5414 is controlled in accordance with an image signal Sig input to the pixel 5411. The luminance of the light-emitting element 5414 depends on a potential difference between the pixel electrode and the common electrode.

The transistor 5440 has a function of controlling conduction between the wiring SL and one of the pair of electrodes of the capacitor 5418. The other electrode of the capacitor 5418 is connected to one of a source and a drain of the transistor 5415. The transistor 5416 has a function of controlling electrical connection between the wiring VL1 and the gate of the transistor 5415. The transistor 5441 has a function of controlling conduction between one electrode of the capacitor 5418 and the gate of the transistor 5415. The transistor 5442 has a function of controlling conduction between one of the source and the drain of the transistor 5415 and the anode of the light-emitting element 5414. The transistor 5417 has a function of controlling electrical connection between the wiring ML and the other of the source and the drain of the transistor 5415.

In FIG. 23A, the other of the source and the drain of the transistor 5415 is connected to a wiring VL.

The transistor 5440 is turned on and off in accordance with the potential of the wiring GLa which is connected to a gate of the transistor 5440. The transistor 5416 is turned on and off in accordance with the potential of the wiring GLa which is connected to a gate of the transistor 5416. The transistor 5441 is turned on and off in accordance with the potential of the wiring GLb which is connected to a gate of the transistor 5441. The transistor 5442 is turned on and off in accordance with the potential of the wiring GLb which is connected to a gate of the transistor 5442. The transistor 5417 is turned on and off in accordance with the potential of the wiring GLc connected to the gate of the transistor 5417.

Figure 23B:
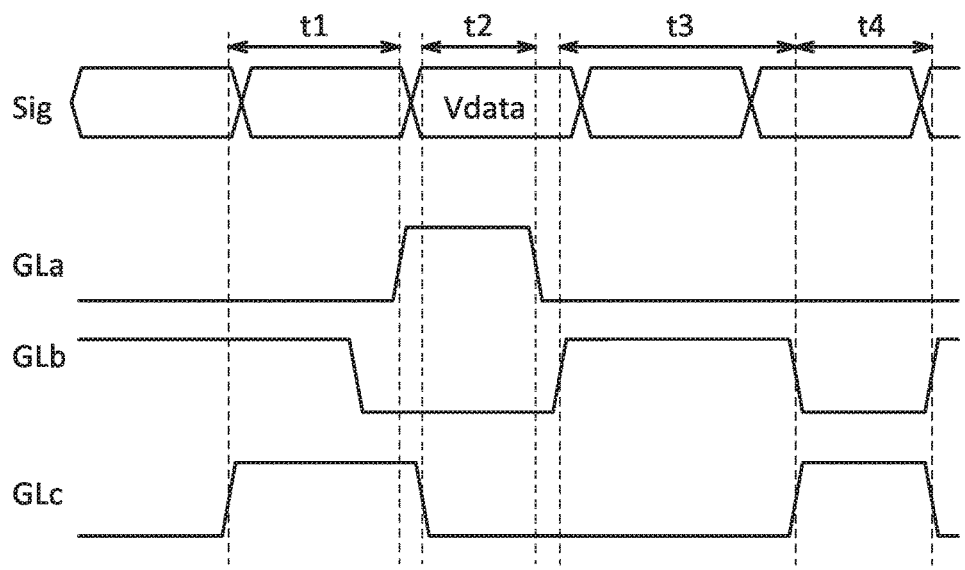

FIG. 23B is a timing chart of potentials of the wiring GLa, the wiring GLb, the wiring GLc, and a potential of the image signal Sig supplied to the wiring SL. Note that in the timing chart in FIG. 23B, all the transistors included in the pixel 5411 in FIG. 23A are n-channel transistors.

First, in a period t1, a low-level potential is applied to the wiring GLa, a high-level potential is applied to the wiring GLb, and a high-level potential is applied to the wiring GLc. Accordingly, the transistor 5441, the transistor 5442, and the transistor 5417 are turned on, and the transistor 5440 and the transistor 5416 are turned off. The transistors 5442 and 5417 are turned on, whereby a potential V0, which is the potential of the wiring ML, is applied to the one of the source and the drain of the transistor 5415 and the other electrode of the capacitor 5418 (represented as a node A).

A potential Vano is applied to the wiring VL, and a potential Vcat is applied to the wiring CL. The potential Vano is preferably higher than the sum of the potential V0 and the threshold voltage Vthe of the light-emitting element 5414. Note that the potential V0 is preferably lower than the sum of the potential Vcat and the threshold voltage Vthe of the light-emitting element 5414. With the potential V0 set in the above range, current can be prevented from flowing through the light-emitting element 5414 in the period t1.

A low-level potential is then applied to the wiring GLb, and the transistors 5441 and 5442 are accordingly turned off and the node A is held at the potential V0.

Next, in a period t2, the high-level potential is applied to the wiring GLa, the low-level potential is applied to the wiring GLb, and the low-level potential is applied to the wiring GLc. Accordingly, the transistors 5440 and 5416 are turned on and the transistors 5441, 5442, and 5417 are turned off.

Note that it is preferable in the transition from the period t1 to the period t2 that the potential applied to the wiring GLa be changed from low to high and then the potential applied to the wiring GLc be changed from high to low. This operation prevents change in the potential of the node A due to the change of the potential applied to the wiring GLa.

A potential Vano is applied to the wiring VL, and a potential Vcat is applied to the wiring CL. A potential Vdata of the image signal Sig is applied to the wiring SL, and a potential V1 is applied to the wiring VL1. Note that the potential V1 is preferably higher than the sum of the potential Vcat and the threshold voltage Vth of the transistor 5415 and lower than the sum of the potential Vano and the threshold voltage Vth of the transistor 5415.

Note that in the pixel structure shown in FIG. 23A, even if the potential V1 is higher than the sum of the potential Vcat and the threshold voltage Vthe of the light-emitting element 5414, the light-emitting element 5414 does not emit light as long as the transistor 5442 is off. Thus, the allowable potential V0 range can be expanded and the allowable range of V1-V0 can also be increased. As a result of increasing the degree of freedom of values for V1-V0, threshold voltage of a transistor 5415 can be accurately obtained even when time required to obtain the threshold voltage of the transistor 5415 is reduced or is limited.

By this operation, the potential V1 which is higher than the sum of the potential of the node A and the threshold voltage is input to the gate of the transistor 5415 (represented as a node B), and the transistor 5415 is turned on. Charge in the capacitor 5418 is then discharged through the transistor 5415, and the potential of the node A, which is the potential V0, starts to rise. The potential of the node A finally converges to the potential V1−Vth and the gate voltage of the transistor 5415 converges to the threshold voltage Vth of the transistor 5415; then, the transistor 5415 is turned off.

The potential Vdata of the image signal Sig applied to the wiring SL is applied to the one electrode of the capacitor 5418 (represented as a node C) through the transistor 5440.

In a period t3, a low-level potential is applied to the wiring GLa, a high-level potential is applied to the wiring GLb, and a low-level potential is applied to the wiring GLc. Accordingly, the transistors 5441 and 5442 are turned on and the transistors 5440, 5416, and 5417 are turned off.

During transition from the period t2 to t3, it is preferable that the potential applied to the wiring GLa be changed from high to low, and then, the potential applied to the wiring GLb be changed from low to high. This structure can prevent potential change of the node A due to change of the potential applied to the wiring GLa.

A potential Vano is applied to the wiring VL, and a potential Vcat is applied to the wiring CL.

The potential Vdata is applied to the node B by the above operation; thus, the gate voltage of the transistor 5415 becomes Vdata−V1+Vth. Thus, the gate voltage of the transistor 5415 can be the value to which the threshold voltage Vth is added. With this structure, variation in the threshold voltage Vth of the transistor 5415 can be reduced. Thus, variation of current values supplied to the light-emitting element 5414 can be suppressed, whereby reducing unevenness in luminance of the light-emitting device.

Note that the potential applied to the wiring GLb is greatly varied here, whereby an influence of variation of threshold voltages of the transistor 5442 on the value of a current supplied to the light-emitting element 5414 can be prevented. In other words, the high-level potential applied to the wiring GLb is much higher than the threshold voltage of the transistor 5442, and the low-level potential applied to the wiring GLb is much lower than the threshold voltage of the transistor 5442; thus, on/off switching of the transistor 5442 is secured and the influence of variation of threshold voltages of the transistor 5442 on the value of current supplied to the light-emitting element 5414 can be prevented.

Next, in a period t4, the low-level potential is applied to the wiring GLa, the low-level potential is applied to the wiring GLb, and the low-level potential is applied to the wiring GLc. Accordingly, the transistor 5417 is turned on, the transistor 5416, the transistor 5440, the transistor 5441, and the transistor 5442 are turned off.

The potential Vano is applied to the wiring VL, and the wiring ML is connected to a monitor circuit.

By the above operation, drain current Id of the transistor 5415 flows not to the light-emitting element 5414 but to the wiring ML through the transistor 5417. The monitor circuit generates a signal including information about the value of the drain current Id by using the drain current Id flowing through the wiring ML. The magnitude of the drain current Id depends on the mobility or the size (channel length, channel width) of the transistor 5415. Using the above signal, the light-emitting device according to one embodiment of the present invention can thus correct the value of the potential Vdata of the image signal. Sig supplied to the pixel 5411. That is, the influence of variation in mobility of the transistor 5415 can be reduced.

Note that in the light-emitting device including the pixel 5411 illustrated in FIG. 23A, the operation in the period t4 is not necessarily always performed after the operation in the period t3. For example, in the light-emitting device, the operation in the period t4 may be performed after the operations in the periods t1 to t3 are repeated a plurality of times. Alternatively, after the operation in the period t4 is performed on the pixels 5411 in one row, the light-emitting elements 5414 may be brought into a non-light-emitting state by writing an image signal corresponding to the lowest grayscale level 0 to the pixels 5411 in the row that have been subjected to the above operation. Then, the operation in the period t4 may be performed on the pixels 5411 in the next row.

Note that, in the light-emitting device including the pixel 5411 illustrated in FIG. 23A, the other of the source and the drain of the transistor 5415 is electrically isolated from the gate of the transistor 5415, so that their potentials can be individually controlled. Accordingly, in the period t2, the potential of the other of the source and the drain of the transistor 5415 can be set higher than a potential obtained by adding the threshold voltage Vth to the potential of the gate of the transistor 5415. When the transistor 5415 is a normally-on transistor, that is, when the threshold voltage Vth is negative, charge can be accumulated in the capacitor 5418 until the potential of the source of the transistor 5415 becomes higher than the potential V1 of the gate of the transistor 5415. For these reasons, in the light-emitting device according to one embodiment of the present invention, even when the transistor 5415 is a normally on transistor, the threshold voltage Vth can be obtained in the period t2; and in the period t3, the gate voltage can be set to a value in accordance with the obtained threshold voltage Vth.

Therefore, in the light-emitting device according to one embodiment of the present invention, the display unevenness can be reduced even when the transistor 5415 is a normally-on type, which enables display with high image quality.

In addition to the characteristics of the transistor 5415, the characteristics of the light-emitting element 5414 may be monitored. Here, it is preferable that current not flow through the transistor 5415 by controlling the potential Vdata of the image signal Sig, for example. The current of the light-emitting element 5414 can be thus extracted, and degradation or variation in current characteristics of the light-emitting element 5414 can be obtained.

For example, in this specification and the like, a display element, a display device which is a device including a display element, a light-emitting element, and a light-emitting device which is a device including a light-emitting element can employ various modes or can include various elements. A display element, a display device, a light-emitting element, or a light-emitting device includes, for example, at least one of an EL element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), micro electro mechanical system (MEMS), a digital micromirror device (DMD), a digital micro shutter (DMS), an interferometric modulator display (IMOD) element, a MEMS shutter display element, an optical interference type MEMS display element, an electrowetting element, a piezoelectric ceramic display, and a display element including a carbon nanotube. In addition to that, display media whose contrast, luminance, reflectivity, transmittance, or the like is changed by electromagnetic action may be included. Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, or an electrophoretic element include electronic paper. In a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

A coloring layer (also referred to as a color filter) may be used in order to obtain a full-color display device in which white light (W) for a backlight (e.g., an organic EL element, an inorganic EL element, an LED, or a fluorescent lamp) is used. As the coloring layer, red (R), green (G), blue (B), yellow (Y), or the like may be combined as appropriate, for example. With the use of the coloring layer, higher color reproductivity can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W. By using a self-luminous element, power consumption can be further reduced as compared to the case of using the coloring layer in some cases.

<Structure of Pixel of Light-Emitting Device>

An example of a structure of a pixel of a light-emitting device according to one embodiment of the present invention will be described below.

Figure 24A:
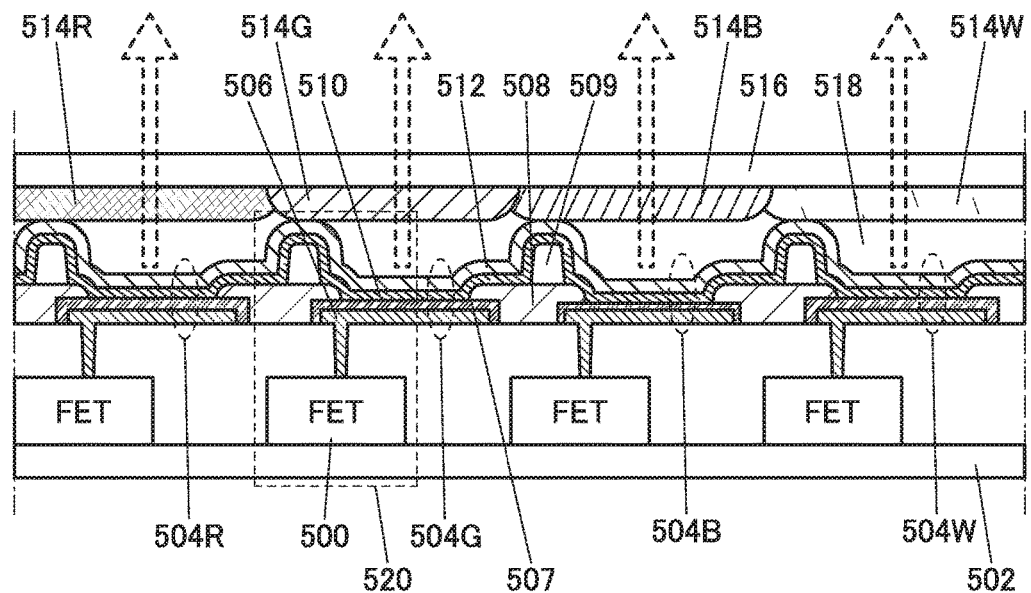
FIGS. 24A and 24B are cross-sectional views of display devices according to one embodiment of the present invention.
Figure 24B:
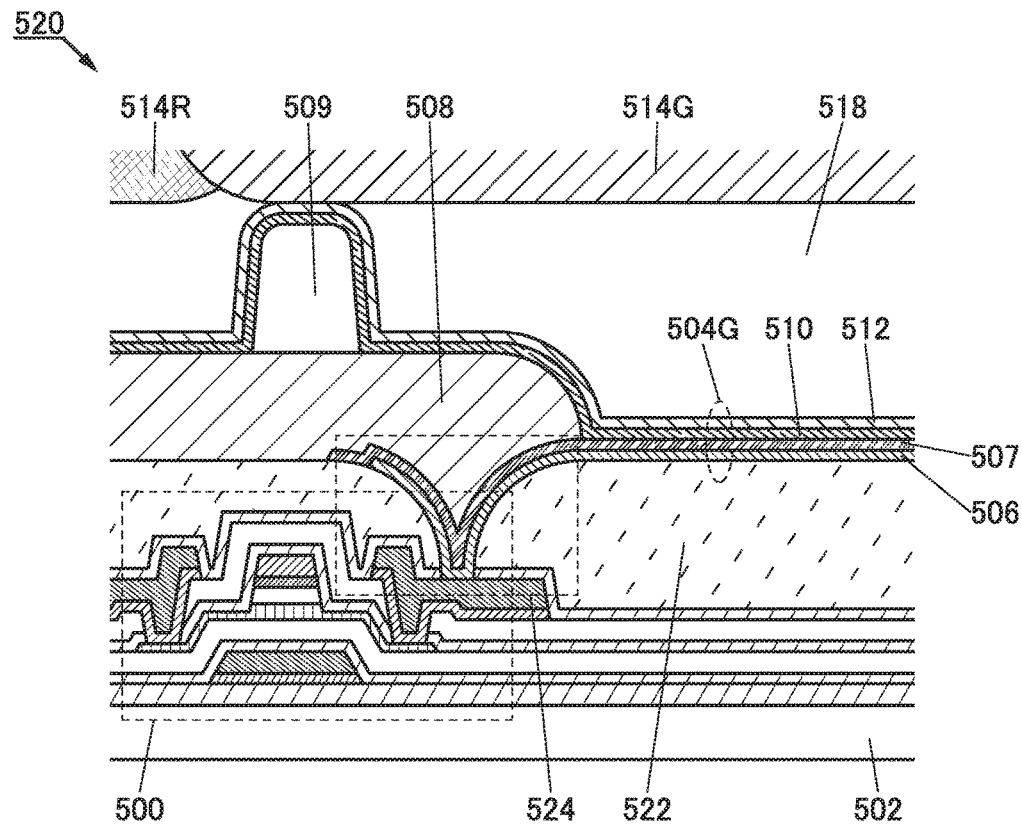

In FIG. 24A, a plurality of transistors 500 (also referred to as FET) are formed over a substrate 502, and the transistors 500 are electrically connected to light-emitting elements (504R, 504G, 504B, and 504W) each included in pixel of a light-emitting device. Specifically, the transistors 500 are electrically connected to conductors 506 in the respective light-emitting elements. Each light-emitting element includes the conductor 506, a conductor 507, a light-emitting layer 510, and a conductor 512. Note that a light-emitting element 504W is not necessarily provided. Note that FIG. 24B is an enlarged cross-sectional view of a region 520 in FIG. 24A.

Over each of the light-emitting elements, a coloring layer (514R, 514G, 514B, or 514W) is provided. FIG. 24A illustrates a structure in which the coloring layer is provided on a substrate 516, but the present invention is not limited to the structure. For example, the coloring layer may be provided on the substrate 502. In addition, a sealing film 518 is provided between the substrate 502 and the substrate 516. For example, for the sealing film 518, a glass material such as a glass frit, or a resin material such as a resin that is curable at room temperature (e.g., a two-component-mixture-type resin), a photocurable resin, or a thermosetting resin can be used.

Partitions 508 are provided between adjacent light-emitting elements to cover end portions of the conductor 506 and the conductor 507. A spacer 509 is provided over each partition 508. The conductor 506 has a region functioning as a reflective electrode and a region functioning as an anode of the light-emitting element. The conductor 507 has a region contributing to adjustment of the light path length of the light-emitting element. The light-emitting layer 510 is formed over the conductor 507, and the conductor 512 is formed over the light-emitting layer 510. The conductor 512 has a region functioning as a semi-transmissive and semi-reflective electrode and a region functioning as a cathode of the light-emitting element. The spacer 509 is provided between the light-emitting element and the coloring layer.

The light-emitting layer 510 may be common between the light-emitting elements. Alternatively, the light-emitting layer 510 may be provided per light-emitting element. The light-emitting element has a micro resonator (also called microcavity) structure in which light emitted from the light-emitting layer 510 is resonated with the conductor 506 and the conductor 512, so that light with different wavelengths can be narrowed and extracted even when the light-emitting layer 510 is used common between the light-emitting elements. Specifically, when the thickness of the conductor 507 provided below the light-emitting layer 510 is adjusted in each light-emitting elements, a desired emission spectrum can be obtained from the light-emitting layer 510, and light with high color purity can be emitted. Thus, with use of the structure illustrated in FIG. 24A, a separate coloring process is not needed, for example, and high definition can be easily achieved in some cases. Note that in the light-emitting device according to one embodiment of the present invention, light-emitting layers for different colors may be provided for the respective light-emitting elements.

Furthermore, the structure of the light-emitting device illustrated in FIG. 24A is such that light with different wavelengths is narrowed due to a microcavity structure and further narrowed by making the light pass through coloring layers, whereby light with only desired emission spectra is emitted. Thus, with a combination of the microcavity structure and the coloring layer, light emission with higher color purity can be obtained. Specifically, in the light-emitting element 504R, the light path length is adjusted so that red light emission is obtained, and red light is emitted through the coloring layer 514R toward the direction indicated by an arrow. In the light-emitting element 504G, the light path length is adjusted so that green light emission is obtained, and green light is emitted through the coloring layer 514G toward the direction indicated by an arrow. In the light-emitting element 504B, the light path length is adjusted so that blue light emission is obtained, and blue light is emitted through the coloring layer 514B toward the direction indicated by an arrow. In the light-emitting element 504W, the light path length is adjusted so that white light emission is obtained, and white light is emitted through the coloring layer 514W toward the direction indicated by an arrow.

A method for adjusting the light path length of each light-emitting element is not limited to the above. For example, the thickness of the light-emitting layer 510 may be adjusted to control the light path length.

The coloring layer (514R, 514G, or 514B) have a function of transmitting light in a particular wavelength range. For example, a red (R) coloring layer for transmitting light in a red wavelength range, a green (G) coloring layer for transmitting light in a green wavelength range, a blue (B) coloring layer for transmitting light in a blue wavelength range, or the like can be used. For the coloring layer 514W, an acrylic resin material with no pigment or the like may be used, for example. The coloring layer 514W is not necessarily provided. The coloring layer can be formed into a desired shape by a printing method, an inkjet method, a method using a photolithography step, or the like.

For the conductor 506, a metal with high reflectance (visible-light reflectance is higher than or equal to 40% and lower than or equal to 100%, preferably higher than or equal to 70% and lower than or equal to 100%) may be used, for example. For the conductor 506, a single layer of aluminum, silver or an alloy containing such metal materials (e.g., alloy of silver, palladium, and copper) or a stacked layer of the above materials may be used.

The conductor 507 can be formed using a conductive metal oxide, for example. As the conductive metal oxide, indium oxide, tin oxide, zinc oxide, indium tin oxide, indium zinc oxide, or a material in which silicon or tungsten is mixed with the metal oxide can be used. It is preferable to provide the conductor 507 because generation of an insulator between the conductor 506 and the light-emitting layer 510 formed later can be suppressed. Below the conductor 506, a conductive metal oxide used as the conductor 507 may be formed.

The conductor 512 is formed using a conductive material with reflectance and a light-transmitting conductive material, and the visible-light reflectance is higher than or equal to 20% and lower than or equal to 80%, preferably higher than or equal to 40% and lower than or equal to 70%. For formation of the conductor 512, for example, silver, magnesium, or an alloy containing these metal materials is formed to have a small thickness (e.g., greater than or equal to 1 nm and less than or equal to 10 nm), and then, a conductive metal oxide that can be used for the conductor 507 may be formed.

In the light-emitting device with the above-described structure, emission light is extracted on the substrate 516 side (top emission structure). Alternatively, the following structures may be employed: a structure in which light is extracted on the substrate 501 side where the transistor 500 is formed (bottom emission structure); or a structure in which light is extracted on both the substrate 501 side and the substrate 516 side (dual emission structure). In the case of the bottom emission structure, the coloring layer (514R, 514G, 514B, or 514W) is formed below the conductor 506, for example. Note that for the substrate where light is extracted, a light-transmitting substrate is used, and for a substrate where light is not extracted, a light-transmitting substrate and a light-blocking substrate can be used.

<Module>

A display module using a semiconductor device of one embodiment of the present invention is described below with reference to FIG. 25.

Figure 25:
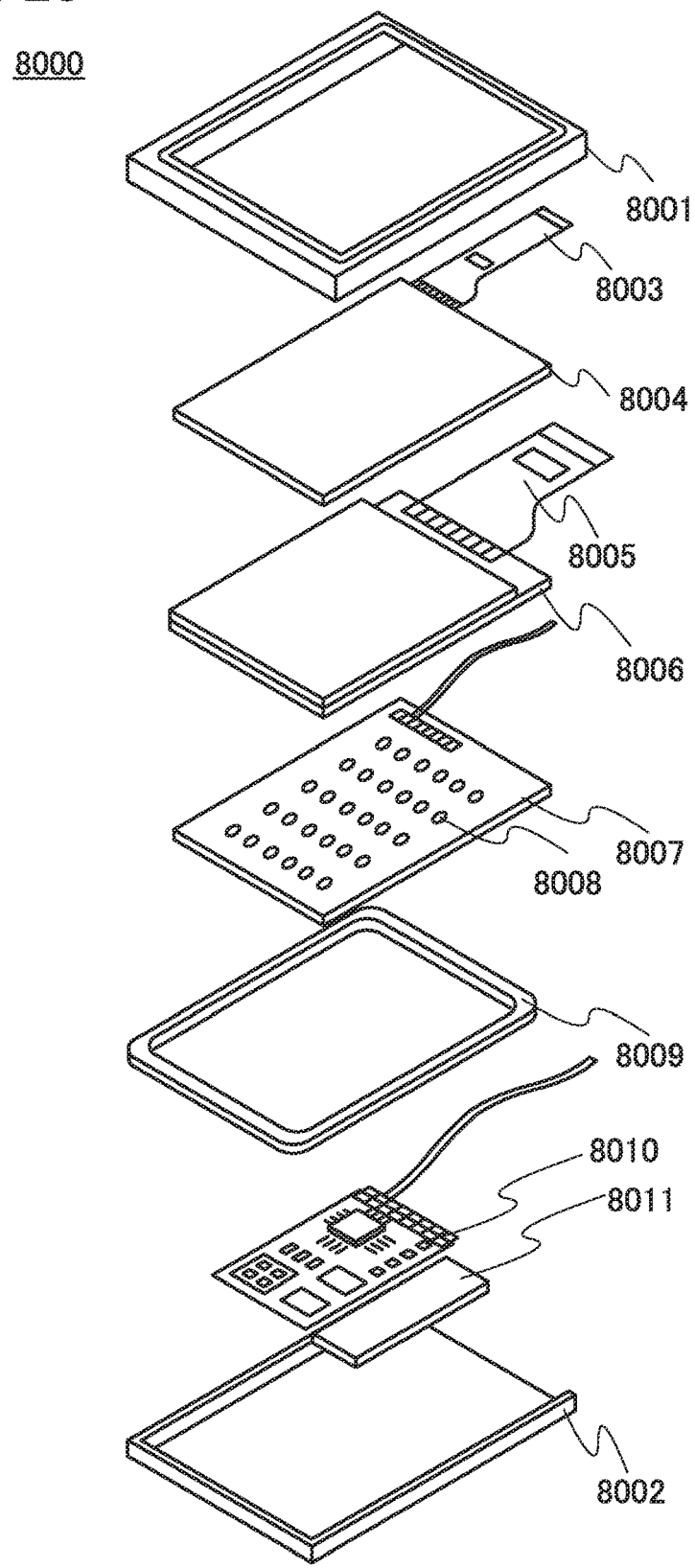
FIG. 25 illustrates a display module according to one embodiment of the present invention.

In a display module 8000 in FIG. 25, a touch panel 8004 connected to an FPC 8003, a cell 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for the cell 8006, for example.

The shapes and sizes of the upper cover 8001 and the lower cover 8002 can be changed as appropriate in accordance with the sizes of the touch panel 8004 and the cell 8006.

The touch panel 8004 can be a resistive touch panel or a capacitive touch panel and may be formed to overlap with the cell 8006. A counter substrate (sealing substrate) of the cell 8006 can have a touch panel function. A photosensor may be provided in each pixel of the cell 8006 so that an optical touch panel is obtained. An electrode for a touch sensor may be provided in each pixel of the cell 8006 so that a capacitive touch panel is obtained.

The backlight unit 8007 includes a light source 8008. The light source 8008 may be provided at an end portion of the backlight unit 8007 and a light diffusing plate may be used.

The frame 8009 may protect the cell 8006 and also function as an electromagnetic shield for blocking electromagnetic waves generated by the operation of the printed board 8010. The frame 8009 can function as a radiator plate.

The printed board 8010 has a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

<Circuit>

Examples of circuit configurations which can be achieved by using a semiconductor device of one embodiment of the present invention are shown below.

Figure 26A:
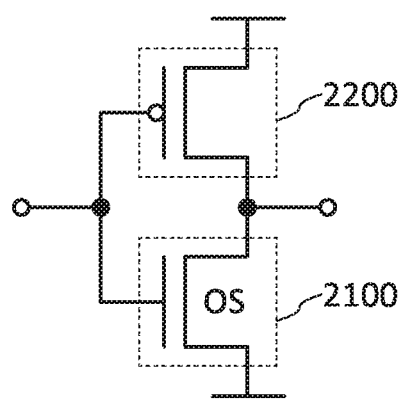
FIGS. 26A and 26B are each a circuit diagram of a semiconductor device according to one embodiment of the present invention.

A circuit diagram in FIG. 26A shows a configuration of a so-called CMOS inverter in which the p-channel transistor 2200 and the n-channel transistor 2100 are connected to each other in series and in which gates of them are connected to each other. The above-described transistor 150 may be used as the transistor 2200 and the transistor 2100.

Figure 26B:
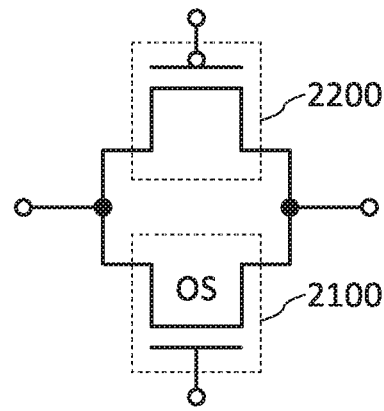

A circuit diagram in FIG. 26B shows a configuration in which sources of the transistors 2100 and 2200 are connected to each other and drains of the transistors 2100 and 2200 are connected to each other. With such a configuration, the transistors can function as a so-called CMOS analog switch.

Figure 27A:
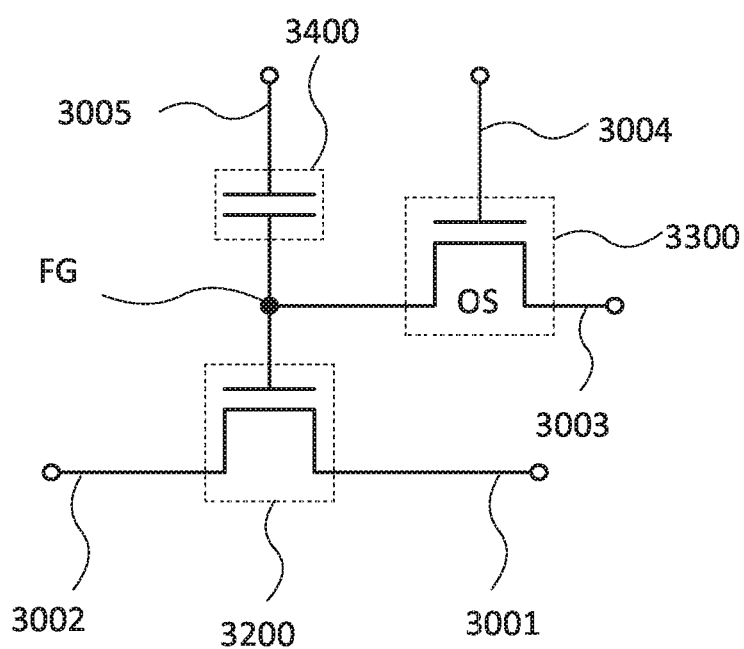
FIGS. 27A and 27B are each a circuit diagram of a memory device according to one embodiment of the present invention.
Figure 27B:
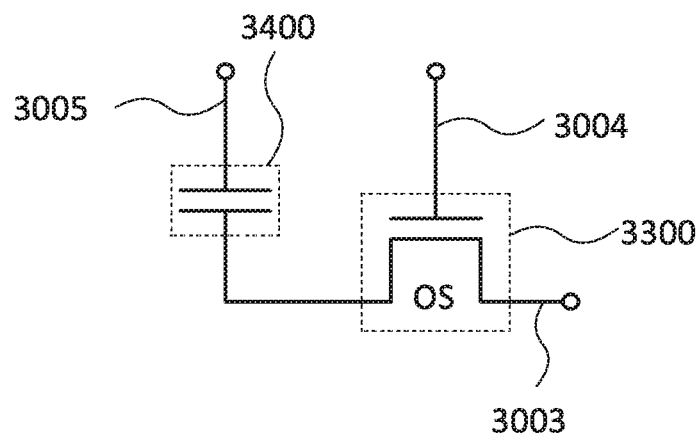

An example of a semiconductor device (memory device) which includes the transistor of one embodiment of the present invention, which can retain stored data even when not powered, and which has an unlimited number of write cycles is shown in FIGS. 27A and 27B.

The semiconductor device illustrated in FIG. 27A includes a transistor 3200 using a first semiconductor, a transistor 3300 using a second semiconductor, and a capacitor 3400. Note that the above-described transistor 150 can be used as the transistor 3300.

The transistor 3300 is a transistor using an oxide semiconductor, for example. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 27A, a first wiring 3001 is electrically connected to a source of the transistor 3200. A second wiring 3002 is electrically connected to a drain of the transistor 3200. A third wiring 3003 is electrically connected to one of the source and the drain of the transistor 3300. A fourth wiring 3004 is electrically connected to the gate of the transistor 3300. The gate of the transistor 3200 and the other of the source and the drain of the transistor 3300 are electrically connected to the one electrode of the capacitor 3400. A fifth wiring 3005 is electrically connected to the other electrode of the capacitor 3400. The above-described capacitor 160 can be used as the capacitor 3400.

The semiconductor device in FIG. 27A has a feature that the potential of the gate of the transistor 3200 can be retained, and thus enables writing, retaining, and reading of data as follows.

Writing and holding of data will be described. First, the potential of the fourth wiring 3004 is set to a potential at which the transistor 3300 is turned on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined charge is supplied to the gate of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge is held at the node FG (retaining).

Since the off-state current of the transistor 3300 is extremely low, the charge of the node FG is retained for a long time.

Next, reading of data will be described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the node FG. This is because in the case of using an n-channel transistor as the transistor 3200, an apparent threshold voltage $V_{th\_H}$ at the time when the high-level charge is given to the gate of the transistor 3200 is lower than an apparent threshold voltage $V_{th\_L}$ at the time when the low-level charge is given to the gate of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the fifth wiring 3005 is $V_0$ ($>V_{th\_H}$), the transistor 3200 is turned on. On the other hand, in the case where the low-level charge is supplied to the node FG in writing, even when the potential of the fifth wiring 3005 is $V_0$ ($<V_{th\_L}$), the transistor 3200 remains off. Thus, the data retained in the node FG can be read by determining the potential of the second wiring 3002.

Note that in the case where memory cells are arrayed, it is necessary that data of a desired memory cell is read in read operation. In the case where data of the other memory cells is not read, the fifth wiring 3005 may be supplied with a potential at which the transistor 3200 is turned off regardless of the charge supplied to the node FG, that is, a potential lower than $V_{th\_H}$. Alternatively, the fifth wiring 3005 may be supplied with a potential at which the transistor 3200 is turned on regardless of the charge supplied to the node FG, that is, a potential higher than $V_{th\_L}$.

The semiconductor device in FIG. 27B is different form the semiconductor device in FIG. 27A in that the transistor 3200 is not provided. Also in this case, writing and retaining operation of data can be performed in a manner similar to the semiconductor device in FIG. 27A.

Reading of data in the semiconductor device in FIG. 27B is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having an extremely low off-state current, the semiconductor device described above can retain stored data for a long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Further, in the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

<RF Tag>

An RF tag including the transistor or the memory device is described below with reference to FIG. 28.

The RF tag of one embodiment of the present invention includes a memory circuit, stores data in the memory circuit, and transmits and receives data to/from the outside by using contactless means, for example, wireless communication. With these features, the RF tag can be used for an individual authentication system in which an object or the like is recognized by reading the individual information, for example. Note that the RFID tag is required to have high reliability in order to be used for this purpose.

A configuration of the RF tag will be described with reference to FIG. 28. FIG. 28 is a block diagram showing a configuration example of an RFID tag.

Figure 28:
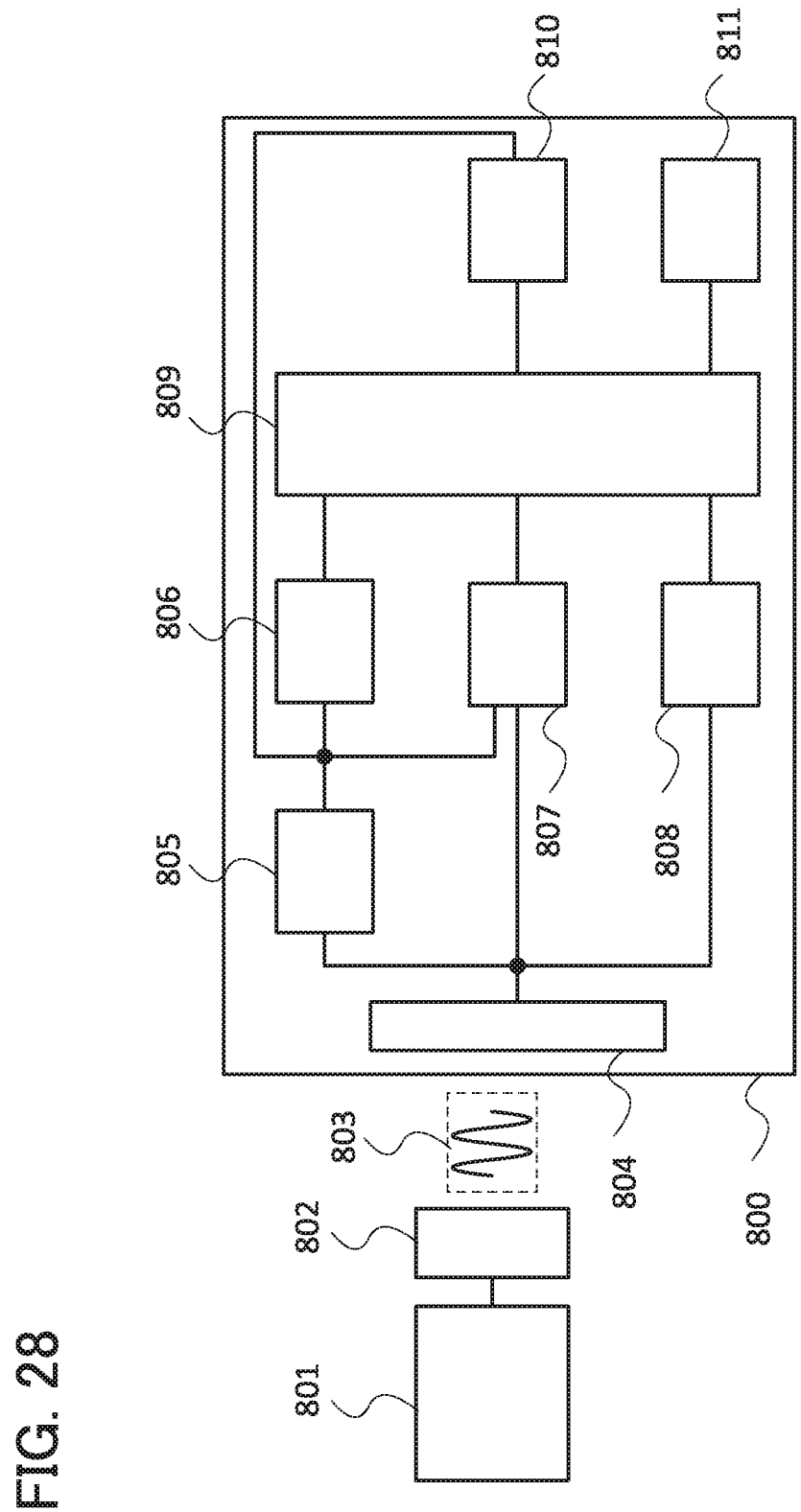
FIG. 28 is a block diagram of an RF tag according to one embodiment of the present invention.
Figure 29A:
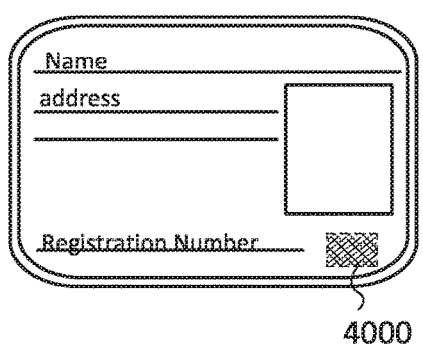
FIGS. 29A to 29F are views illustrating application examples of an RF tag according to one embodiment of the present invention.
Figure 29B:
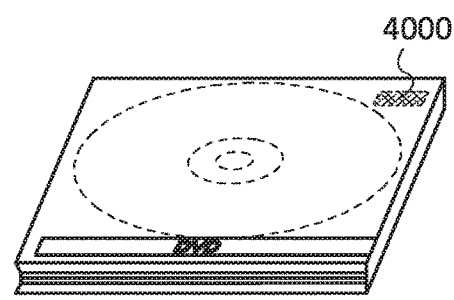
Figure 29C:
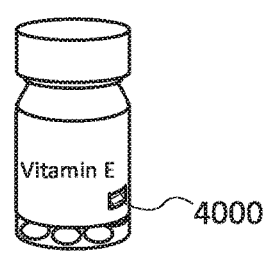
Figure 29D:
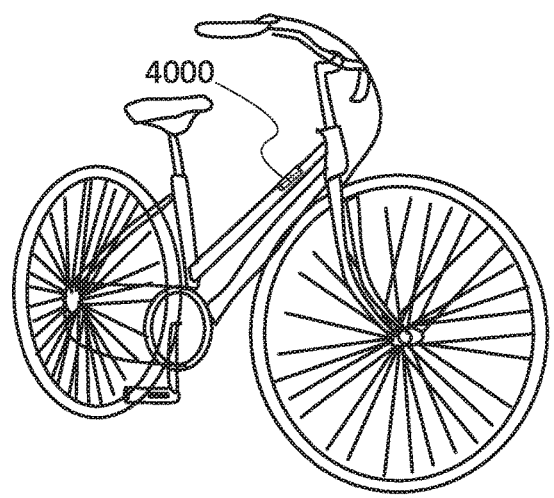
Figure 29E:
Figure 29F:
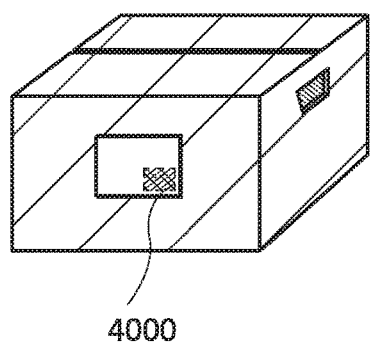

As shown in FIG. 28, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A semiconductor of a transistor having a rectifying function included in the demodulation circuit 807 may be a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method by which a pair of coils is provided so as to be faced with each other and communicates with each other by mutual induction, an electromagnetic induction method by which communication is performed using an induction field, and an electric wave method by which communication is performed using an electric wave. Any of these methods can be used in the RF tag 800.

Next, a structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Further, the ROM 811 stores an identification number (ID) or the like and outputs it in accordance with processing.

Note that the decision whether each circuit described above is provided or not can be made as appropriate as needed.

Here, the above-described memory device can be used as the memory circuit 810. Since the memory device of one embodiment of the present invention can retain data even when not powered, the memory device is suitable for an RF tag. Further, the memory device of one embodiment of the present invention needs power (voltage) needed for data writing lower than that needed in a conventional nonvolatile memory; thus, it is possible to prevent a difference between the maximum communication range in data reading and that in data writing. Furthermore, it is possible to suppress malfunction or incorrect writing which is caused by power shortage in data writing.

Since the memory device of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers to only good products to be shipped. Thus, the identification numbers of the shipped products are in series and customer management corresponding to the shipped products is easily performed.

<Application Examples of RF Tag>

Application examples of the RF tag of one embodiment of the present invention are shown below with reference to FIGS. 29A to 29F. The RF tag is widely used and can be provided for, for example, products such as bills, coins, securities, bearer bonds, documents (e.g., driver's licenses or resident's cards, see FIG. 29A), packaging containers (e.g., wrapping paper or bottles, see FIG. 29C), recording media (e.g., DVD software or video tapes, see FIG. 29B), vehicles (e.g., bicycles, see FIG. 29D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 29E and 29F).

An RF tag 4000 of one embodiment of the present invention is fixed to products by being attached to a surface thereof or embedded therein. For example, the RFID tag 4000 is fixed to each product by being embedded in paper of a book, or embedded in an organic resin of a package. Since the RF tag 4000 can be reduced in size, thickness, and weight, it can be fixed to a product without spoiling the design of the product. Furthermore, bills, coins, securities, bearer bonds, documents, or the like can have identification functions by being provided with the RF tag 4000 of one embodiment of the present invention, and the identification functions can be utilized to prevent counterfeits. Moreover, the efficiency of a system such as an inspection system can be improved by providing the RF tag 4000 of one embodiment of the present invention for packaging containers, recording media, personal belongings, foods, clothing, household goods, electronic devices, or the like. Vehicles can also have higher security against theft or the like by being provided with the RF tag 4000 of one embodiment of the present invention.

As described above, the RF tag of one embodiment of the present invention can be used for the above-described purposes.

<CPU>

A CPU including a semiconductor device such as any of the above-described transistors or the above-described memory device is described below.

Figure 30:
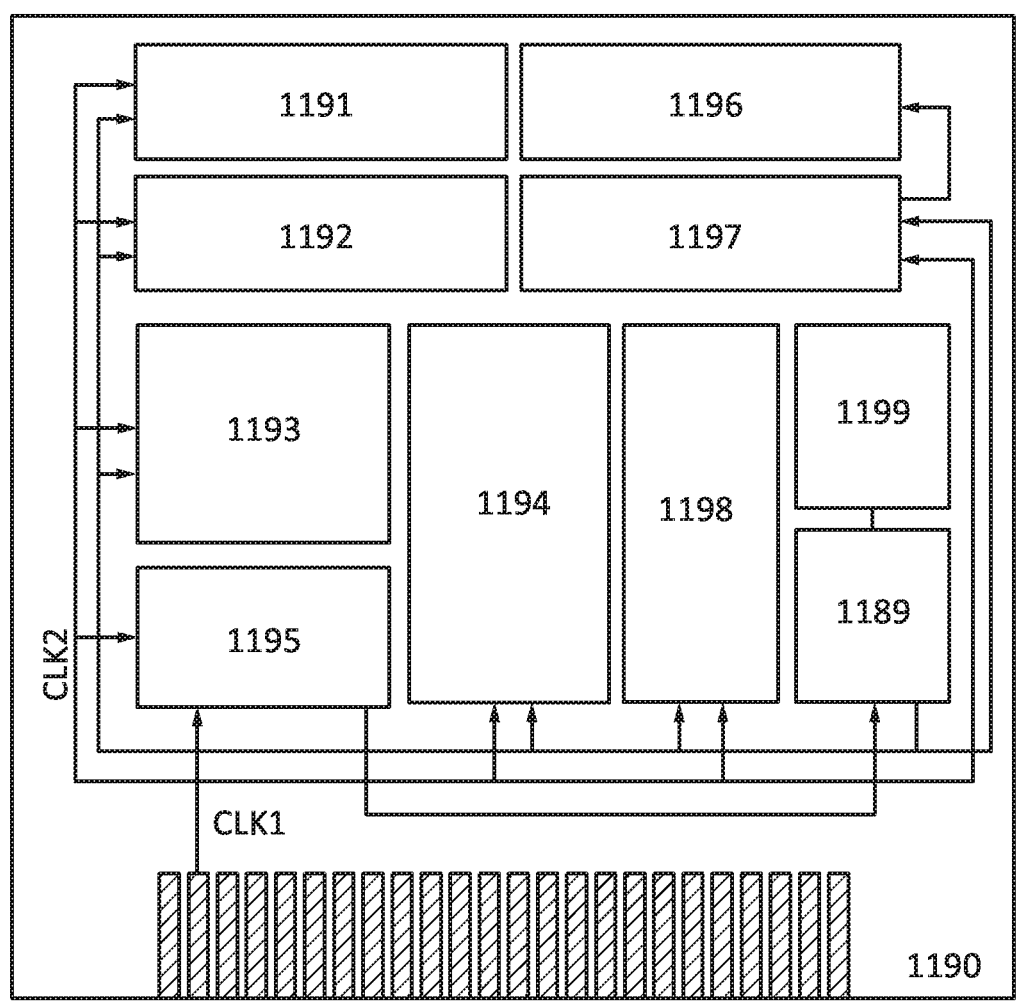
FIG. 30 is a block diagram illustrating a CPU according to one embodiment of the present invention.

FIG. 30 is a block diagram illustrating a configuration example of a CPU including any of the above-described transistors as a component.

The CPU illustrated in FIG. 30 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 30 is just an example in which the configuration is simplified, and an actual CPU may have a variety of configurations depending on the application. For example, the CPU may have the following configuration: a structure including the CPU illustrated in FIG. 30 or an arithmetic circuit is considered as one core; a plurality of the cores is included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 30, a memory cell is provided in the register 1196. For the memory cell of the register 1196, the above-described transistor 150, the above-described capacitor 160, or the like can be used.

In the CPU in FIG. 30, the register controller 1197 selects operation of holding data in the register 1196, in response to an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

Figure 31:
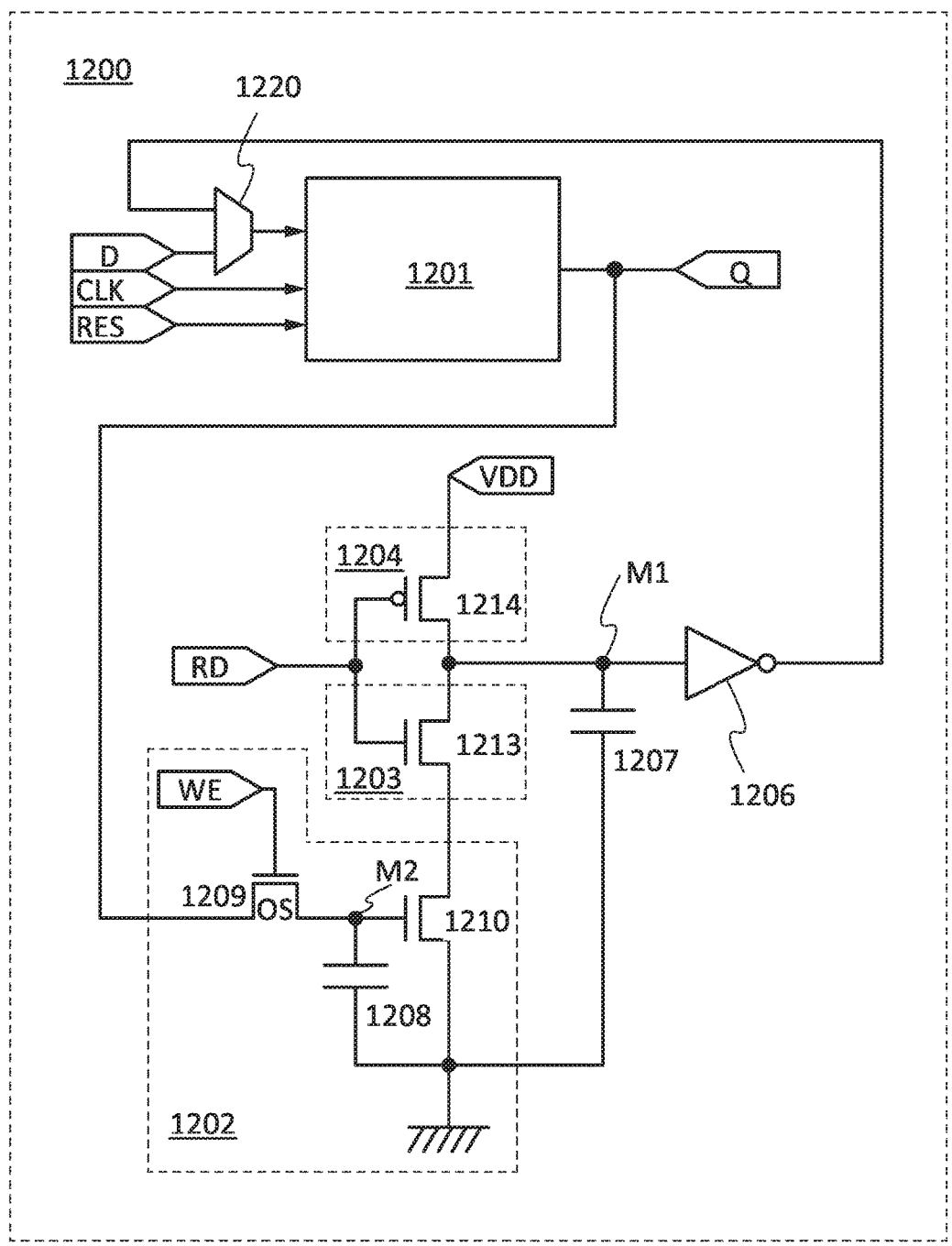
FIG. 31 is a circuit diagram of a memory element according to one embodiment of the present invention.

FIG. 31 is an example of a circuit diagram of a memory element 1200 that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes can be supplied with a low power supply potential (e.g., GND) or a high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal. WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 31 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 31, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 31, the transistors included in the memory element 1200 except for the transistor 1209 can each be a transistor in which a channel is formed in a film or the substrate 1190 including a semiconductor other than an oxide semiconductor. For example, the transistor may be a transistor in which a channel is formed in a silicon layer or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor can be included besides the transistor 1209, and a transistor in which a channel is formed in a layer or the substrate 1190 including a semiconductor other than an oxide semiconductor can be used for the rest of the transistors.

As the circuit 1201 in FIG. 31, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Further, shortly after the supply of the power supply voltage is restarted, the memory element can be returned to the same state as that before the power supply is stopped. Therefore, the power supply can be stopped even for a short time in the processor or one or a plurality of logic circuits included in the processor. Accordingly, power consumption can be suppressed.

Although the memory element 1200 is used in a CPU, the memory element 1200 can also be used in an LSI such as a digital signal processor (DSP), a custom LSI, or a programmable logic device (PLD), and a radio frequency identification (RF-ID).

<Electronic Device>

The semiconductor device of one embodiment of the present invention can be used for display devices, personal computers, image reproducing devices provided with recording media (typically, devices which reproduce the content of recording media such as digital versatile discs (DVDs) and have displays for displaying the reproduced images), or the like. Other than the above, as an electronic devices which can use the semiconductor device according to an embodiment of the present invention, mobile phones, portable game machines, portable information terminals, e-book readers, video cameras, digital still cameras, goggle-type displays (head mounted displays), navigation systems, audio reproducing devices (e.g., car audio systems and digital audio players), copiers, facsimiles, printers, multi-function printers, automated teller machines (ATM), vending machines, and the like can be given. Specific examples of these electronic devices are shown in FIGS. 32A to 32F.

Figure 32A:
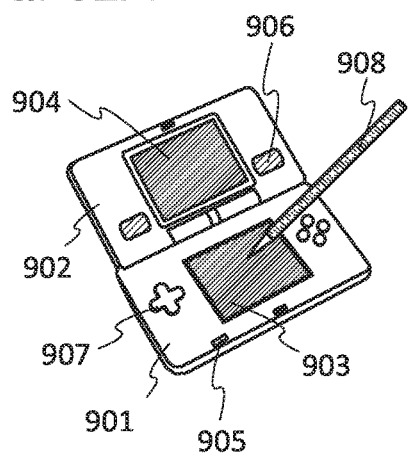
FIGS. 32A to 32F are views each illustrating an electronic device according to one embodiment of the present invention.

FIG. 32A illustrates a portable game machine including a housing 901, a housing 902, a display portion 903, a display portion 904, a microphone 905, a speaker 906, an operation key 907, a stylus 908, and the like. Although the portable game machine in FIG. 32A has the two display portions 903 and 904, the number of display portions included in a portable game machine is not limited to this.

Figure 32B:
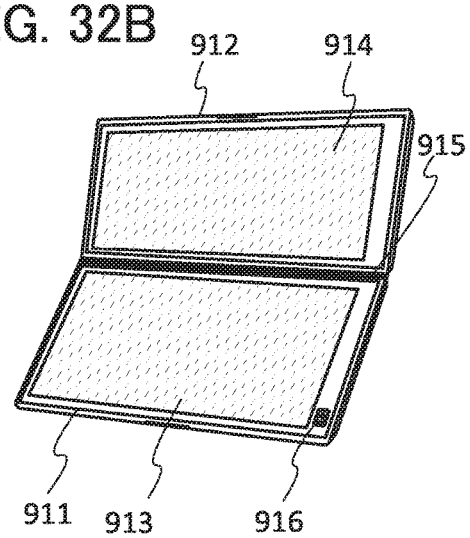

FIG. 32B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by provision of a touch panel in a display device. Alternatively, the position input function can be added by provision of a photoelectric conversion element called a photosensor in a pixel portion of a display device.

Figure 32C:
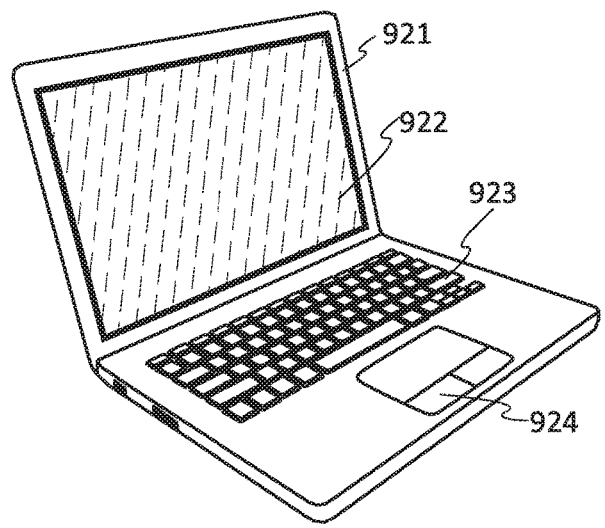

FIG. 32C illustrates a laptop personal computer, which includes a housing 921, a display portion 922, a keyboard 923, a pointing device 924, and the like.

Figure 32D:
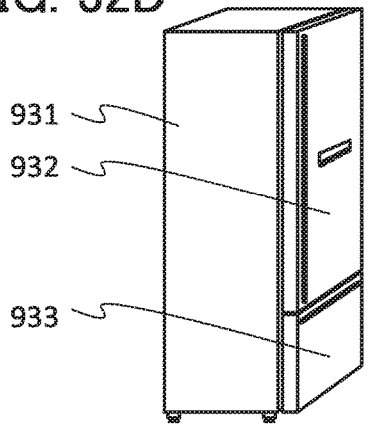

FIG. 32D illustrates an electric refrigerator-freezer including a housing 931, a door for a refrigerator 932, a door for a freezer 933, and the like.

Figure 32E:
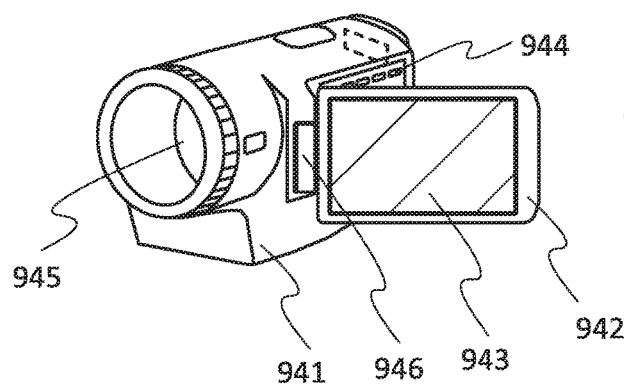

FIG. 32E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 32F:
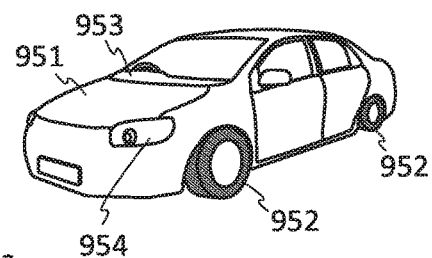

FIG. 32F illustrates an ordinary vehicle including a car body 951, wheels 952, a dashboard 953, lights 954, and the like.

<Electronic Device Having Curved Display Region or Light-Emitting Region>

Electronic devices having a curved display region or light-emitting region, which are examples of electronic devices according to one embodiment of the present invention, will be described with reference to FIGS. 33A-1, A-2, A-3, B-1, B-2, C-1, and C-2. Here, information devices, in particular, portable information devices (portable devices) are described as examples of the electronic devices. The portable information devices include, for example, mobile phone devices (e.g., phablets and smartphones) and tablet terminals (slate PCs).

FIG. 33A-1 is a perspective view illustrating an external shape of a portable device 1300A. FIG. 33A-2 is a top view illustrating the portable device 1300A. FIG. 33A-3 illustrates a usage state of the portable device 1300A.

Figures 1, 33B:
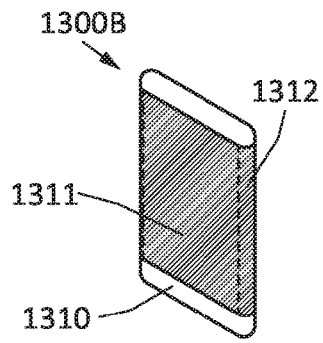
Figures 2, 33B:
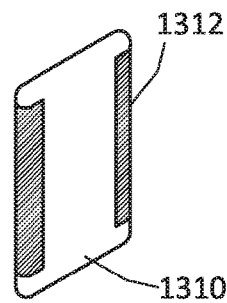

FIGS. 33B-1 and 33B-2 are perspective views illustrating the outward form of a portable device 1300B.

Figures 1, 33C:
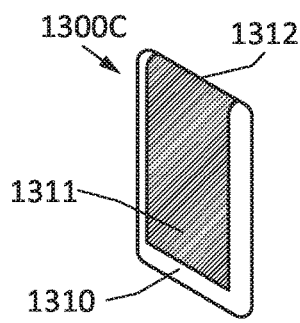
Figures 2, 33C:
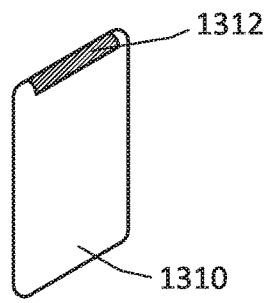

FIGS. 33C-1 and 33C-2 are perspective views illustrating the outward form of a portable device 1300C.

<Portable Device>

The portable device 1300A has one or more functions of a telephone, email creating and reading, notebook, information browsing, and the like.

A display portion of the portable device 1300A is provided along a plurality of surfaces of a housing. For example, the display portion may be provided by placing a flexible display device along the inside of the housing. Thus, text data, image data, or the like can be displayed on a first region 1311 and/or a second region 1312.

For example, images used for three operations can be displayed on the first region 1311 (see FIG. 33A-1). Furthermore, character information and the like can be displayed on the second region 1312 as indicated by dashed rectangles in the drawing (see FIG. 33A-2).

In the case where the second region 1312 is on the upper portion of the portable device 1300A, a user can easily see text data or image data displayed on the second region 1312 of the portable device 1300A while the portable device 1300A is placed in a breast pocket of the user's clothes (see FIG. 33A-3). For example, the user can see the phone number, name, and the like of the caller of an incoming call, from above the portable device 1300A.

The portable device 1300A may include an input device or the like between the display device and the housing, in the display device, or over the housing. As the input device, for example, a touch sensor, a light sensor, or an ultrasonic sensor may be used. In the case where the input device is provided between the display device and the housing or over the housing, a touch panel may be, for example, a matrix switch type, a resistive type, an ultrasonic surface acoustic wave type, an infrared type, electromagnetic induction type, or an electrostatic capacitance type. In the case where the input device is provided in the display device, an in-cell sensor, an on-cell sensor, or the like may be used.

Note that the portable device 1300A can be provided with a vibration sensor or the like and a memory device that stores a program for shifting a mode into an incoming call rejection mode based on vibration sensed by the vibration sensor or the like. Thus, the user can shift the mode into the incoming call rejection mode by tapping the portable device 1300A over his/her clothes to apply vibration.

The portable device 1300B includes a display portion including the first region 1311 and the second region 1312 and a housing 1310 which supports the display portion.

The housing 1310 has a plurality of bend portions, and the longest bend portion in the housing 1310 is between the first region 1311 and the second region 1312.

The portable device 1300B can be used with the second region 1312 provided along the longest bend portion facing sideward.

The portable device 1300C includes a display portion including the first region 1311 and the second region 1312 and a housing 1310 which supports the display portion.

The housing 1310 has a plurality of bend portions, and the second longest bend portion in the housing 1310 is between the first region 1311 and the second region 1312.

The portable device 1300C can be used with the second region 1312 facing upward.

Note that a content described in each embodiment, a part and another part can be combined, or the part can be replaced with another part, as appropriate. In each embodiment, a content described in the embodiment is a content described with reference to a variety of diagrams or a content described with a text disclosed in this specification.

Furthermore, a part of a drawing, another part of the drawing, and a part of another drawing are combined as appropriate, whereby more drawings can be made.

Note that contents that are not specified in any drawing or text in the specification can be excluded from one embodiment of the invention. Alternatively, when the range of a value that is defined by the maximum and minimum values is described, part of the range is appropriately narrowed and part of the range is removed, whereby one embodiment of the invention can be constituted excluding part of the range can be constructed. In this manner, it is possible to specify the technical scope of one embodiment of the present invention so that a conventional technology is excluded, for example.

As a specific example, a diagram of a circuit including a first transistor to a fifth transistor is illustrated. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, a description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than or equal to 10 V but is not 9 V in the invention. Note that even when the description "a value is preferably in a certain range" is given, the value is not limited to the description. In other words, a description of a value that includes a term "preferable", "preferably", or the like does not necessarily limit the value.

As another specific example, a description "a voltage is preferred to be 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, a description "a film is an insulating film" is given to describe properties of a material. In that case, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, the description of a stacked structure, "a film is provided between an A film and a B film" is given. In that case, for example, it can be specified that the case where the film is a stacked film of four or more layers is excluded from the invention. For example, it can be specified that the case where a conductive film is provided between the A film and the film is excluded from the invention.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Further, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, part of a diagram or a text described for an item in one embodiment can be taken out to constitute one embodiment of the invention. Thus, in the case where a diagram or a text related to a certain part is described, a content taken out from a diagram or a text of the certain part is also disclosed as one embodiment of the invention and can constitute one embodiment of the invention. The embodiment of the present invention is clear. Therefore, for example, part of a diagram or a text including one or more of active elements (e.g., transistors or diodes), wirings, passive elements (e.g., capacitors or resistors), conductors, insulators, semiconductors, organic materials, inorganic materials, components, devices, operating methods, manufacturing methods, or the like can be taken out to constitute one embodiment of the invention. For example, from a circuit diagram in which N circuit elements (e.g., transistors or capacitors; N is an integer) are provided, it is possible to constitute one embodiment of the invention by taking out ill circuit elements (e.g., transistors or capacitors; M is an integer, where M<N). As another example, it is possible to constitute one embodiment of the invention by taking out M layers (M is an integer, where M<N) from a cross-sectional view in which N layers (N is an integer) are provided. As another example, it is possible to constitute one embodiment of the invention by taking out M elements (M is an integer, where M<N) from a flow chart in which N elements (N is an integer) are provided. For another example, it is possible to take out some given elements from a sentence "A includes B, C, D, E, or F" and constitute one embodiment of the invention, for example, "A includes B and E", "A includes E and F", "A includes C, F, and F", or "A includes B, C, D, and E".

Note that in the case where at least one specific example is described in a diagram or a text described in one embodiment in this specification and the like, it will be readily appreciated by those skilled in the art that a broader concept of the specific example can be derived. Therefore, in the case where at least one specific example is described in the diagram or the text described in one embodiment, a broader concept of the specific example is disclosed as one embodiment of the invention, and one embodiment of the invention can be constituted. The embodiment of the present invention is clear.

Note that in this specification and the like, a content described in at least a diagram (which may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted. The embodiment of the present invention is clear.

EXAMPLE 1

In this example, cross-sectional shapes of a semiconductor device according to one embodiment of the present invention were examined with cross-sectional TEM images.

Figure 37A:
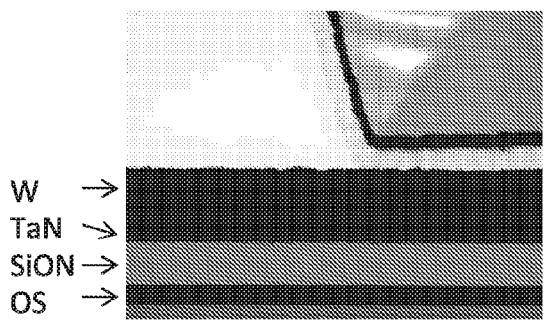
FIGS. 37A to 37E are cross-sectional. TEM images of samples and a flow chart.
Figure 37B:
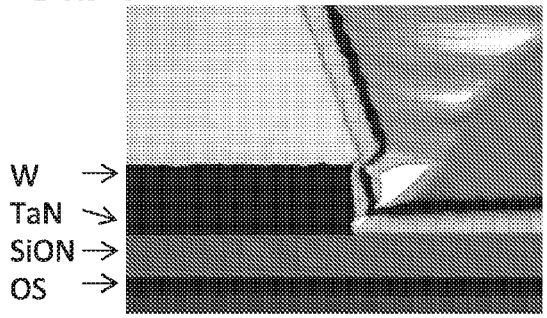

A method for forming a sample is described below with reference to FIGS. 37A to 37E. FIGS. 37A to 37D are each a cross-sectional TEM image of the sample. FIG. 37E is a flow chart of the method for forming the sample.

First, a glass substrate was prepared. Next, a 100-nm-thick silicon nitride film was deposited over the glass substrate by a PECVD method. Next, a 400-nm-thick silicon oxynitride film was deposited over the silicon nitride film by a PECVD method. Next, a 50-nm-thick oxide semiconductor (also referred to as OS) film was deposited over the silicon oxynitride film by a sputtering method. Next, a 100-nm-thick silicon oxynitride (also referred to as SiON) film was deposited over the oxide semiconductor film by a PECVD method. Next, a 30-nm-thick tantalum nitride film was deposited over the silicon oxynitride film by a sputtering method. Next, a 150-nm-thick tungsten film was deposited over the tantalum nitride film by a sputtering method.

Note that in the deposition of the oxide semiconductor film, a target with an atomic ratio of In, Ga, and Zn that is 5:5:6 was used.

Next, a resist mask was formed over the tungsten film (see a step S101 in FIG. 37E). A cross-sectional TEM image of the sample at this step is shown in FIG. 37A.

Next, the tungsten film and a tantalum nitride film were partly etched with use of the resist mask (see a step S102 in FIG. 37E). A cross-sectional TEM image of the sample at this step is shown in FIG. 37B.

The etching step was divided into three stages. At a first stage, the tungsten film was etched at a pressure of 0.6 Pa with use of a chlorine gas, a sulfur hexafluoride gas, and an oxygen gas at flow rates of 160 sccm, 320 sccm, and 80 sccm, respectively, under such a condition that a power of 250 W (13.56 MHz) was applied on the sample side, and a power of 9000 W (13.56 MHz) was applied to a coil-shaped electrode facing the sample. In this stage, the etching time was adjusted such that the tungsten film was not completely etched and the tantalum nitride film was not exposed.

At a second stage, the rest of tungsten film was etched at a pressure of 0.6 Pa with use of a chlorine gas, a sulfur hexafluoride gas, and an oxygen gas at flow rates of 320 sccm, 160 sccm, and 240 sccm, respectively, under such a condition that a power of 1000 W (13.56 MHz) was applied on the sample side, and a power of 9000 W (13.56 MHz) was applied to the coil-shaped electrode facing the sample. In the second stage, the etching rate of the tantalum nitride film was lower than that of the tungsten film; accordingly, a variation in the etching amount in the sample plane can be suppressed.

At a third stage, the tantalum nitride film was etched at a pressure of 3.0 Pa with use of a chlorine gas and a sulfur hexafluoride gas at flow rates of 540 sccm and 540 sccm, respectively, under such a condition that a power of 3000 W (13.56 MHz) was applied to the coil-shaped electrode facing the sample. In the third stage, the etching rate of the silicon oxynitride film was lower than that of the tantalum nitride; accordingly, a variation in the etching amount in the sample plane can be suppressed. In each of the three etching stages, the temperature of the sample electrode was 80° C.

As described above, the tungsten film and the tantalum nitride film were partly etched.

Next, the silicon oxynitride film was partly etched with use of the resist mask, the tungsten film, and the tantalum nitride film as masks, and the tungsten film and the tantalum nitride film were processed to have end portions that were tapered (see a step S103 in FIG. 37E). A cross-sectional TEM image of the sample at this step is shown in FIG. 37C.

The etching of the silicon oxynitride film was performed at a pressure of 0.8 Pa with use of a carbon tetrafluoride gas and an oxygen gas at flow rates of 240 sccm and 160 sccm, respectively, under such a condition that a power of 1000 W (13.56 MHz) was applied on the sample side and a power of 7000 W (13.56 MHz) was applied to the coil-shaped electrode facing the sample. Under this condition, the etching rate of the oxide semiconductor film was lower than that of the silicon oxynitride film; accordingly, a variation in the etching amount in the sample plane can be reduced. In this etching step, the temperature of the sample electrode was 10° C.

Figure 37C:
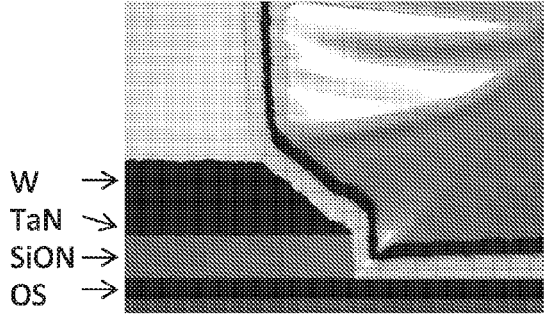

In FIG. 37C, the taper angle formed between an upper surface of the tantalum nitride film and a side surface of the tungsten film was approximately 40°. The taper angle formed between an upper surface of the silicon oxynitride film and a side surface of the tantalum nitride film was approximately 31°. The taper angle formed between an upper surface of the oxide semiconductor film and a side surface of the silicon oxynitride film was approximately 84°.

The cross-sectional shape shown in FIG. 37C corresponds to the cross-sectional shape illustrated in FIG. 16. Specifically, the silicon oxynitride film in FIG. 37C corresponds to the insulator 112 illustrated in FIG. 16. The tantalum nitride film shown in FIG. 37C corresponds to the conductor 114a illustrated in FIG. 16. The tungsten film shown in FIG. 37C corresponds to the conductor 114b illustrated in FIG. 16.

The sample in FIG. 37C was subjected to such a treatment that a power of 1000 W (13.56 MHz) was applied on the sample side and a power of 7000 W (13.56 MHz) was applied to the coil-shaped electrode facing the sample for 60 seconds at a pressure of 0.8 Pa, with use of a carbon tetrafluoride gas and an oxygen gas at flow rates of 240 sccm and 160 sccm, respectively, whereby the silicon oxynitride film was etched. In this condition, the etching rate of the oxide semiconductor film was lower than that of the silicon oxynitride film; accordingly a variation in the etching amount in the sample plane can be suppressed. Note that in this etching, the temperature of the sample electrode was 10° C.

From the relation of the etching rates of the silicon oxynitride film, the tantalum nitride film, and the tungsten film, the end portion of the silicon oxynitride film has a circular arc shape, and the end portion of the tantalum nitride film extends beyond the end portion of the tungsten film (see a step S104 in FIG. 37E).

Then, a 100-nm-thick silicon nitride film and a 300-nm-thick silicon oxynitride film were deposited. A cross-sectional TEM image of the sample in this state is shown in FIG. 37D.

Figure 37D:
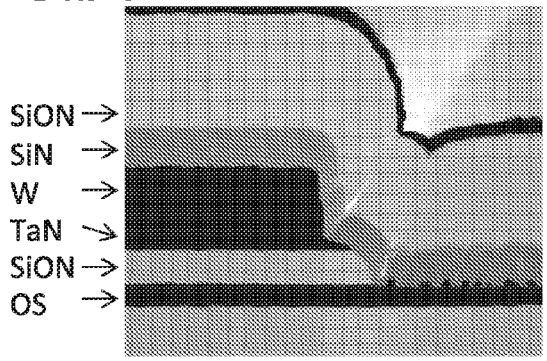
Figure 37E:
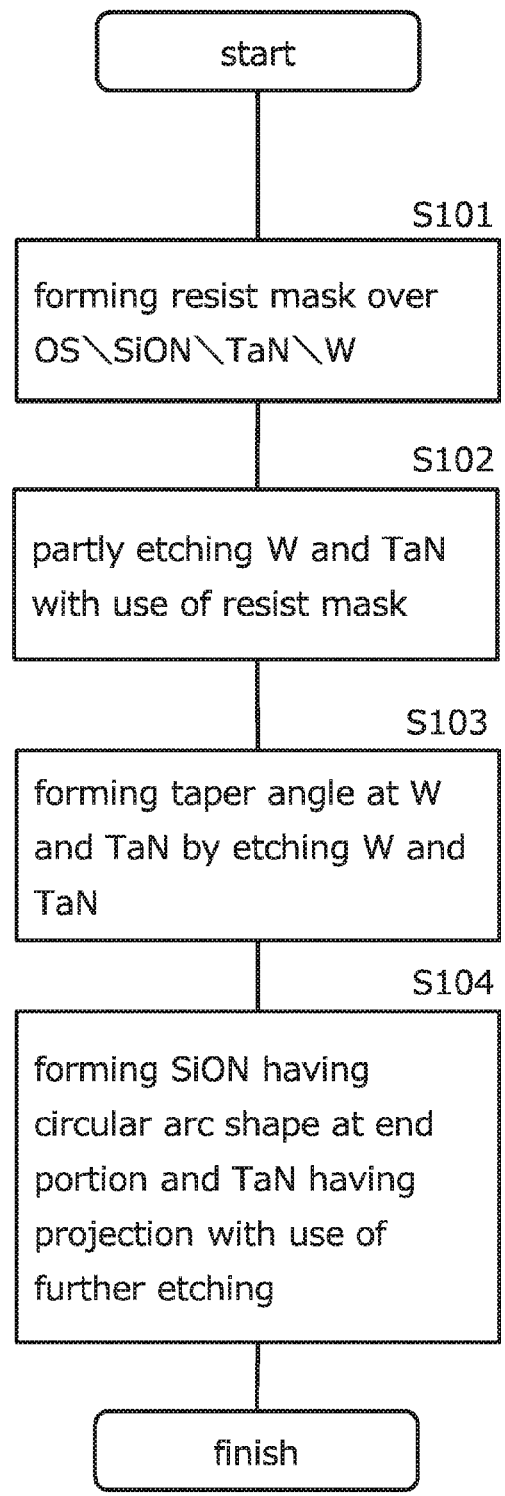

In FIG. 37D, the taper angle formed between the upper surface of the tantalum nitride film and the side surface of the tungsten film was approximately 82°. The taper angle formed between the upper surface of the silicon oxynitride film and the side surface of the tantalum nitride film was approximately 23°. The taper angle formed between the upper surface of the oxide semiconductor film and the side surface of the silicon oxynitride film was approximately 55°.

This application is based on Japanese Patent Application serial no. 2014-020542 filed with Japan Patent Office on Feb. 5, 2014, and Japanese Patent Application serial no. 2014-050588 filed with Japan Patent Office on Mar. 13, 2014, the entire contents of which are hereby incorporated by reference.

What is claimed is:
1. A semiconductor device comprising:
a first conductor and a second conductor;
a first insulator in contact with a top surface of the first conductor and a top surface of the second conductor;
a second insulator over the first insulator;
an oxide semiconductor overlapping with the first conductor with the first insulator and the second insulator interposed therebetween;
a third insulator over the oxide semiconductor;
a third conductor overlapping with the oxide semiconductor with the third insulator interposed therebetween;
a fourth insulator over and in contact with the third conductor, a side surface of the third insulator, the oxide semiconductor, and the first insulator;
a fifth insulator over the fourth insulator;
a fourth conductor in contact with the oxide semiconductor;
a fifth conductor in contact with the oxide semiconductor; and
a sixth conductor overlapping with the second conductor with the first insulator and the fourth insulator interposed therebetween,
wherein the second insulator has an opening,
wherein the fourth insulator is in direct contact with a side surface of the second insulator, and
wherein the fourth insulator comprises a nitride insulating film.

2. The semiconductor device according to claim 1, wherein the nitride insulating film contains hydrogen.

3. The semiconductor device according to claim 1,
wherein the oxide semiconductor includes a first region in contact with the third insulator, and a second region and a third region that are in contact with the fourth insulator,
wherein the second region and the third region each include a region with lower resistance than that of the first region,
wherein the fourth conductor is in contact with the oxide semiconductor in the second region, and
wherein the fifth conductor is in contact with the oxide semiconductor in the third region.

4. The semiconductor device according to claim 1,
wherein the oxide semiconductor includes a first oxide semiconductor and a second oxide semiconductor,
wherein the second oxide semiconductor is over and in contact with the first oxide semiconductor, and
wherein in a region where the fourth conductor overlaps with the oxide semiconductor, the first oxide semiconductor has higher conductivity than the second oxide semiconductor.

5. The semiconductor device according to claim 1,
wherein the oxide semiconductor includes a first oxide semiconductor and a second oxide semiconductor,
wherein the second oxide semiconductor is over and in contact with the first oxide semiconductor, and
wherein in a region where the fourth conductor overlaps with the oxide semiconductor, the second oxide semiconductor has higher conductivity than the first oxide semiconductor.

6. The semiconductor device according to claim 1,
wherein the oxide semiconductor includes a first oxide semiconductor, a second oxide semiconductor, and a third oxide semiconductor,
wherein the second oxide semiconductor is over and in contact with the first oxide semiconductor,
wherein the third oxide semiconductor is over and in contact with the second oxide semiconductor, and
wherein in a region where the fourth conductor overlaps with the oxide semiconductor, the second oxide semiconductor has higher conductivity than the first oxide semiconductor and the third oxide semiconductor.

7. The semiconductor device according to claim 1,
wherein an end portion of the third insulator extends beyond an end portion of the third conductor.

8. The semiconductor device according to claim 7,
wherein the end portion of the third insulator includes a region whose cross-sectional shape is a circular arc.

9. The semiconductor device according to claim 1,
wherein the third conductor includes a first conductive layer and a second conductive layer,
wherein the second conductive layer is over and in contact with the first conductive layer, and
wherein an end portion of the first conductive layer extends beyond an end portion of the second conductive layer.

10. The semiconductor device according to claim 1, wherein the oxide semiconductor contains indium and zinc.

11. A module comprising the semiconductor device according to claim 1, and a printed board.

12. An electronic device comprising:
the module according to claim 11; and
at least one of a speaker, an operation key, and a battery.

13. A semiconductor device comprising:
a first conductor and a second conductor;
a first insulator in contact with a top surface of the first conductor and a top surface of the second conductor;
an oxide semiconductor overlapping with the first conductor with the first insulator interposed therebetween;
a second insulator over the oxide semiconductor;
a third conductor overlapping with the oxide semiconductor with the second insulator interposed therebetween;
a third insulator over and in direct contact with the third conductor, a side surface of the second insulator, the oxide semiconductor, and the first insulator;
a fourth conductor in contact with the oxide semiconductor;
a fifth conductor in contact with the oxide semiconductor; and
a sixth conductor overlapping with the second conductor with the first insulator and the third insulator interposed therebetween,
wherein a material of the sixth conductor is the same as a material of the fourth conductor, and
wherein the third insulator comprises a nitride insulating film.

14. The semiconductor device according to claim 13, wherein the nitride insulating film contains hydrogen.

15. The semiconductor device according to claim 13,
wherein the oxide semiconductor includes a first region in contact with the second insulator, and a second region and a third region that are in contact with the third insulator,
wherein the second region and the third region each include a region with lower resistance than that of the first region,
wherein the fourth conductor is in contact with the oxide semiconductor in the second region, and
wherein the fifth conductor is in contact with the oxide semiconductor in the third region.

16. The semiconductor device according to claim 13,
wherein the oxide semiconductor includes a first oxide semiconductor and a second oxide semiconductor,
wherein the second oxide semiconductor is over and in contact with the first oxide semiconductor, and
wherein in a region where the fourth conductor overlaps with the oxide semiconductor, the first oxide semiconductor has higher conductivity than the second oxide semiconductor.

17. The semiconductor device according to claim 13,
wherein the oxide semiconductor includes a first oxide semiconductor and a second oxide semiconductor,
wherein the second oxide semiconductor is over and in contact with the first oxide semiconductor, and
wherein in a region where the fourth conductor overlaps with the oxide semiconductor, the second oxide semiconductor has higher conductivity than the first oxide semiconductor.

18. The semiconductor device according to claim 13,
wherein the oxide semiconductor includes a first oxide semiconductor, a second oxide semiconductor, and a third oxide semiconductor,
wherein the second oxide semiconductor is over and in contact with the first oxide semiconductor,
wherein the third oxide semiconductor is over and in contact with the second oxide semiconductor, and
wherein in a region where the fourth conductor overlaps with the oxide semiconductor, the second oxide semiconductor has higher conductivity than the first oxide semiconductor and the third oxide semiconductor.

19. The semiconductor device according to claim 13, wherein an end portion of the second insulator extends beyond an end portion of the third conductor.

20. The semiconductor device according to claim 19, wherein the end portion of the second insulator includes a region whose cross-sectional shape is a circular arc.

21. The semiconductor device according to claim 13, wherein the third conductor includes a first conductive layer and a second conductive layer,
wherein the second conductive layer is over and in contact with the first conductive layer, and
wherein an end portion of the first conductive layer extends beyond an end portion of the second conductive layer.

22. The semiconductor device according to claim 13, wherein the oxide semiconductor contains indium and zinc.

23. A module comprising the semiconductor device according to claim 13 and a printed board.

24. An electronic device comprising:
the module according to claim 23; and
at least one of a speaker, an operation key, and a battery.

* * * * *